United States Patent
Kurahashi et al.

(10) Patent No.: US 9,886,029 B2
(45) Date of Patent: Feb. 6, 2018

(54) WORKPIECE PROCESSING APPARATUS AND WORKPIECE TRANSFER SYSTEM

(71) Applicant: DAIHEN Corporation, Osaka-shi, Osaka (JP)

(72) Inventors: Koji Kurahashi, Osaka (JP); Akira Miyamoto, Osaka (JP); Atsushi Kawakami, Osaka (JP); Naoki Sakimoto, Osaka (JP)

(73) Assignee: DAIHEN CORPORATION, Osaka-Shi, Osaka (JP)

( * ) Notice: Subject to any disclaimer, the term of this patent is extended or adjusted under 35 U.S.C. 154(b) by 344 days.

(21) Appl. No.: 14/493,634

(22) Filed: Sep. 23, 2014

(65) Prior Publication Data

US 2015/0153729 A1  Jun. 4, 2015

(30) Foreign Application Priority Data

Dec. 2, 2013  (JP) ................. 2013-249159
Mar. 28, 2014 (JP) ................. 2014-067888
Jul. 4, 2014   (JP) ................. 2014-138373

(51) Int. Cl.
  *G06F 19/00*  (2011.01)
  *B24B 29/00*  (2006.01)
  (Continued)

(52) U.S. Cl.
  CPC ........ *G05B 19/41875* (2013.01); *H01L 21/68* (2013.01); *G05B 2219/2602* (2013.01);
  (Continued)

(58) Field of Classification Search
  CPC ....................................................... H04N 7/18
  (Continued)

(56) References Cited

U.S. PATENT DOCUMENTS 5,365,672 A    11/1994 Kato
5,825,913 A *  10/1998 Rostami ................ G06T 7/0042
                                            348/87
6,224,459 B1 *  5/2001 Stocker .................. B23Q 3/186
                                            257/E21.23
(Continued)

FOREIGN PATENT DOCUMENTS

JP  H02-031443 A   7/1988
JP  H01-169939    7/1989
(Continued)

OTHER PUBLICATIONS

Notification of Reason for Rejection dated Aug. 29, 2017 during the prosecution of Japanese Patent Application No. 2013-249159.

*Primary Examiner* — Mohammad Ali
*Assistant Examiner* — Md Azad
(74) *Attorney, Agent, or Firm* — Troutman Sanders LLP

(57) ABSTRACT

A workpiece processing apparatus includes: a first rotational distance information storage unit that stores multiple pieces of first rotational distance information, each of which is information having, in association with each other, a rotational angle, and first distance information regarding a distance from a rotation center to an edge of a circular workpiece corresponding to the rotational angle, in a case where the workpiece is rotated; an acquiring unit that acquires information for positioning the workpiece, information for specifying an orientation of the workpiece, and information regarding a defective portion at the edge of the workpiece, using the multiple pieces of first rotational distance information stored in the first rotational distance information storage unit; and an output unit that outputs the information for positioning the workpiece, the information for specifying the orientation of the workpiece, and the information regarding the defective portion, which are acquired by the acquiring unit.

6 Claims, 35 Drawing Sheets

(51) Int. Cl.
*G06K 9/00* (2006.01)
*G05B 19/418* (2006.01)
*H01L 21/68* (2006.01)

(52) U.S. Cl.
CPC ..... *G05B 2219/31286* (2013.01); *Y02P 90/10* (2015.11); *Y02P 90/22* (2015.11)

(58) Field of Classification Search
USPC ........................................................ 700/110
See application file for complete search history.

(56) References Cited

U.S. PATENT DOCUMENTS

| | | | | |
|---|---|---|---|---|
| 2007/0179660 | A1* | 8/2007 | Bhagavat | ................ B24B 7/228 |
| | | | | 700/164 |
| 2007/0234809 | A1* | 10/2007 | Klein | ................ G01N 21/1702 |
| | | | | 73/602 |
| 2008/0023149 | A1 | 1/2008 | Yamamoto | |
| 2015/0378347 | A1* | 12/2015 | Sato | ................ G05B 19/4063 |
| | | | | 700/193 |

FOREIGN PATENT DOCUMENTS

| | | |
|---|---|---|
| JP | H06-224285 A | 8/1994 |
| JP | 2729297 | 3/1998 |
| JP | 3223584 B | 10/2001 |
| JP | 2006-517349 A | 7/2006 |
| JP | 2006-278819 A | 10/2006 |
| JP | 2008-034708 A | 2/2008 |
| JP | 2010-067905 A | 3/2010 |
| WO | 2004070355 A2 | 8/2004 |

\* cited by examiner

| Wafer ID | Rotational angle (deg) | First distance information |
|---|---|---|
| W01 | 0 | $r_1$ |
| W01 | 0.036 | $r_2$ |
| W01 | 0.072 | $r_3$ |
| W01 | 0.108 | $r_4$ |
| W01 | 0.144 | $r_5$ |
| ⋮ | ⋮ | ⋮ |

FIG.8

| Rotational angle (deg) | Composite distance |
|---|---|
| 0 , 90 , 180 , 270 | $R_1$ |
| 0.036 , 90.036 , 180.036 , 270.036 | $R_2$ |
| 0.072 , 90.072 , 180.072 , 270.072 | $R_3$ |
| 0.108 , 90.108 , 180.108 , 270.108 | $R_4$ |
| 0.144 , 90.144 , 180.144 , 270.144 | $R_5$ |
| ⋮ | ⋮ |

FIG.11

| Rotational angle (deg) | Second distance information |
|---|---|
| 0 | $r_{i1}$ |
| 0.036 | $r_{i2}$ |
| 0.072 | $r_{i3}$ |
| 0.108 | $r_{i4}$ |
| 0.144 | $r_{i5}$ |
| ⋮ | ⋮ |

FIG.12

| Rotational angle (deg) | Distance difference |
| --- | --- |
| 0 | $r_{i1} - r_1$ |
| 0.036 | $r_{i2} - r_2$ |
| 0.072 | $r_{i3} - r_3$ |
| 0.108 | $r_{i4} - r_4$ |
| 0.144 | $r_{i5} - r_5$ |
| ⋮ | ⋮ |

FIG.14

| Image | Workpiece ID | defect ID | Adjustment defect position (deg) | Time and date | Height (mm) | Width (mm) |
|---|---|---|---|---|---|---|
| img1001 | W001 | 1 | 32 | 2014/6/1 | 0.1 | 1.2 |
| img1002 | W001 | 2 | 55 | 2014/6/1 | 0.12 | 1.5 |
| img1003 | W001 | 3 | 95 | 2014/6/1 | 0.08 | 0.9 |
| img1004 | W001 | 4 | 120 | 2014/6/1 | 0.2 | 1.8 |
| img1005 | W001 | 5 | 136 | 2014/6/1 | 0.13 | 1.3 |
| img1006 | W002 | 1 | 44 | 2014/6/1 | 0.15 | 1.18 |

FIG.21

| Pattern | Status |
| --- | --- |
| Pattern 1 | Flaw in workpiece |
| Pattern 2 | Large workpiece crack |
| Pattern 3 | Small workpiece crack |
| Pattern 4 | Flaw in workpiece |
| ⋮ | ⋮ |

FIG.23

WORKPIECE PROCESSING APPARATUS AND WORKPIECE TRANSFER SYSTEM

CROSS REFERENCE TO RELATED APPLICATION

This application claims priority under 35 U.S.C.§ 119 to Japanese Patent Application Nos. 2013-249159 filed on Dec. 2, 2013, 2014-067888 filed on Mar. 28, 2014, and 2014-138373 filed on Jul. 4, 2014, the entire contents of which being hereby incorporated herein by reference.

FIELD OF THE INVENTION

The present invention relates to a workpiece processing apparatus and the like for positioning a workpiece.

BACKGROUND

As a conventional technique, there is a known apparatus for, while rotating a wafer, detecting and accumulating edge positions of the wafer in association with the rotational angles, calculating an eccentricity amount and direction of the wafer position according to a largest value and a smallest value of detection signals, and centering the wafer according to the eccentricity data, wherein, since the edge positions change more sharply at a start point and an end point of a flat portion or the like provided on the wafer than at the other portions, this apparatus sets the flat portion or the like at a specific position relative to another stage such as a transfer apparatus, by calculating a rate of change in the edge position data reaching at least a certain level. See, for example, Japanese Patent No. 2729297 at page 1 and FIG. 1.

For example, if a workpiece positioned using this sort of conventional apparatus is transferred by a workpiece transfer apparatus to an apparatus for performing chemical vapor deposition (CVD), chemical mechanical polishing (CMP), or the like, the workpiece can undergo desired processing as appropriate.

If a workpiece such as a wafer in which burrs, chipping, or the like has occurred at the edge is subjected to processing such as CVD or polishing, the workpiece may be damaged by heat, pressure, or the like applied to the workpiece. Accordingly, it is preferable to perform inspection for detecting whether or not there is a defect such as burrs or chipping, before performing the processing on the workpiece. For this purpose, first, it is desirable to perform defect inspection on the workpiece before positioning the workpiece using such a conventional technique as described above.

However, in the case of performing defect inspection on the workpiece, the workpiece has to be once transferred by a workpiece transfer apparatus to a defect inspection apparatus and be subjected to defect inspection, and, after the inspection, the workpiece has to be transferred by the workpiece transfer apparatus to a workpiece positioning apparatus and be subjected to positioning. That is, there is a problem in which it takes time to perform inspection on the workpiece and to transfer the workpiece to and from the inspection apparatus.

There are further problems in which the cost increases because the inspection apparatus has to be provided in addition to the positioning apparatus, and in which saving the space is difficult because an installation location of the inspection apparatus has to be secured on a workpiece transfer path.

As a result, the conventional technique is problematic in that it is not possible to perform defect detection on a workpiece as appropriate.

SUMMARY

The present invention was arrived at in order to solve the above-described problem, and it is an aspect thereof to provide a workpiece processing apparatus and the like capable of performing defect detection on a workpiece as appropriate.

The present invention is directed to a workpiece processing apparatus, including: a first rotational distance information storage unit in which multiple pieces of first rotational distance information are stored, each of which is information having, in association with each other, a rotational angle, and first distance information regarding a distance from a rotation center to an edge of a circular workpiece corresponding to the rotational angle, in a case where the workpiece is rotated; an acquiring unit that acquires information for positioning the workpiece, information for specifying an orientation of the workpiece, and information regarding a defective portion at the edge of the workpiece, using the multiple pieces of first rotational distance information stored in the first rotational distance information storage unit; and an output unit that outputs the information for positioning the workpiece, the information for specifying the orientation of the workpiece, and the information regarding the defective portion, which are acquired by the acquiring unit.

With this configuration, defect detection can be performed on the edge of the workpiece when adjusting the position and the orientation of the workpiece, and defect detection can be performed on the workpiece as appropriate.

Furthermore, the present invention is directed to the workpiece processing apparatus according to the above-described aspect, further including: a moving unit that moves the workpiece such that the defective portion at the edge of the workpiece is disposed within an image capture area, which is a predesignated area, using the information regarding the defective portion at the edge of the workpiece output by the output unit; an image capturing unit that captures an image of the defective portion at the edge of the workpiece disposed within the image capture area; and an image output unit that outputs the image captured by the image capturing unit.

With this configuration, the defective portion at the edge of the workpiece can be easily seen.

Furthermore, the present invention is directed to a workpiece transfer system, including: the above-described workpiece processing apparatus; and a workpiece transfer apparatus that receives and delivers the workpiece from and to the workpiece processing apparatus.

With this configuration, the process that adjusts the position and the orientation of the workpiece and the process that performs defect detection can be collectively performed during transfer in the workpiece processing apparatus. Thus, the time required to adjust the position and the orientation of the workpiece and to perform defect detection can be shortened. Furthermore, the movement of the workpiece during the transfer can be made as small as possible.

With workpiece processing apparatus and the like according to the present invention, defect detection can be performed on a workpiece as appropriate.

BRIEF DESCRIPTION OF THE DRAWINGS

FIG. 8 is a first rotational distance information management table of the workpiece processing apparatus.

FIG. 11 is a composite distance information management table of the workpiece processing apparatus.

FIG. 12 is a second rotational distance information management table of the workpiece processing apparatus.

FIG. 14 is a distance difference information management table of the workpiece processing apparatus.

FIG. 21 is an exemplary image management table of the workpiece processing apparatus.

FIG. 23 is an exemplary image status information management table of the workpiece processing apparatus.

DETAILED DESCRIPTION

Figure 1:
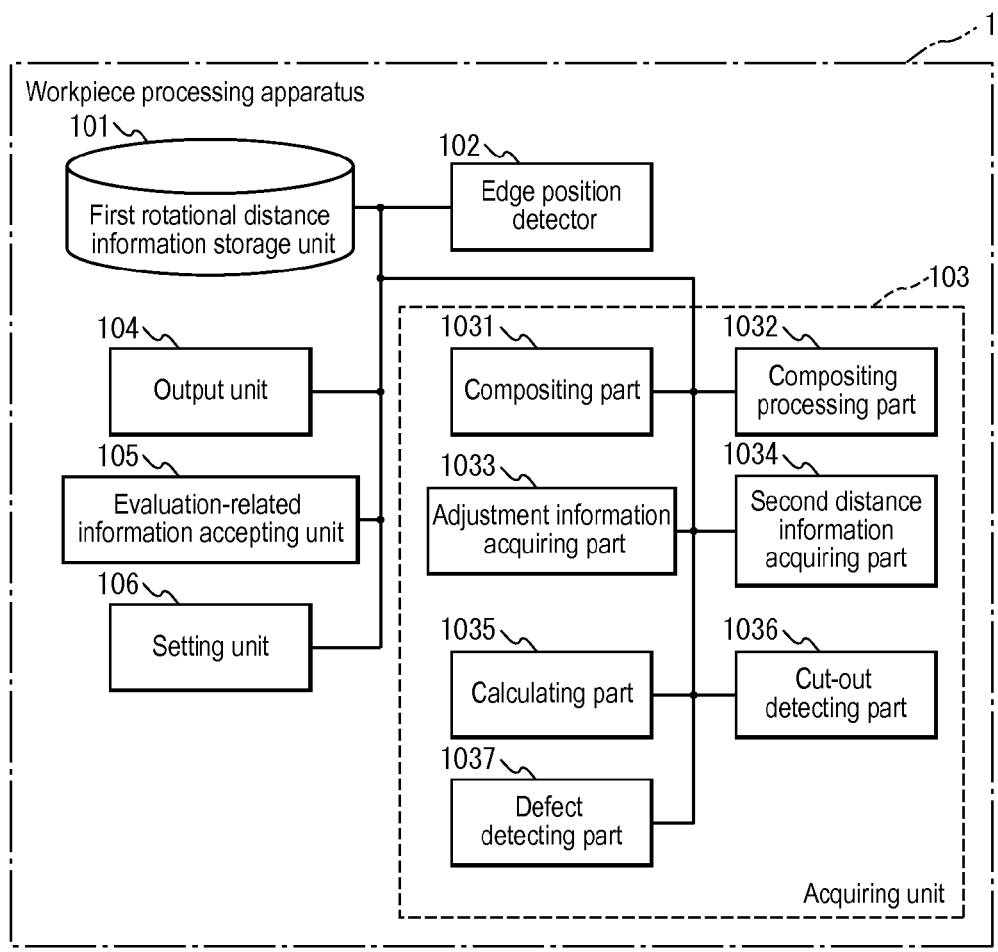
FIG. 1 is a block diagram of a workpiece processing apparatus in Example.

Hereinafter, examples of a workpiece processing apparatus and the like will be described with reference to the drawings. Note that constituent elements denoted by the same reference numerals perform the same operations in the examples, and, thus, a description thereof may not be repeated.

EXAMPLE

FIG. 1 is a block diagram of a workpiece processing apparatus 1 in this example.

The workpiece processing apparatus 1 includes a first rotational distance information storage unit 101, an edge position detector 102, an acquiring unit 103, an output unit 104, an evaluation-related information accepting unit 105, and a setting unit 106.

The acquiring unit 103 includes, for example, a compositing part 1031, a compositing processing part 1032, an adjustment information acquiring part 1033, a second distance information acquiring part 1034, a calculating part 1035, a cut-out detecting part 1036, and a defect detecting part 1037.

Figure 2A:
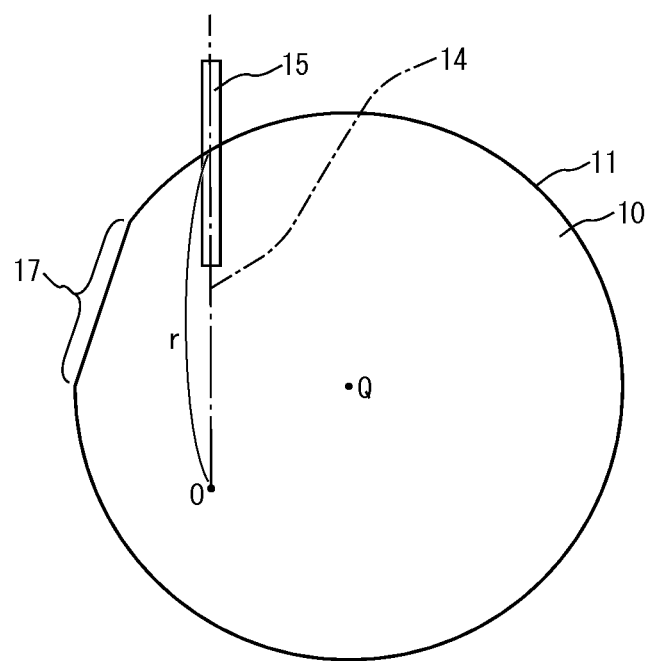
FIG. 2A is a schematic diagram illustrating an example of a circular workpiece used in the workpiece processing apparatus.
Figure 2B:
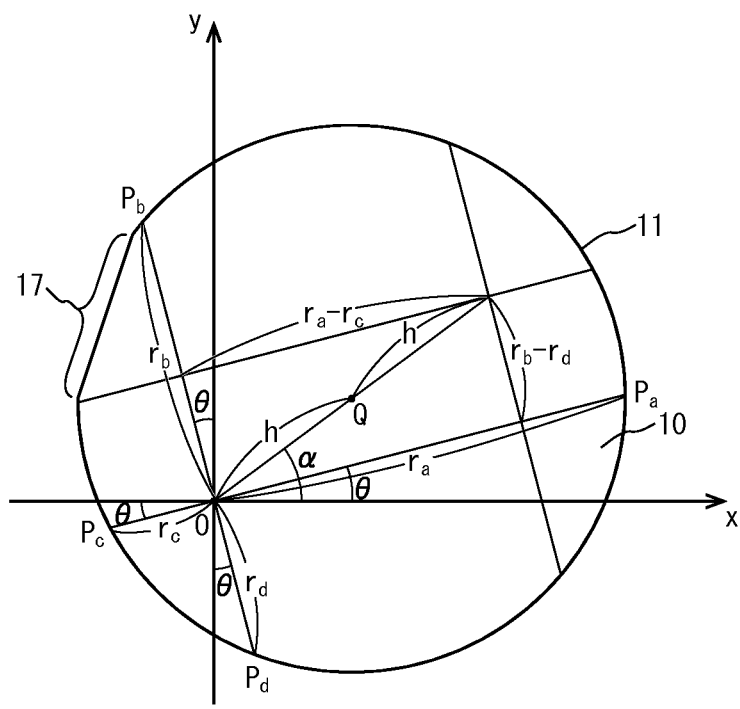
FIG. 2B is a schematic diagram illustrating processing for acquiring adjustment information in the workpiece processing apparatus.

FIGS. 2A and 2B are a schematic diagram illustrating an example of a circular workpiece from which first rotational distance information is to be acquired in this example (FIG. 2A), and a schematic diagram illustrating processing for acquiring adjustment information on the workpiece (FIG. 2B).

Figure 3:
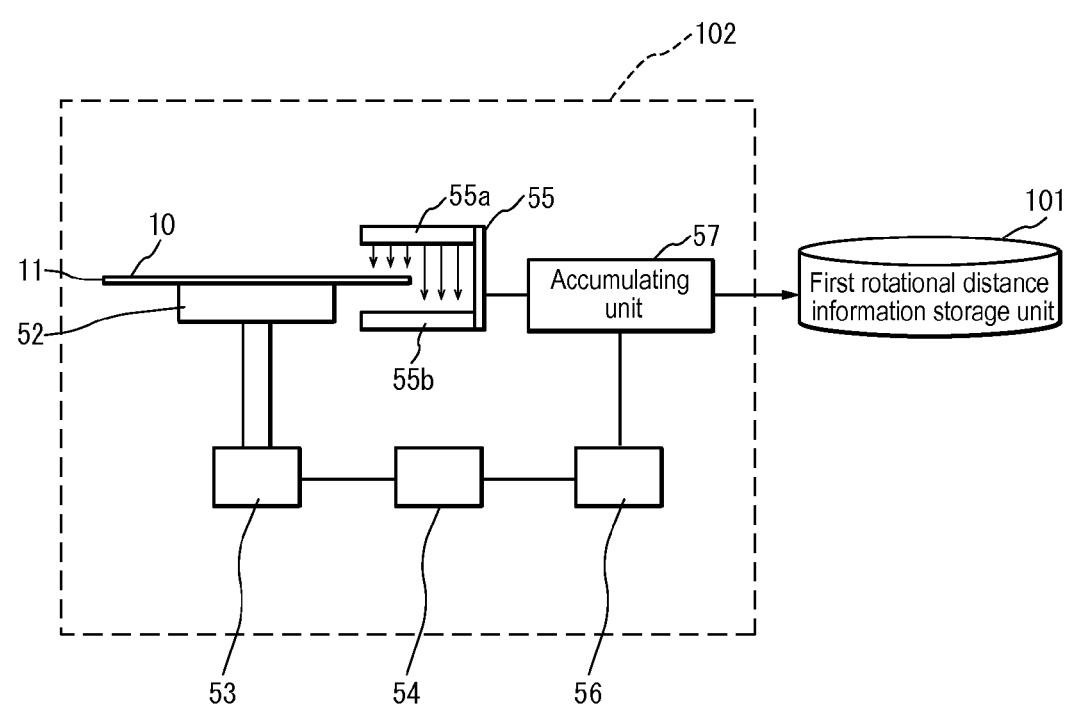
FIG. 3 is a schematic diagram showing an example of an edge position detector in the workpiece processing apparatus.

FIG. 3 is a schematic diagram showing an example of the edge position detector 102 in this example.

Figure 4:
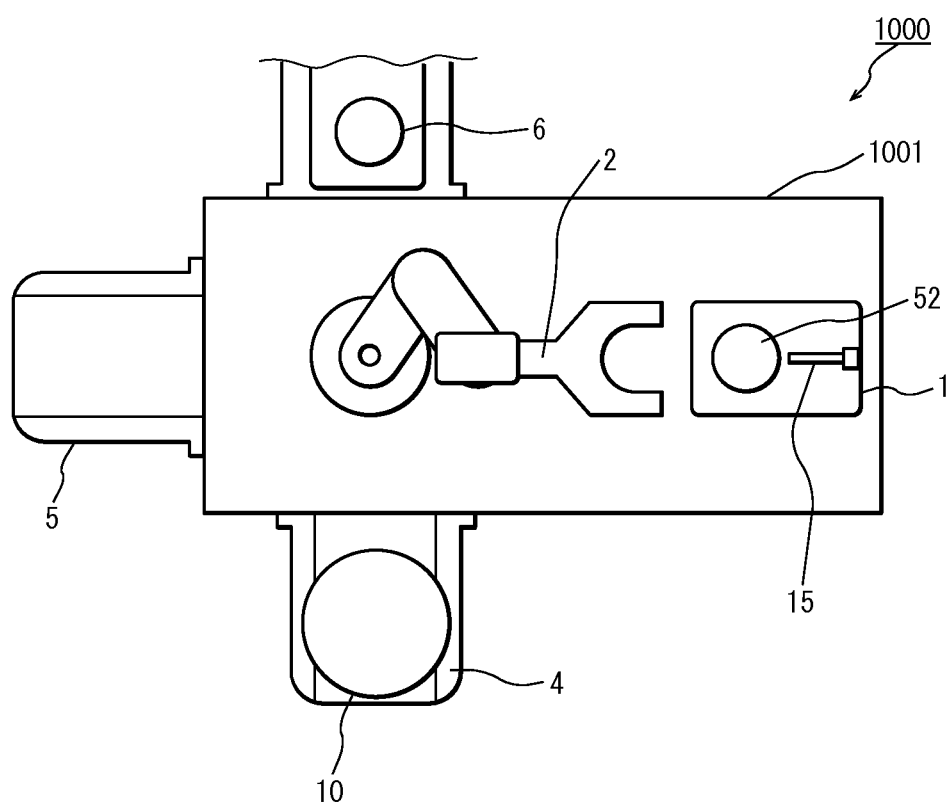
FIG. 4 is a plan view showing an example of a workpiece transfer system including the workpiece processing apparatus.

FIG. 4 is a plan view showing an example of a workpiece transfer system 1000 including the workpiece processing apparatus 1 in this example.

For example, the workpiece processing apparatus 1 is an apparatus that performs, on a circular workpiece (hereinafter, also simply referred to as a workpiece) 10, processing for acquiring information for adjusting the position and the orientation of the workpiece 10 and processing for performing defect detection on the edge. The information for adjusting the position and the orientation of the workpiece 10 is, for example, information used for arranging the workpiece 10 at a predesignated position and in a predesignated direction.

The circular workpiece 10 is, for example, a circular semiconductor wafer (hereinafter, referred to as a wafer), a wafer attached to a circular wafer stage for reinforcement, or a circular substrate such as a glass substrate. There is no limitation on the material for the circular workpiece (e.g., the material for the wafer). Note that the circular workpiece 10 does not necessarily have to be in the shape of an exact circle, and may have, at part of an edge 11 thereof, a cut-out portion such as an orientation flat portion 17 or a notch portion (not shown), for example. The workpiece 10 may have two or more cut-out portions. The edge 11 of the workpiece 10 is, for example, a circumferential edge portion of the workpiece 10.

In the first rotational distance information storage unit 101, multiple pieces of first rotational distance information are stored. The first rotational distance information is information having, in association with each other, a rotational angle and first distance information corresponding to the rotational angle in the case where the circular workpiece 10 is rotated about one point on the workpiece 10 as a rotation center O, for example. This is information regarding the distance from the rotation center of the workpiece 10 to the edge. The rotation center O of the workpiece 10 does not necessarily have to match a center Q of the workpiece 10.

The first distance information is information regarding the distance from the rotation center O of the workpiece 10 to the edge 11 of the workpiece 10. For example, the first distance information is information regarding the distance in which a predesignated line segment starting from the rotation center O of the workpiece 10 reaches the position on the edge 11 of the workpiece 10. For example, the first distance information is the distance from the rotation center O of the workpiece 10 to the edge 11. For example, the first distance information is a measured value regarding the position of the edge 11 acquired using a sensor 15, such as a line sensor disposed on and along a predesignated line segment 14 starting from the rotation center O of the workpiece 10 as shown in FIG. 2A, or a value acquired using the measured value.

In this example, a case will be described, as an example, in which the first distance information is a distance r from the rotation center O of the workpiece 10 to the edge 11, acquired from the information indicating the position of the edge 11 of the workpiece 10 acquired by the sensor 15.

Note that the first distance information may be any information indicating a value substantially corresponding to the distance from the rotation center O of the workpiece 10 to the edge 11 of the workpiece 10, and the first distance information may be, for example, information indicating the distance from a reference position (e.g., 0 point) of the sensor 15 or the like to the edge 11. Alternatively, the first distance information may be information indicating a portion, of the sensor 15, that has detected the edge 11, such as elements that have detected the edge 11 or arrangement positions thereof.

The rotational angle is, for example, a value of an angle by which the workpiece 10 is rotated in the case where a value of a predesignated state such as a state before rotation or a state at the start of acquisition of the first distance information is taken as an initial value such as 0 degrees. The multiple pieces of first rotational distance information stored in the first rotational distance information storage unit 101 are, for example, pieces of information each having first distance information obtained each time the workpiece 10 is sequentially rotated by a predesignated angle, and the rotational angle. The multiple pieces of first rotational distance information have, for example, rotational angles that are successive at intervals of a predesignated angle. The predesignated angle is a constant angle, and is, for example, a minimum unit of a rotational angle in the case of acquiring the first distance information while rotating the workpiece 10. The predesignated angle is preferably a value obtained, for example, by dividing 360 degrees by a multiple of 4. The predesignated angle is, for example, a value obtained by dividing 360 degrees by 1000, 10000, or the like (e.g., 0.36 degrees, 0.036 degrees, etc.). There is no limitation on a unit or the like of the rotational angle.

In the first rotational distance information storage unit 101, for example, multiple pieces of first rotational distance information acquired from each of one or at least two workpieces 10 are stored. For example, multiple pieces of first rotational distance information corresponding to each workpiece 10 are stored in association with a workpiece identifier, which is an identifier of that workpiece 10.

In the first rotational distance information storage unit 101, for example, multiple pieces of first rotational distance information corresponding to multiple rotational angles at least for one revolution, specifically, corresponding to multiple rotational angles in a range of 0 to 360 degrees are stored. Note that multiple pieces of first rotational distance information corresponding to multiple rotational angles for a range smaller than one revolution may be stored. For example, multiple pieces of first rotational distance information corresponding to the number of revolutions smaller than one revolution by an angle that is smaller than the minimum unit of the rotational angle may be stored. Furthermore, multiple pieces of first rotational distance information corresponding to multiple rotational angles for the number of revolutions larger than one revolution, for example, corresponding to multiple rotational angles for 1.5 revolutions or 2 revolutions may be stored.

In this example, a case will be described, as an example, in which the multiple pieces of first rotational distance information acquired by the edge position detector 102 are accumulated in the first rotational distance information storage unit 101. There is no limitation on the procedure in which the multiple pieces of first rotational distance information are accumulated in the first rotational distance information storage unit 101. For example, multiple pieces of first rotational distance information accepted by an unshown accepting unit or the like via a storage medium, a communication line, or the like may be accumulated in the first rotational distance information storage unit 101.

The storing in this example is a concept that encompasses temporarily storing. For example, the temporarily storing the multiple pieces of first rotational distance information acquired by the edge position detector 102 from a workpiece also may be considered as the storing.

The first rotational distance information storage unit 101 is preferably a non-volatile storage medium, but may be realized also by a volatile storage medium. The same is applied to other storage units.

The edge position detector 102 acquires multiple pieces of first rotational distance information from the workpiece 10. Specifically, the edge position detector 102 acquires multiple pieces of first rotational distance information from the workpiece 10, by detecting the edge positions of the workpiece. The edge position detector 102 accumulates the acquired multiple pieces of first rotational distance information in the first rotational distance information storage unit 101.

The edge position detector 102 includes, for example, the sensor 15 such as a line sensor and a turntable 52 or the like for rotating the workpiece 10 placed thereon, and sequentially acquires pieces of first distance information and rotational angles using a measured value indicating the position of the edge (e.g., a measured value of the distance from the rotation center of the workpiece 10 to the edge, etc.) measured each time the workpiece 10 is rotated by a predesignated rotational angle, for example. The rotation center of the workpiece 10 is, for example, the rotation center of the turntable about which the workpiece 10 is rotated.

The edge position detector 102 may include a moving part (not shown) for moving the position of the turntable 52 or the like such that the center of the workpiece 10 is at the predesignated position, using information for positioning the workpiece 10 output by the output unit 104 (e.g., adjustment information), which will be described later. Furthermore, the edge position detector 102 may include a control part (not shown) or the like for rotating the turntable 52 such that the workpiece 10 is in the predesignated direction, using information for specifying the orientation of the workpiece 10 output by the output unit 104 (e.g., information indicating the cut-out portion), which will be described later.

For example, the edge position detector 102 accumulates the multiple pieces of first rotational distance information acquired from each workpiece in association with a workpiece identifier of that workpiece in the first rotational distance information storage unit 101.

Using the multiple pieces of first rotational distance information corresponding to one workpiece stored in the first rotational distance information storage unit 101, the acquiring unit 103 acquires information for positioning the workpiece 10, information for specifying the orientation of the workpiece 10, and information regarding a defective portion at the edge 11 of the workpiece 10.

The information for positioning the workpiece 10 is, for example, information used for arranging the workpiece 10 at the predesignated position. The information for positioning the workpiece 10 is, for example, information indicating a difference between the position at which the workpiece 10 has to be arranged and the position at which the workpiece 10 is actually arranged, or adjustment information. The adjustment information is, for example, adjustment information acquired by the adjustment information acquiring part 1033. There is no limitation on the procedure in which the acquiring unit 103 acquires the information for positioning the workpiece 10. For example, the acquiring unit 103 may acquire the information for positioning, using such a conventional technique as described above. In this example, processing in which the adjustment information acquiring part 1033 acquires the information for positioning will be described later as a specific example.

The information for specifying the orientation of the workpiece 10 is, for example, information used for arranging the workpiece in a predesignated orientation, and is, for example, information indicating a cut-out portion such as an orientation flat portion or a notch portion for specifying the orientation of the workpiece. The information indicating the cut-out portion is, for example, information indicating the position of the cut-out portion. Furthermore, information indicating the size of the cut-out portion and the like may be further included. For example, the information indicating the cut-out portion is acquired by the cut-out detecting part 1036. There is no limitation on the procedure in which the acquiring unit 103 acquires the information for specifying the orientation of the workpiece 10. For example, the acquiring unit 103 may acquire information for specifying the orientation of the workpiece, using such a conventional technique as described above.

For example, the acquiring unit 103 performs cut-out detection using one or at least two threshold values for the size of the cut-out portion, and, if the cut-out portion is detected, acquires information indicating the cut-out portion. The one or at least two threshold values for the size of the cut-out portion are, for example, a threshold value for at least one of the width and the distance from the edge, of the cut-out portion. For example, the threshold value for the size of the cut-out portion is a threshold value indicating a lower limit value for the distance of the cut-out portion from the edge, or threshold values respectively indicating a lower limit value and an upper limit value for the width of the cut-out portion. The lower limit value for the distance of the cut-out portion from the edge is, for example, a lower limit value for the distance of the cut-out portion, at a portion thereof with a large distance (e.g., the largest distance) from the edge, from the position at which the edge will be positioned if there is no cut-out portion.

For example, using the multiple pieces of first rotational distance information, the acquiring unit 103 may detect a continuous area that is recessed toward the inner side of the workpiece 10 at the edge 11 of the workpiece 10, and judge whether or not this recessed area includes a portion in which the depth from the edge, that is, the distance from the edge is at least a threshold value that is a lower limit value for the distance of the cut-out portion from the edge. If a portion with at least the threshold value is included, the acquiring unit 103 may judge this recessed area as the cut-out portion and acquire, as the information indicating the cut-out portion, information indicating the position of this area such as information indicating the rotational angle range.

The continuous area is, for example, a portion in which the acquisition orders of the first distance information are successive, or a portion in which the rotational angles associated with the first distance information are successive. For example, the acquiring unit 103 can detect a continuous recess or a continuous projection, from a difference between the first rotational distance information and the radius of the workpiece 10 or the distance from the rotation center of the workpiece 10 to the edge. Furthermore, both ends of a recess or a projection present at the edge 11 of the workpiece 10 may be detected, for example, by performing second-order differentiation on the successive pieces of first distance information. It is possible to judge whether the detected area is a recess or a projection, from a difference between a value of the first rotational distance information in an area held between the thus detected portions and the radius of the workpiece 10 or the like as described above. The acquiring unit 103 may perform cut-out detection, by judging whether or not the area at the edge 11 of the workpiece 10 that has been judged as being recessed is the cut-out portion, using a threshold value as described above. The processing for performing cut-out detection or defect detection on the edge 11 by performing second-order differentiation or the like in this manner is a known art, and, thus, a detailed description thereof has been omitted.

The using the multiple pieces of first rotational distance information is a concept that encompasses using information obtained from the multiple pieces of first rotational distance information, such as using distance difference information or the like, which will be described later.

Furthermore, for example, using the multiple pieces of first rotational distance information, the acquiring unit 103 may detect a continuous area that is recessed toward the inner side of the workpiece 10 at the edge 11 of the workpiece 10, and judge whether or not this recessed area has the width that is within a range between threshold values respectively indicating a lower limit value and an upper limit value for the width of the cut-out portion. If the width is within the range, the acquiring unit 103 may judge this recessed area as the cut-out portion and acquire, as the information indicating the cut-out portion, information indicating the position of this area such as information indicating the rotational angle range.

Alternatively, the judgment based on the distance from the edge and the judgment based on the width may be combined such that the continuous area is judged as the cut-out portion if the distance from the edge is at least a threshold value and the width is within a range indicated by threshold values.

In this example, processing in which the cut-out detecting part 1036 acquires information indicating the cut-out portion will be described later as a specific example of the processing in which the acquiring unit 103 acquires information for specifying the orientation.

The information regarding the defective portion is, for example, information indicating the position at which there is the defective portion in the workpiece 10 (specifically, the rotational angle) or an area in which there is the defective portion (e.g., the information indicating the rotational angle range). Furthermore, the information regarding the defective portion is information indicating the size of the defective portion, for example, the distance from the edge, specifically, the depth or the height of the defective portion or the width of the defective portion. The information regarding the defective portion may further have an identifier for identifying the defective portion or an identifier of the workpiece 10. The defective portion is, for example, a portion with burrs, chipping, dust, or the like at the edge 11 of the workpiece 10. Furthermore, the information regarding the defective portion may be information indicating whether or not there is a defective portion. Furthermore, the information regarding the defective portion may be information indicating whether the defective portion is a recess or a projection at the edge 11 of the workpiece 10. For example, the information regarding the defective portion is the information regarding the defective portion acquired by the defect detecting part 1037.

For example, the acquiring unit 103 performs defect detection, using one or at least two threshold values for the size of the defective portion, and, if the defective portion is detected, acquires information regarding the defective portion. The one or at least two threshold values for the size of the defective portion are, for example, one or at least two threshold values for at least one of the width and the distance from the edge, of the defective portion.

For example, the acquiring unit 103 calculates a distance indicating a difference between each of the multiple pieces of first rotational distance information and the distance from the rotation center of the workpiece 10 to the edge 11 (or the radius of the workpiece 10) in the case where there is no defective portion at the edge, and detects first rotational distance information in which the distance is at least a lower limit value for the distance of the defective portion, and, if such first rotational distance information is detected, acquires information regarding the defective portion. For example, the acquiring unit 103 acquires information of the rotational angle or the like contained in this first rotational distance information, as the information regarding the defective portion. Note that the detecting the first rotational distance information is a concept that encompasses detecting the first distance information contained in the first rotational distance information or detecting the rotational angle.

For example, using the multiple pieces of first rotational distance information, the acquiring unit 103 may detect a continuous area that is recessed toward the inner side of the workpiece 10 or a continuous area that projects toward the outer side of the workpiece 10, at the edge 11 of the workpiece 10, and judge whether or not this recessed or projecting area includes a portion in which the distance from the edge is at least a threshold value that is a lower limit value for the distance of the defective portion from the edge. If a portion with at least the threshold value is included, the acquiring unit 103 may judge this recessed or projecting area as the defective portion and acquire information regarding this defective portion such as information indicating the rotational angle range.

The distance from the edge is, for example, the distance from the edge in the case where there is no defective or cut-out portion, or the distance using, as a reference, an edge of an ideal workpiece with no defective or cut-out portion. The distance from the edge is, for example, the distance from the edge of the workpiece 10 toward the rotation center of the workpiece 10, or the distance from the edge away from the rotation center of the workpiece 10. For example, the distance from the edge is the distance from the edge, in the case where there is no cut-out portion or defective portion in the workpiece, to the cut-out portion or to the defective portion. The distance from the edge may be considered as the depth of a recessed area or the height of a projecting area at the edge. The distance from the edge may be considered as the size of the distance from the edge, or the size or the absolute value of the depth or the height of the cut-out portion or the defective portion. The same is applied to the description below.

As described above, both ends of a recess or a projection present at the edge 11 of the workpiece 10 may be detected, for example, by performing second-order differentiation on the successive pieces of first distance information. The acquiring unit 103 may detect the defective portion, by judging whether or not the area at the edge 11 of the workpiece 10, held between the thus detected portions, is the defective portion, using a threshold value as described above.

For example, using the multiple pieces of first rotational distance information, the acquiring unit 103 may detect a continuous area that is recessed toward the inner side of the workpiece 10 or a continuous area that projects toward the outer side of the workpiece 10, at the edge 11 of the workpiece 10, and judge whether or not this recessed or projecting area has the width that is at least the threshold value that is a lower limit value for the width of the defective portion. If the width is at least the lower limit value, the acquiring unit 103 may judge this recessed or projecting area as the defective portion and acquire information regarding the defective portion. Note that, as threshold values that are the lower limit values, a threshold value in the case where the continuous area is a recess and that in the case where the continuous area is a projection may be different or may be the same.

Alternatively, the judgment based on the distance from the edge and the judgment based on the width may be combined such that the continuous area is judged as the defective portion if the distance from the edge is at least a threshold value and the width is at least a threshold value.

Note that the acquiring unit 103 may compare the number of cut-out portions for specifying the orientation of the workpiece, detected using the multiple pieces of first rotational distance information, and the number of cut-out portions that are to be originally provided in the workpiece 10, and, if these numbers are different from each other, acquire information regarding the defective portion indicating that the edge is defective.

Furthermore, in the case of performing defect detection, the acquiring unit 103 may perform the detection excluding the area in which the cut-out portion for specifying the orientation of the workpiece is disposed, or may not acquire information regarding a detected defective portion if the detected defective portion is within the area in which the cut-out portion is disposed.

In this example, a case will be particularly described, as an example, in which the acquiring unit 103 includes the compositing part 1031, the compositing processing part 1032, the adjustment information acquiring part 1033, the second distance information acquiring part 1034, the calculating part 1035, the cut-out detecting part 1036, and the defect detecting part 1037.

The compositing part 1031 composites multiple pieces of first distance information associated with rotational angles that are different from each other by 90 degrees, among the first distance information contained in the multiple pieces of first rotational distance information. The multiple pieces of first rotational distance information are, for example, multiple pieces of first rotational distance information stored in the first rotational distance information storage unit 101, the information being on one workpiece 10 that is to be processed.

The compositing multiple pieces of first distance information associated with rotational angles that are different from each other by 90 degrees may be considered, for example, as compositing a group of multiple pieces of first distance information associated with rotational angles in which one rotational angle is different from each of the others by an integral multiple of 90 degrees. The integral multiple of 90 degrees is, for example, 90 degrees, 180 degrees, 270 degrees, or the like.

For example, the compositing part 1031 composites four pieces of first distance information associated with rotational angles that are different from each other by 90 degrees, among the first distance information contained in the multiple pieces of first rotational distance information, thereby acquiring multiple pieces of composite distance information. This processing may be considered, for example, as compositing a group of multiple pieces of first distance information associated with rotational angles in which one rotational angle is different from each of the others by an n-th (n is an integer of 1 to 3) multiple of 90 degrees.

In this specification, first distance information obtained by compositing multiple pieces of first distance information is referred to as composite distance information. The compositing part 1031 typically acquires multiple pieces of composite distance information. The compositing is, for example, combining a group of multiple pieces of first distance information into one piece of information. The compositing may be, for example, acquiring an average value of multiple pieces of first distance information, or may be adding multiple pieces of first distance information. Alternatively, the compositing may be calculating an average of differences between multiple pieces of first distance information. For example, the compositing part 1031 acquires composite distance information, by compositing a group of multiple pieces of first distance information associated with rotational angles of $\theta_0$, $\theta_0+90$ degrees, $\theta_0+180$ degrees, and $\theta_0+270$ degrees, among the first distance information contained in the multiple pieces of first rotational distance information.

There is no limitation on the procedure in which the compositing part 1031 composites multiple pieces of first distance information associated with rotational angles that are different from each other by 90 degrees. For example, the compositing part 1031 may perform this sort of compositing, by dividing multiple pieces of first rotational distance information corresponding to rotational angles whose values are successive, into multiple groups each corresponding to rotational angles in a range of 90 degrees, and compositing pieces of first distance information contained in the first rotational distance information at the same arrangement orders in the divided groups.

The rotational angles whose values are successive are, for example, rotational angles whose values are successive in units of a rotational angle by which the workpiece 10 is rotated for acquiring each piece of first distance information. Hereinafter, the rotational angles whose values are successive are as appropriate referred to as rotational angles that are successive.

The arrangement order is, for example, an arrangement order in the case where pieces of first rotational distance information in the divided groups are arranged in ascending order or descending order of the rotational angles contained in the first rotational distance information.

For example, assuming that multiple pieces of first rotational distance information having rotational angles of 0 degrees or more and less than 360 degrees, acquired while rotating the workpiece one revolution or the like, are stored in the first rotational distance information storage unit 101, the compositing part 1031 first divides the first rotational distance information into four groups respectively corresponding to rotational angles in ranges of 0 degrees or more and less than 90 degrees, 90 degrees or more and less than 180 degrees, 180 degrees or more and less than 270 degrees, and 270 degrees or more and less than 360 degrees. Then, the compositing part 1031 acquires successively arranged multiple pieces of composite distance information, by compositing values of the first distance information contained in the first rotational distance information in the divided ranges, according to the arrangement order of the rotational angles, for example, in ascending order or descending order of the rotational angles. Accordingly, the four pieces of first distance information associated with rotational angles that are different from each other by 90 degrees can be composited. Note that the divided rotational angle ranges do not necessarily have to start from 0 degrees, and, for example, the rotational angle ranges each for 90 degrees may be set from 15 degrees or the like.

Furthermore, the compositing may be performed by sequentially acquiring pieces of first rotational distance information one by one from successively arranged multiple pieces of first rotational distance information each having a rotational angle range of 90 degrees, detecting, for each acquired piece of first rotational distance information, first rotational distance information having a rotational angle obtained by adding 90 degrees, 180 degrees, and 270 degrees to the rotational angle, and compositing pieces of first distance information respectively contained in the acquired first rotational distance information and the detected pieces of first rotational distance information. Accordingly, the four pieces of first distance information associated with rotational angles that are different from each other by 90 degrees can be sequentially composited.

If a group of multiple, preferably, four pieces of first distance information associated with rotational angles that are different from each other by 90 degrees are sequentially composited in this manner, for example, an increase or a decrease in the first distance information, which occurs due to the rotation center O of the workpiece 10 being off the center Q of the workpiece 10, can be cancelled.

Note that, for example, a group of multiple rotational angles corresponding to multiple pieces of first distance information before the compositing is stored in association with each piece of composite distance information obtained by the compositing. Alternatively, part of the group of rotational angles, for example, the smallest rotational angle among the multiple corresponding rotational angles may be stored in association.

The compositing processing part 1032 detects multiple pieces of composite distance information that correspond to rotational angles that are successive and in which a change in the sizes of the values is small, from among the multiple pieces of composite distance information, each of which is information acquired by the compositing part 1031 compositing the pieces of first distance information. The compositing processing part 1032 acquires multiple pieces of first distance information before the compositing corresponding to one or more of the detected multiple pieces of composite distance information, and rotational angles associated with one or more of the multiple pieces of first distance information before the compositing.

The size of the value of the composite distance information is, for example, the absolute value of the composite distance information. The multiple pieces of composite distance information in which a change in the sizes of the values is small are, for example, successively arranged multiple pieces of composite distance information in which a largest value or the like of a change in the sizes of the values is smaller than that of the other successively arranged multiple pieces of composite distance information. The successively arranged multiple pieces of composite distance information are pieces of composite distance information that are successive at least a predesignated number (i.e., 2). The pieces of composite distance information that are successive are pieces of composite distance information corresponding to one or more rotational angles one or more of which are successive. As described above, in the composite distance information, an increase or a decrease in the first distance information, which occurs due to the rotation center O of the workpiece 10 being off the center Q of the workpiece 10, has been cancelled, and, thus, the composite distance information at a portion thereof where a change in the sizes is large corresponds to, for example, a recessed or projecting portion at the edge 11 of the workpiece 10. The recessed or projecting portion at the edge 11 is a portion with a cut-out portion such as the orientation flat portion 17 or a notch portion, or a portion with burrs, chipping, dust, or the like of the workpiece 10. The portion with chipping is, for example, the defective portion such as a cracked or chipped portion at the edge of the workpiece 10. The composite distance information at a portion thereof where a change in the sizes is small corresponds to, for example, a non-recessed or non-projecting, or a substantially non-recessed or non-projecting portion, and a change in the sizes in this portion is, for example, due to measurement errors or the like.

For example, the compositing processing part 1032 acquires, as the multiple pieces of composite distance information in which a change in the sizes of the values is small, multiple pieces of composite distance information that correspond to rotational angles that are successive, among the pieces of composite distance information remaining after excluding composite distance information in which a change in the sizes of the values is large.

The compositing processing part 1032 performs, for example, once or more at least one of a first process that detects one or more pieces of composite distance information in descending order of the value and a second process that detects one or more pieces of composite distance information in ascending order of the value, on the multiple pieces of composite distance information composited by the compositing part 1031. Note that remaining pieces of composite distance information that have not been detected in the first process and the second process corresponds to the multiple pieces of composite distance information in which a change in the sizes of the values is small, detected by the compositing processing part 1032. The detecting composite distance information may be considered as detecting composite distance information that is to be excluded.

The first process is, for example, processing for detecting composite distance information with a largest value, from among the multiple pieces of composite distance information composited by the compositing part 1031. Specifically, the first process is processing for detecting composite distance information with a largest value, from among the pieces of composite distance information that have not been detected yet. Furthermore, the second process is, for example, processing for detecting composite distance information with a smallest value, from among the multiple pieces of composite distance information composited by the compositing part 1031. Specifically, the second process is processing for detecting composite distance information with a smallest value, from among the pieces of composite distance information that have not been detected yet.

The compositing processing part 1032 preferably performs each of the first process and the second process multiple times. There is no limitation on the order in which multiple times of the first process and multiple times of the second process are performed. For example, a cycle in which the first process is performed once and the second process is performed once may be repeated. Furthermore, after the first process is performed multiple times, the second process may be performed multiple times. Furthermore, either the first process or the second process may be performed first.

In the case where the first process is repeated, the composite distance information already detected in preceding processing is excluded from information that is to be detected. For example, already detected composite distance information is provided with information of a flag or the like indicating that it has been already detected, and the composite distance information provided with the information of the flag or the like is not detected in the following processing. The same is applied to the case where the second process is repeated.

Furthermore, the compositing processing part 1032 may sequentially delete the composite distance information detected in the first process, the second process, or the like, and may provide the detected information with information of a flag or the like indicating that it has been already deleted. In this case, for example, the compositing processing part 1032 may detect composite distance information with a largest value, from among the pieces of composite distance information that have not been deleted in the first process. For example, the compositing processing part 1032 may detect composite distance information with a smallest value, from among the pieces of composite distance information that have not been deleted in the second process.

Furthermore, in the case where the first process is repeated, the compositing processing part 1032 repeatedly performs the first process, for example, until a predesignated condition is satisfied. For example, the detecting composite distance information until a predesignated condition is satisfied is detecting composite distance information until the number of pieces of information detected reaches a predesignated number. Furthermore, the predesignated condition may be a condition that a difference between the largest value and the smallest value of remaining pieces of composite distance information that have not been detected yet is not greater than a predesignated threshold value. The same is applied to the second process.

In the case where the predesignated condition for repeating the first process and the second process is a condition regarding the number of times, the number of times as a condition for the first process and the number of times as a condition for the second process may be different from each other. For example, if the composite distance information is obtained by compositing the pieces of first distance information indicating the distances from the rotation center of the workpiece 10 to the edge, typically, the composite distance information obtained by compositing the multiple pieces of first distance information containing the first distance information acquired at a cut-out portion such as an orientation flat portion or a notch portion has a smaller value than that in the composite distance information acquired at other portions, and the rotational angle range in which such the cut-out portion is present is wide, and, thus, in order to detect composite distance information corresponding to such the cut-out portion, as a portion with a large change, it is preferable to set the number of small values that are to be detected from among the composite distance information larger than the number of large values that are to be detected. Accordingly, in such a status, it is preferable to set the number of repetitions as the predesignated condition for the second process larger than the number of repetitions as the predesignated condition for the first process.

The compositing processing part 1032 acquires, for example, multiple pieces of first distance information before the compositing, corresponding to one or more of the multiple pieces of composite distance information that are successive at least a predesignated number, from among the remaining pieces of composite distance information that have not been detected in the first process and the second process, and rotational angles associated with one or more of the multiple pieces of first distance information. The predesignated number is a number of two or more.

Alternatively, for example, the compositing processing part 1032 acquires multiple pieces of first distance information before the compositing, corresponding to one or more of the multiple pieces of composite distance information that are successive the largest number, from among the remaining pieces of composite distance information that have not been detected in the first process and the second process, and rotational angles associated with one or more of the multiple pieces of first distance information.

For example, the compositing processing part 1032 detects multiple pieces of composite distance information that correspond to rotational angles that are successive and in which a change in the sizes of the values is small, and acquires four pieces of first distance information before the compositing, corresponding to one of the detected multiple pieces of composite distance information, and a rotational angle associated with one of the multiple pieces of first distance information before the compositing. The four pieces of first distance information before the compositing are four pieces of first distance information associated with rotational angles that are different from each other by 90 degrees. The four pieces of first distance information indicate the distances between four points, at which two orthogonal straight lines that pass through the rotation center of the workpiece intersect the edge of the workpiece 10, and the rotation center.

Which rotational angle associated with one or at least two pieces of first distance information is to be acquired, as the rotational angles associated with one or more pieces of first distance information of the multiple pieces of first distance information before the compositing, is determined, for example, according to which rotational angle is to be used by the adjustment information acquiring part 1033 (described later) for acquiring adjustment information. For example, if one piece of composite distance information is obtained by compositing four pieces of first distance information associated with rotational angles that are different from each other by 90 degrees, the compositing processing part 1032 detects multiple pieces of composite distance information in which a change in the sizes of the values is small, and acquires one of the rotational angles associated with four pieces of first distance information before the compositing, corresponding to one of the detected multiple pieces of composite distance information, the rotational angle having substantially the smallest value. Alternatively, it is also possible to acquire one of the rotational angles associated with four pieces of first distance information before the compositing, corresponding to one of the detected multiple pieces of composite distance information, the rotational angle being within a range of 0 to 90 degrees. For example, a rotational angle of 360+D degrees (D is a positive value) may be substantially considered as D degrees. Furthermore, −D degrees may be substantially considered as 360−D degrees.

Note that, in order to detect composite distance information corresponding to the orientation flat portion 17 as described above, the compositing processing part 1032 may collectively detect multiple pieces of composite distance information in which the values are smaller than the average value of the composite distance information.

In the description above, for example, the compositing processing part 1032 detects successively arranged multiple pieces of composite distance information in which a change in the sizes of the values is small, by detecting and excluding composite distance information with large values and composite distance information with small values, but, in the present invention, there is no limitation on the procedure in which the compositing processing part 1032 detects successively arranged multiple pieces of composite distance information in which a change in the sizes of the values is small.

For example, the compositing processing part 1032 may detect successively arranged multiple pieces of composite distance information in which a change in the sizes of the values is small, by detecting and excluding successive pieces of composite distance information in which a change in the sizes of the values is large, by performing differentiation or second-order differentiation or the like on the successive pieces of composite distance information. For example, the compositing processing part 1032 may detect values of at least a predesignated threshold value from among the values obtained by performing second-order differentiation or the like on the successive pieces of composite distance information, detect, as the composite distance information in which a change in the sizes of the values is large, composite distance information from a rotational angle at which a value of at least the predesignated threshold value is detected to a rotational angle at which a value of at least the predesignated threshold value is detected next, and detect, as the successively arranged multiple pieces of composite distance information in which a change in the sizes of the values is small, successive pieces of composite distance information from among the composite distance information excluding the detected composite distance information.

The adjustment information acquiring part 1033 acquires, as the information for positioning the workpiece 10, adjustment information for adjusting the rotation center of the workpiece 10 to the center of the workpiece 10, using the multiple pieces of first distance information and the rotational angles acquired by the compositing processing part 1032. The adjustment information may be considered as information for moving the rotation center of the workpiece 10 to the center of the workpiece 10, or information indicating the direction and the size of the dislocation. The adjustment information is, for example, information indicating a movement direction of the rotation center, such as a combination of an angle with respect to a predesignated direction and a movement distance. Furthermore, the adjustment information may be a vector or the like indicating a movement direction and a movement distance of the center of the workpiece 10. Furthermore, the adjustment information may be information indicating a movement amount along each coordinate axis, for moving the rotation center of the workpiece 10 to the center of the workpiece 10, in the case where the center of the workpiece 10 and the rotation center of the workpiece 10 are arranged in an orthogonal coordinate system.

The adjustment information acquiring part 1033 acquires, for example, adjustment information for moving the rotation center of the workpiece 10 to the center of the workpiece 10, using the four pieces of first distance information associated with rotational angles that are different from each other by 90 degrees, and a rotational angle associated with one of them, acquired by the compositing processing part 1032.

Hereinafter, an example of processing for acquiring adjustment information will be described with reference to FIG. 2B. In FIG. 2B, it is assumed that first distance information $r_a$, $r_b$, $r_c$, and $r_d$ are four pieces of first distance information associated with rotational angles that are different from each other by 90 degrees, acquired by the compositing processing part 1032 for one piece of composite distance information, and the associated rotational angles are $\theta$, $\theta+90$, $\theta+180$, and $\theta+270$. Note that $\theta$ is any value. In this case, for example, $\theta$ is an angle in a range of 0 to 90 degrees. Points $P_a$, $P_b$, $P_c$, and $P_d$ are points on the edge 11 of the workpiece 10 corresponding to the first distance information $r_a$, $r_b$, $r_c$, and $r_d$, and distances of line segments connecting the rotation center O and the points $P_a$, $P_b$, $P_c$, and $P_d$ are the first distance information $r_a$, $r_b$, $r_c$, and $r_d$. The line segment connecting the points $P_a$ and $P_c$ and the line segment connecting the points $P_b$ and $P_d$ are orthogonal to each other at the rotation center O. In this example, for the sake of convenience of this description, the rotation center O of the workpiece 10 is set to the origin of xy coordinates. It is assumed that the workpiece 10 is rotated clockwise. Further, it is assumed that an angle formed by the line segment corresponding to the first distance information $r_a$ and the x axis is the rotational angle $\theta$, and the counterclockwise direction is a positive value. It is assumed that an angle $\alpha$ formed by the line segment connecting the rotation center O of the workpiece 10 and the center Q of the workpiece 10 and the x axis is information indicating the movement direction, in the adjustment information, and the counterclockwise direction is a positive value. Furthermore, a length h of the line segment connecting the rotation center O of the workpiece 10 and the center Q of the workpiece 10 is information indicating the movement amount (movement distance), in the adjustment information. A sensor (not shown) for acquiring the first distance information is disposed, for example, on and along the y axis.

In FIG. 2B, if line segments symmetric to the line segment connecting the points $P_a$ and $P_c$ and the line segment connecting the points $P_b$ and $P_d$ with respect to the center Q of the workpiece 10 are formed, the information $\alpha$ indicating the movement direction and the length h indicating the movement amount, which are the adjustment information, are obtained from the equations below.

$$\alpha = \tan^{-1}((r_b - r_d)/(r_a - r_c)) + \theta \qquad (1)$$

$$h = \sqrt{(r_a - r_c)^2 + (r_b - r_d)^2}/2 \qquad (2)$$

Note that, in the equations above, $r_a - r_c$ and $r_b - r_d$ are differences between the distances, and, thus, it is seen that these equations can be applied also to the cases in which the first distance information is values obtained by reading a sensor or the like, or distances from a reference point of a sensor or the like.

Note that the above-described processing for acquiring adjustment information is merely an example, and there is no limitation on the procedure in which, in the present invention, adjustment information is acquired from pairs of the first distance information and the rotational angles acquired by the compositing processing part 1032.

Furthermore, in the description above, the adjustment information acquiring part 1033 acquires adjustment information, using the four pieces of first distance information and the one rotational angle acquired by the compositing processing part 1032 for one piece of composite distance information, but it is also possible to acquire adjustment information as described above for pairs of the multiple pieces of first distance information and the rotational angles acquired by the compositing processing part 1032 for multiple pieces of composite distance information, and acquire an average value of the acquired adjustment information, as final adjustment information.

The second distance information acquiring part 1034 acquires a relational equation expressing a relationship between a rotational angle and second distance information corresponding to the rotational angle, in the case where the workpiece 10 has a circular shape with no recess or projection at the edge 11, using the adjustment information acquired by the adjustment information acquiring part 1033. The second distance information is information regarding the distance from the rotation center to the edge 11, of the workpiece 10 with no recess or projection at the edge 11. Then, multiple rotational angles corresponding to the multiple pieces of first rotational distance information stored in the first rotational distance information storage unit 101 are substituted for the acquired relational equation, so that second distance information is acquired.

The second distance information is, for example, information similar to the first distance information. The second distance information is, for example, distance information corresponding to the first distance information acquired in the case where a circular workpiece with no recess or projection at the edge 11 is placed instead of the workpiece 10.

The circular workpiece with no recess or projection at the edge 11 is, for example, a circular workpiece in which there is no orientation flat portion or notch portion, burrs, chipping, or dust at the edge, and may be considered as an ideally-shaped workpiece having the same size as the workpiece 10.

The relational equation is, for example, an equation indicating a relationship between a rotational angle and second distance information corresponding to the rotational angle, in the case where the circular workpiece 10 with no recess or projection at the edge 11 is rotated. The relational equation may be considered as an equation expressing an ideal curve indicating a relationship between a rotational angle of the workpiece 10 and a distance from the rotation center to the edge corresponding to the rotational angle. Furthermore, the second distance information also may be considered as a distance from the rotation center to the edge of an ideal workpiece 10. The relational equation may be an approximation formula approximating the relationship between a rotational angle and second distance information corresponding to the rotational angle, in the case where the circular workpiece 10 with no recess or projection at the edge 11 is rotated.

The acquiring relational equation is a concept that encompasses reading a relational equation stored in advance in an unshown storage medium or the like, determining a coefficient value or the like of the read relational equation, and substituting the coefficient value or the like.

The second distance information acquiring part 1034 may acquire a relational equation, for example, using not only the angle indicating the movement direction and the length indicating the movement amount, which are the adjustment information, but also the radius of the workpiece 10. The radius of the workpiece 10 may be stored in advance in an unshown storage unit or the like and be read as appropriate.

Hereinafter, an example of the relational equation will be described.

Figure 5:
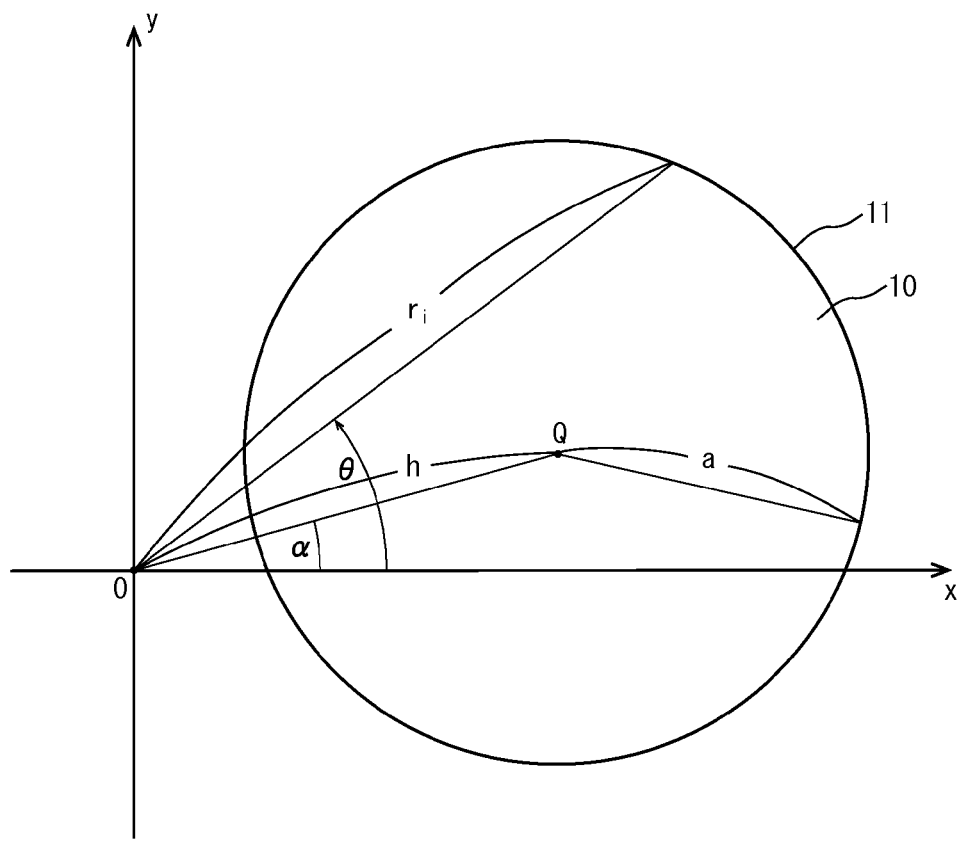
FIG. 5 is a diagram illustrating a relational equation used by the workpiece processing apparatus.

FIG. 5 is a schematic diagram illustrating a relational equation used for acquiring the second distance information. In this diagram, the same reference numerals as in FIG. 2B denote the same or corresponding constituent elements. It is assumed that the workpiece 10 in FIG. 5 is different from that in FIG. 2B, in that there is no recess or projection at the edge, and the radius of the workpiece is a. For the sake of convenience of this description, FIG. 5 shows an example in which the rotation center of the workpiece 10 is positioned outside the workpiece. Note that the rotation center may be positioned on the workpiece.

The edge of the circular workpiece 10 in which, as shown in FIG. 5, the rotation center O is off the center Q can be expressed using polar coordinates, as an equation below.

$$r_i^2 - 2hr_i \cos(\theta - \alpha) = a^2 - h^2$$

If this equation is expanded regarding $r_i$, the following equation is obtained.

$$r_i = \frac{2h\cos(\theta - \alpha) + \sqrt{\{2h\cos(\theta - \alpha)\}^2 + 4(a^2 - h^2)}}{2} \quad (3)$$

Equation (3) above is an equation expressing a relationship between a rotational angle and second distance information corresponding to the rotational angle, in the case where the circular workpiece 10 with no recess or projection at the edge 11 is rotated. For example, Equation (3) is stored in advance in an unshown storage unit, and the second distance information acquiring part 1034 reads this equation and substitutes the adjustment information acquired using Equations (1) and (2) above, specifically, the value of the angle α, which is information indicating the movement direction, the value of the length h, which is information indicating a movement amount, and the radius a of the workpiece 10, for Equation (3), so that a relational equation expressing a relationship between the rotational angle θ and the second distance information $r_i$ corresponding to the rotational angle, in the case where the workpiece 10 has a circular shape with no recess or projection at the edge 11, is acquired. Hereinafter, the relational equation obtained by substituting the values of a and the length h are referred to as an ideal curve equation.

Although it is most preferable to acquire the ideal curve equation described above, as the relational equation, other approximation formulae such as an approximation formula or the like obtained using a sine curve or the like may be acquired.

In the description above, the adjustment information acquiring part 1033 acquires adjustment information, using one or more pairs of the multiple pieces of first distance information and the rotational angles acquired by the compositing processing part 1032 from Equations (1) and (2). However, in the present invention, the adjustment information acquiring part 1033 may form a simultaneous equation by substituting multiple pairs of the multiple pieces of first distance information acquired by the compositing processing part 1032 for one or more pieces of composite distance information and the rotational angles respectively associated with the multiple pieces of first distance information for Equation (3), and solve this simultaneous equation, thereby acquiring adjustment information. Furthermore, the radius of the workpiece 10 may be substituted as appropriate for the simultaneous equation. The same is applied to the cases where other approximation formulae are used.

The second distance information acquiring part 1034 substitutes the multiple rotational angles corresponding to the multiple pieces of first rotational distance information stored in the first rotational distance information storage unit 101 for the acquired relational equation, for example, the ideal curve equation, thereby acquiring second distance information. Note that the multiple rotational angles corresponding to the multiple pieces of first rotational distance information do not necessarily have to be read from the first rotational distance information storage unit 101, and may be any angles, as long as they are multiple rotational angles substantially the same as the multiple rotational angles contained in the multiple pieces of first rotational distance information. For example, substantially the same multiple rotational angles may be acquired and used. For example, the multiple rotational angles substantially the same as the multiple rotational angles contained in the multiple pieces of first rotational distance information may be acquired using a value of an angle by which the workpiece 10 is rotated each time one piece of first distance information is acquired from the workpiece 10, for example, by sequentially adding this value of the angle.

The second distance information acquiring part 1034 accumulates the second distance information acquired by sequentially substituting the multiple rotational angles for the relational equation (e.g., the second distance information r) in association with the rotational angles in an unshown storage unit or the like. The accumulating in this example may be temporarily storing. In this example, each pair of the second distance information and the rotational angle acquired and accumulated by the second distance information acquiring part 1034 is referred to as second rotational distance information. Note that it may be considered that the second distance information acquiring part 1034 acquires second rotational distance information.

The calculating part 1035 acquires a difference between the first distance information and the second distance information associated with the same rotational angle, using the multiple pieces of first rotational distance information stored in the first rotational distance information storage unit 101 and the multiple pieces of second distance information acquired by the second distance information acquiring part 1034. For example, the calculating part 1035 sequentially acquires differences between the first distance information and the second distance information associated with the same rotational angle. The difference may be a value obtained by subtracting a value of the second distance information from a value of the first distance information, or may be a value obtained in the opposite manner. Furthermore, in the case of merely detecting a portion with a defect at the edge, the difference may be the size of the difference, such as the absolute value of the difference. Note that the difference between the first distance information and the second distance information is referred in this example to as distance difference information.

The calculating part 1035 accumulates, for example, the acquired distance difference information and the rotational angle in association with each other in an unshown storage unit or the like. The accumulating in this example may be temporarily storing.

The cut-out detecting part 1036 acquires information indicating the cut-out portion of the workpiece 10, as the information for specifying the orientation of the workpiece 10, using the distance difference information calculated by the calculating part 1035. The portion with the cut-out portion is, as described above, a portion with an orientation flat portion, a notch portion, or the like for specifying the orientation of the workpiece 10, provided at the edge 11 of the workpiece 10. The information indicating the cut-out portion is, for example, information indicating the rotational angle range indicating a portion of the workpiece 10 provided with the cut-out portion, or information indicating multiple pieces of first distance information acquired from the cut-out portion.

For example, the cut-out detecting part 1036 may perform cut-out detection on the edge 11 of the workpiece 10, using the distance difference information calculated by the calculating part 1035 and one or more threshold values for the size of the cut-out portion, and acquire information indicating the detected cut-out portion.

The one or more threshold values for the size of the cut-out portion are, as described above, a threshold value for the distance of the cut-out portion from the edge, or a threshold value for the width of the cut-out portion.

For example, the cut-out detecting part 1036 detects a continuous area that is recessed at the edge 11 toward the inner side of the workpiece 10, the area having distance difference information with at least a predesignated threshold value indicating a lower limit value for the distance of the cut-out portion from the edge, and having the width within a range between predesignated threshold values respectively indicating a lower limit value and an upper limit value for the width of the cut-out portion, using the distance difference information calculated by the calculating part 1035. Then, information indicating the position corresponding to the detected area, for example, information indicating multiple pieces of first distance information acquired for the rotational angle or the detected area is acquired as the information indicating the cut-out portion provided at the edge 11 of the workpiece 10.

The continuous area that is recessed at the edge 11 toward the inner side of the workpiece 10 can be detected, for example, by detecting a continuous area associated with distance difference information indicating that the position indicated by the first distance information is on the inner side of the workpiece than the position indicated by the second distance information is. For example, if the first distance information is the distance from the rotation center of the workpiece 10 to the edge 11, and the distance difference information is a value obtained by subtracting the first distance information from the second distance information, a continuous area in which the distance difference information at the edge 11 is a positive value can be detected as a continuous recessed area. Alternatively, a continuous area in which the distance difference has the size larger than a threshold value set in advance in consideration of measurement errors or the like may be detected as a continuous recessed area. The threshold value in this case is set to, for example, approximately 0. The same is applied to the case of performing defect detection on the edge 11. Furthermore, the same is applied to the case of performing detection of a continuous projecting area.

Instead of the threshold value indicating the lower limit value for the distance of the cut-out portion from the edge, threshold values respectively indicating a lower limit value and an upper limit value for the distance from the edge may be used for judging whether or not the largest value of the distance difference information of the continuous area (or a value close to the largest value, etc.) is within a range indicated by the threshold values, and the case in which the value is within the range may be used instead of the judgment result indicating that the area has distance difference information with at least the threshold value indicating the lower limit value for the distance of the cut-out portion from the edge. In a similar manner, instead of the threshold values respectively indicating the lower limit value and the upper limit value for the width, a threshold value indicating a lower limit value for the width may be used, and the case in which the continuous area has the width that is at least the lower limit value for the width may be used instead of the judgment result in the case where the width of the cut-out portion is within a range of the threshold values respectively indicating the lower limit value and the upper limit value. Furthermore, in the case of judging whether or not the continuous area is the cut-out portion, only the distance from the edge or only the width may be judged instead of judging the distance from the edge and the width. Note that such a combination may be changed as appropriate. The same is applied to the case of performing defect detection on the edge 11.

Furthermore, the cut-out detecting part 1036 may detect a portion in which the size of the value is larger than a predesignated first threshold value, from among the differences between the first distance information and the second distance information (i.e., the distance difference information) calculated by the calculating part 1035, and acquire information indicating the rotational angle associated with the detected portion, as the information indicating the cut-out portion of the workpiece 10. If the workpiece 10 has a circular shape with no recess or projection, the distance of the cut-out portion from the edge is typically deeper than the distance of chipping or the like that may be present at the edge of the workpiece 10. Furthermore, the depth (the distance from the edge) of the cut-out portion is a known value. Accordingly, it is possible to detect one or more pieces of distance difference information corresponding to the cut-out portion, by setting the first threshold value to a value larger than the depth (the distance from the edge) of chipping or the like and smaller than the known depth (the distance from the edge) of the cut-out portion, thereby acquiring information indicating the cut-out portion.

The first threshold value may be, for example, a threshold value for the size of the value. The detecting distance difference information in which the size of the value is larger than the first threshold value may be, for example, detecting distance difference information in which the absolute value is larger than the first threshold value. The same is applied to other a second threshold value, which will be described later.

Note that whether the value of the distance difference information corresponding to the cut-out portion is a positive value or a negative value depends on whether the distance difference information has been acquired by subtracting the second distance information from the first distance information or by subtracting the first distance information from the second distance information.

If the cut-out detecting part 1036 detects multiple pieces of distance difference information in which the sizes of the values are larger than the first threshold value and that correspond to rotational angles that are successive, the cut-out detecting part 1036 may group these multiple rotational angles. The cut-out detecting part 1036 may acquire information indicating the cut-out portion further having information indicating the group. The information indicating the group is, for example, information indicating a range of the corresponding rotational angles, a collection of the corresponding rotational angles, a group identifier provided for the corresponding rotational angles, or the like. The same is applied to information indicating a group of defective portions (described later). In this case, one group of the rotational angles may be considered, for example, as multiple rotational angles corresponding to multiple positions on one cut-out portion, or information indicating a range of the cut-out portion.

The cut-out detecting part 1036 may detect, as the cut-out portion, an area having multiple pieces of distance difference information in which the sizes of the values are larger than the first threshold value and that correspond to rotational angles that are successive at least a predesignated number of (i.e., 2). Typically, the cut-out portion is set to a wide range at the edge of the workpiece 10, and, thus, the detection in this manner realizes more reliable cut-out detection.

The cut-out detecting part 1036 may detect multiple cut-out portions from one workpiece 10.

The defect detecting part 1037 acquires information regarding the defective portion at the edge 11 of the workpiece 10, using the difference between the first distance information and the second distance information calculated by the calculating part 1035, that is, the distance difference information.

For example, the defect detecting part 1037 performs defect detection on the edge 11 of the workpiece 10, using the difference between the first distance information and the second distance information calculated by the calculating part 1035 and one or more threshold values for the size of the defective portion, and acquires information regarding the detected defective portion.

For example, the defect detecting part 1037 detects distance difference information in which the size of the value is at least the threshold value indicating a lower limit value for the distance of the defective portion from the edge, from among the pieces of distance difference information calculated by the calculating part 1035, and, if such distance difference information is detected, acquires information regarding the defective portion. Instead of the threshold value indicating the lower limit value for the distance of the defective portion from the edge, a threshold value indicating a lower limit value for the depth of the defective portion and a threshold value indicating a lower limit value for the height of the defective portion may be used for detecting distance difference information in which the value is not between the threshold value indicating the lower limit value for the depth of the defective portion and the threshold value indicating the lower limit value for the height of the defective portion.

Furthermore, for example, the defect detecting part 1037 may detect a continuous area that is recessed toward the inner side of the workpiece 10 or a continuous area that projects toward the outer side of the workpiece 10, at the edge 11 of the workpiece 10, using the distance difference information calculated by the calculating part 1035, judge whether or not this recessed or projecting area includes a portion in which the size of the value of the distance difference information is at least the threshold value indicating a lower limit value for the distance of the defective portion from the edge, and, if a portion with at least the threshold value is included, judge this recessed or projecting area as the defective portion and acquire information regarding this defective portion such as information indicating the rotational angle range.

Furthermore, for example, the defect detecting part 1037 may detect a continuous area that is recessed toward the inner side of the workpiece 10 or a continuous area that projects toward the outer side of the workpiece 10, at the edge 11 of the workpiece 10, using the distance difference information calculated by the calculating part 1035, judge whether or not this recessed or projecting area has the width that is at least the threshold value that is a lower limit value for the width of the defective portion, and, if the width is at least the lower limit value, judge this recessed or projecting area as the defective portion and acquire information regarding the defective portion.

Note that, as the one or more threshold values used for detecting whether or not a continuous area as described above is the defective portion, a threshold value in the case where the continuous area is a recess and that in the case where the continuous area is a projection may be different or may be the same.

Alternatively, the judgment based on the depth and the judgment based on the width may be combined such that the continuous area is judged as the defective portion if the distance from the edge is at least a threshold value and the width is at least a threshold value.

Furthermore, for example, the defect detecting part 1037 detects a portion in which the size of the value is larger than a predesignated second threshold value, from among the differences between the first distance information and the second distance information calculated by the calculating part 1035, that is, the distance difference information, and acquire information regarding the detected portion, as the information regarding the defective portion at the edge 11 of the workpiece 10.

The second threshold value is a threshold value for distinguishing a non-defective portion at the edge 11 of the workpiece 10 and a defective portion at the edge 11 of the workpiece 10. For example, in a non-defective portion at the edge 11 of the workpiece 10, a difference between the values of the first distance information and the second distance information is a difference at the same level of a measurement error in the case of acquiring the first distance information. On the other hand, in a defective portion, the difference is sufficiently larger than a measurement error. Accordingly, it is possible to perform defect detection on the edge 11 of the workpiece 10, for example, by setting the second threshold value to a value larger than a measurement error.

The information regarding the detected portion, that is, the information regarding the detected distance difference information is, for example, information indicating the rotational angle corresponding to the detected distance difference information, or a pair of the detected distance difference information and information indicating the corresponding rotational angle. For example, the detected distance difference information may be considered as the information indicating the depth or the height of the defective portion.

Whether the defective portion is a portion that projects toward the outer side of the workpiece 10 as in the case of burrs or a portion that is recessed toward the inner side of the workpiece 10 as in the case of chipping can be judged, for example, based on the reference point or the like of the first distance information and the sign of the distance difference information, and, thus, the defect detecting part 1037 may judge whether or not the defective portion has a shape that projects toward the outer side, based on the sign of the distance difference information. The defect detecting part 1037 may acquire information regarding the defective portion, further having the detection result.

Furthermore, if the defect detecting part 1037 detects multiple pieces of distance difference information in which the sizes of the values are larger than the second threshold value and that correspond to rotational angles that are successive, the defect detecting part 1037 may group these multiple pieces of distance difference information or the multiple rotational angles. The defect detecting part 1037 may acquire information regarding the defective portion further having information indicating the group. In this case, one group of the distance difference information may be considered, for example, as distance difference information at multiple positions on one defective portion. Furthermore, in this case, one group of rotational angles may be considered, for example, as multiple rotational angles indicating multiple positions on one defective portion, or information indicating the range of the defective portion.

In the case of this sort of processing, a cut-out portion such as an orientation flat portion of the workpiece 10 is also detected as the defective portion. If there is no problem even in the case where the cut-out portion is detected as the defective portion, the above-described processing may be used, but, if the cut-out portion is intended not to be detected as the defective portion, it is necessary that the cut-out portion is not detected as the defective portion, or is excluded from the defective portion.

Accordingly, for example, the defect detecting part 1037 detects multiple pieces of distance difference information that correspond to rotational angles that are successive at least a predetermined number of (i.e., 2), from among the pieces of distance difference information detected using the second threshold value. The predetermined number is set, for example, to the number corresponding to the length (i.e., the rotational angle) of the cut-out portion provided in the workpiece 10. The thus detected multiple pieces of distance difference information are excluded from the defective portion, so that defect detection can be precisely performed excluding the cut-out portion.

Alternatively, the defect detection process may be performed using the second threshold value as described above, only on the distance difference information corresponding to the rotational angles excluding the rotational angle indicating the cut-out portion acquired by the cut-out detecting part 1036.

Alternatively, the defect detecting part 1037 may detect a portion in which the size of the value is smaller than a predesignated first threshold value and is larger than a second threshold value, having a size smaller than that of the first threshold value, from among the differences between the first distance information and the second distance information calculated by the calculating part 1035, that is, the distance difference information, and acquire information regarding the detected portion, as the information regarding the defective portion at the edge 11 of the workpiece 10. The defect detecting part 1037 may also detect distance difference information in which the size of the value is the same as the first threshold value. The first threshold value is, for example, a threshold value for performing cut-out detection on the workpiece 10 as described above. The second threshold value is as descried above. Accordingly, defect detection can be precisely performed, excluding the cut-out portion, by not detecting distance difference information larger than the first threshold value.

The output unit 104 outputs the information for positioning the workpiece acquired by the acquiring unit 103. Furthermore, the output unit 104 outputs the information for specifying the orientation of the workpiece acquired by the acquiring unit 103. Furthermore, the output unit 104 outputs the information regarding the defective portion acquired by the acquiring unit 103. For example, the output unit 104 outputs adjustment information, which is the information for positioning the workpiece acquired by the acquiring unit 103. Furthermore, the output unit 104 outputs information indicating the cut-out portion, which is the information for specifying the orientation of the workpiece acquired by the acquiring unit 103. The output may have an identifier of the workpiece 10.

The output is a concept that encompasses display on a display screen, projection using a projector, output of a sound, turning on a warning light, printing in a printer, transmission to an external apparatus, accumulation in a storage medium, and delivery of a processing result to another processing apparatus or another program. The output unit 104 may be realized, for example, by an output device, a driver for an output device, or the like. The same is applied to a distance difference-related output part 1039, which will be described later.

For example, the output unit 104 may output the information for positioning the workpiece 10 and the information for specifying the orientation of the workpiece 10 to a workpiece transfer apparatus 2, which will be described later. The workpiece transfer apparatus 2 can place the workpiece 10 at an appropriate position and in an appropriate direction, by adjusting the orientation and the position of the workpiece 10, using these pieces of information, when taking the workpiece 10 out of the edge position detector 102, transferring the workpiece 10, or placing the workpiece 10 at a given location.

For example, the output unit 104 may transmit the information for positioning the workpiece 10 and the information for specifying the orientation of the workpiece 10 to the edge position detector 102 or the like. For example, if the edge position detector 102 changes the position and the direction of the workpiece 10 to an appropriate position and direction using these pieces of information and passes the workpiece 10 to the workpiece transfer apparatus 2, the workpiece transfer apparatus 2 can place the workpiece 10 at an appropriate position and in an appropriate direction.

For example, if the output unit 104 outputs the adjustment information, the workpiece transfer apparatus 2 or the like that has accepted the adjustment information can adjust the position of the workpiece 10 as appropriate such that the rotation center of the workpiece 10 is at the center of the workpiece 10 when the workpiece 10 is used. For example, if the adjustment information is output to the workpiece transfer apparatus 2 or the like for transferring the workpiece 10, the workpiece transfer apparatus 2 or the like may be able to adjust the rotation center of the workpiece 10 to the center of the workpiece 10 and transfer the workpiece 10. Furthermore, if the adjustment information is output to the edge position detector 102 or the like having a moving part (not shown) or the like for modifying the position of the workpiece 10, the edge position detector 102 or the like may be able to move or rotate the turntable 52, thereby moving the position of the workpiece 10 such that the rotation center thereof is at the center of the workpiece 10 when the workpiece 10 is passed to the workpiece transfer apparatus 2.

Furthermore, if the output unit 104 outputs the information indicating the cut-out portion of the workpiece, the workpiece transfer apparatus 2, the edge position detector 102, or the like that has accepted the adjustment information can adjust the orientation of the workpiece 10 as appropriate such that the orientation of the workpiece 10 is in the predesignated orientation.

The output unit 104 may further perform abnormality output in response to the information regarding the defective portion acquired by the acquiring unit 103. The abnormality output is output in the case where the edge 11 of the workpiece 10 has an abnormality. The abnormality output may be output indicating that the edge 11 of the workpiece 10 has an abnormality, or may be output of an instruction to perform an operation according to the abnormality, to an external apparatus or the like.

The abnormality output is, for example, output of warning or the like indicating that an abnormality has occurred. The output of warning is, for example, output of a warning sound, warning display on a monitor or the like, turning on a warning light, or the like. The output of warning may have an identifier of the workpiece 10 in which the defective portion has been detected.

Furthermore, the abnormality output may be output of an instruction to stop the operation on the workpiece 10. The operation on the workpiece 10 is transferring the workpiece 10 with the workpiece transfer apparatus 2, positioning the workpiece 10 with the edge position detector 102 or the like, or performing predesignated processing or the like on the workpiece 10 in an apparatus to which the workpiece 10 has been transferred from the workpiece transfer apparatus 2. For example, the output unit 104 outputs an instruction to stop the operation, to the workpiece transfer apparatus 2, the edge position detector 102, or a processing apparatus (not shown) or the like for performing processing on the workpiece 10. Accordingly, the operation on the workpiece 10 having an abnormality at the edge can be stopped.

Furthermore, the abnormality output may be, for example, output of an instruction to collect the workpiece 10 that has been detected to have an abnormality. The collecting is, for example, moving the workpiece 10 to a predesignated collecting location, excluding it from an ordinary processing route, putting it on standby, excluding it from a transfer path, or the like. For example, the output unit 104 outputs an instruction to collect the workpiece 10 that has been detected to have an abnormality, to the workpiece transfer apparatus 2 or the like. If the workpiece transfer apparatus 2 transfers the workpiece 10 to a predesignated collecting location or the like according to the instruction, the workpiece that has been detected to have an abnormality can be prevented from being subjected to the following operation, processing, or the like. Furthermore, the collected workpiece can be subjected to defect inspection or the like.

For example, the output unit 104 may perform abnormality output, if the acquiring unit 103 acquires information regarding one defective portion. Furthermore, the output unit 104 may perform abnormality output, if the information regarding the defective portion acquired by the acquiring unit 103 satisfies a predesignated condition. For example, it may be judged whether or not the acquiring unit 103 has detected at least a predesignated number of (i.e., k, which is an integer of two or more) defective portions, from the information regarding the defective portion acquired by the acquiring unit 103, and abnormality output may be performed if it is judged that at least k defective portions are detected. Furthermore, abnormality output may be performed if the information regarding the defective portion acquired by the acquiring unit 103 contains information indicating a defective portion in which the largest value of the distance from the edge is at least a predesignated value.

The evaluation-related information accepting unit 105 accepts evaluation-related information, which is information related to evaluation of defective portions at the edges 11 of one or at least two workpieces 10. The evaluation-related information accepting unit 105 preferably accepts evaluation-related information on multiple workpieces 10.

The evaluation-related information is, for example, information used for evaluating one or more threshold values used to perform a defect detection process. The one or more threshold values used to perform a defect detection process are, for example, one or more threshold values for the size of the defective portion.

The evaluation-related information is, for example, information having information indicating whether or not there is actually a defect in the workpiece 10 that has been judged by the workpiece processing apparatus 1 as being non-defective. Examples of such a workpiece include the workpiece 10 from which information regarding the defective portion has not been acquired by the acquiring unit 103. Furthermore, the evaluation-related information is, for example, information having information indicating whether or not there is actually a defect or whether or not it is evaluated that there is a defect in the workpiece 10 that has been judged by the workpiece processing apparatus 1 as being defective, for example, the workpiece 10 from which information regarding the defective portion has been acquired by the acquiring unit 103. For example, the information indicating whether or not there is actually a defect may be information indicating whether or not the workpiece 10 was properly subjected to the processing steps after the processing by the workpiece processing apparatus 1, for example, information indicating whether or not the workpiece 10 was damaged, or may be information indicating a result of re-inspection (including visual inspection, etc.) performed for detecting the defective portion in the workpiece 10 that has been detected to be defective. The workpiece 10 that has been detected to be defective may be the workpiece 10 that has been collected in response to abnormality output.

Furthermore, the evaluation-related information may be, for example, information containing correct/erroneous information indicating whether the defect detection was correct or erroneous. The correct/erroneous information is information indicating whether or not the defect detection result in the workpiece processing apparatus 1 was correct. For example, it is evaluated whether or not there is actually a defect in the workpiece 10 from which information regarding the defective portion has not been acquired by the acquiring unit 103, and, if there is no defect, correct/ erroneous information indicating that the defect detection by the acquiring unit 103 was correct is stored in the evaluation-related information, and, if there is a defect, correct/erroneous information indicating that the defect detection was not correct is stored. For example, it is evaluated whether or not there is actually a defect in the workpiece 10 from which information regarding the defective portion has been acquired by the acquiring unit 103, and, if there is no defect, correct/erroneous information indicating that the defect detection by the acquiring unit 103 was not correct is stored in the evaluation-related information, and, if there is a defect, correct/erroneous information indicating that the defect detection was correct is stored. Whether the defect detection was correct or erroneous is judged, for example, from a result of re-inspection on the workpiece 10 or information indicating whether or not the workpiece 10 was properly subjected to the following processing, as described above.

Furthermore, the evaluation-related information may further have information regarding processing in the subsequent steps of the workpiece processing apparatus 1. For example, the evaluation-related information may have information indicating the type of processing in one or at least two subsequent steps (e.g., heat treatment, CVD, CMP, etching, etc.), an identifier of an apparatus used for the processing, parameters such as the processing time, the pressure, or the temperature for the processing, the type or the concentration of gas used for the processing, the type or the concentration of liquid used for the processing, and the like.

Furthermore, the evaluation-related information may have information regarding the workpiece 10, such as the size of the workpiece 10, the material system or composition of the workpiece.

Furthermore, the evaluation-related information may have the information regarding the defective portion acquired by the acquiring unit 103, for example, information regarding the size of the defective portion, information regarding similar defective portions acquired in re-inspection on the workpiece 10, and the like.

Furthermore, the evaluation-related information may have one or more threshold values for the size of the defective portion, which are used to perform a defect detection process. Note that, in the case of evaluating one or more threshold values currently used by the acquiring unit 103, and using the evaluation-related information on the workpiece 10 subjected to defect detection process with the current threshold values, the evaluation-related information does not have to have the threshold values.

The accepting is a concept that encompasses accepting information input from an input device such as a keyboard, a mouse, or a touch panel, receiving information transmitted via a wired or wireless communication line, accepting information read from a storage medium such as an optical disk, a magnetic disk, or a semiconductor memory.

The evaluation-related information accepted by the evaluation-related information accepting unit 105 is accumulated, for example, in an unshown storage unit or the like.

The evaluation-related information accepting unit 105 may be realized by a driver for an input device, control software for a menu screen, a receiving part, or the like.

The setting unit 106 acquires one or at least two threshold values for the size used by the acquiring unit 103 for defect detection, using the evaluation-related information. Then, threshold values for the size used by the acquiring unit 103 for defect detection are set using the acquired threshold values. The setting is a concept that encompasses, for example, updating, for example, overwriting, and the like of one or at least two threshold values used by the acquiring unit 103 for defect detection, set by default, by the user, or the like.

For example, if the evaluation-related information accepting unit 105 accepts evaluation-related information having information indicating that there is a workpiece 10 that has been judged as being actually defective, in at least a predetermined number of (i.e., 1, 2, or more) workpieces 10 that were detected to be non-defective in the case where the acquiring unit 103 performed defect detection on the workpieces 10 using one threshold value for the distance of the defective portion from the edge 11, the setting unit 106 acquires a threshold value with which the defective portion is more easily detected than with the value of the one threshold value for the distance of the defective portion from the edge 11 used by the acquiring unit 103, for example, a threshold value with a smaller value, and updates the threshold value for the distance from the edge 11 used by the acquiring unit 103 into this threshold value. Accordingly, a portion in which a change in the distance from the edge 11 is small also can be detected as the defective portion, and the situation in which defective portions are failed to be detected can be suppressed. In this case, evaluation-related information further having information indicating the distance of the defective portion from the edge 11 acquired in re-inspection or the like may be accepted, so that the information indicating the distance of the defective portion from the edge 11, of the workpiece 10 that was detected to be non-defective but has been judged as being actually defective, is used to acquire a threshold value with which this defective portion is detected.

For example, if the evaluation-related information accepting unit 105 accepts evaluation-related information having information indicating that no defective portion has been actually detected in re-inspection or the like, in a predetermined number of (i.e., 1, 2, or more) workpieces 10 that were detected to be defective, the setting unit 106 may acquire a threshold value with which the defective portion is less easily detected than with the value of the one threshold value for the distance of the defective portion from the edge 11 used by the acquiring unit 103, for example, a threshold value with a larger value, as the threshold value for the distance from the edge, and update the threshold value for the distance from the edge 11 used by the acquiring unit 103 into this threshold value.

Furthermore, the setting unit 106 may acquire one or more threshold values for the size of the defective portion, through machine learning using the evaluation-related information having the correct/erroneous information and the threshold values. For example, the setting unit 106 performs learning using, as learning data, a combination of correct/erroneous information of the evaluation-related information of multiple workpieces, accepted by the evaluation-related information accepting unit 105, one or more threshold values for the size of the defective portion, and one or more of the information regarding processing in the subsequent steps of the workpiece processing apparatus 1, the information regarding the workpieces 10, the information regarding the defective portion, and the like, as described above. For example, in the setting of a threshold value for defect detection in processing or the like performed by the workpiece processing apparatus 1 on one or more workpieces 10, pairs of one or more of the information regarding processing in the subsequent steps of the workpiece processing apparatus 1, the information regarding the workpieces 10 (e.g., workpiece type), the information regarding the defective portion, and the like, and each of multiple threshold values prepared in advance for one or more threshold values for the size of the defective portion (e.g., a threshold value for the distance from the edge, or a threshold value for width), which are similar to those learned for the workpieces 10 as described above, are input via the evaluation-related information accepting unit 105 or the like, so that each pair is evaluated using the learning result. Then, one (e.g., the largest threshold value, etc.) of the threshold values contained in the pairs in the case where an evaluation result having correct/erroneous information indicating that defect judgment was correctly performed may be acquired as one or more threshold values for the size of the defective portion. Then, this threshold value may be set as the threshold value for defect detection.

Accordingly, defect detection can be precisely performed at the edge 11 of the workpiece 10, using an appropriate threshold value according to the processing in the subsequent steps, the workpiece type, and the like.

As the learning using learning data, a learning model such as SVR is available as a known art. In this case, the learning data may be considered as supervised data.

The correct/erroneous information may be acquired as appropriate by the setting unit 106, from information regarding the defective portion in one workpiece 10 and information indicating whether or not the edge 11 of the workpiece 10 is actually defective, which are contained in the evaluation-related information.

Furthermore, in the description above, a processing result of the workpiece 10, for example, whether or not the workpiece 10 was damaged may be learned instead of the correct/erroneous information, and the distance of the defective portion of the workpiece 10 from the edge 11 may be learned instead of the threshold value. In this case, if multiple pairs having one or more of the information regarding processing in the subsequent steps of the workpiece processing apparatus 1, the information regarding the workpieces 10, the information regarding the defective portion, and the like, and each of multiple distances of the defective portion from the edge are input to the learning result, the distance of the defective portion from the edge where damage or the like does not occur in the subsequent steps can be acquired. For example, if this distance is used as the threshold value, defect detection can be performed as appropriate. It will be appreciated that the threshold values for the size used for defect detection may be set by performing machine learning other than that described above.

Furthermore, the setting unit 106 may form a threshold value prediction formula using multiple regression analysis or the like, from a combination of a previously used threshold value contained in the evaluation-related information and a parameter or the like obtained from the processing in the subsequent steps, the workpiece type, and the like, calculate an appropriate threshold value according to the processing in the subsequent steps, the workpiece type, and the like, using the prediction formula, and set the calculated threshold value.

Next, an example of the edge position detector 102 will be described with reference to FIG. 3.

The edge position detector 102 includes a turntable rotation mechanism 53 for rotating the turntable 52 on which the workpiece 10 is placed, and the turntable rotation mechanism 53 is driven by an electric motor 54. An edge detecting unit 55 for detecting the edge position of the workpiece 10 has a projector 55a and a sensor 55b. The sensor 55b is, for example, an optical sensor. The sensor 55b provides output that continuously changes in accordance with the amount of light received while maintaining a specific relationship therebetween. A sensor called a charge coupled device (CCD) or the Position Sensitive Detector (brand name: PSD), which provides output that linearly changes with respect to the amount of incident light is used as the sensor 55b. The sensor 55b corresponds to, for example, the sensor 15 in FIG. 2A. The sensor 55b of the edge detecting unit 55 provides output that is in accordance with the amount of light that is emitted from the projector 55a, is attenuated by the workpiece 10 positioned immediately below the projector 55a, and reaches the sensor 55b. The output indicates the edge position of the workpiece 10. An encoder 56 detects the rotation amount of the electric motor 54 corresponding to the rotational angle of the turntable 52, and outputs a digital signal. An accumulating unit 57 accumulates the output of the sensor 55b and the output of the encoder 56, as a pair of data sets, for each certain rotational angle of the turntable 52. The accumulating unit 57 may convert the output of the sensor 55b into the distance from the rotation center of the workpiece 10 to the edge 11, and output the converted data. In this specific example, it is assumed that the accumulating unit 57 accumulates a pair of a rotational angle and first distance information obtained by converting the output of the sensor 55b into the distance from the rotation center of the workpiece 10 to the edge 11, as the first rotational distance information, in the first rotational distance information storage unit 101. If the output of the sensor 55b is an analog signal, an A/D converter or the like may be provided between the accumulating unit 57 and the sensor 55b.

Note that the above-described edge position detector 102 is merely an example, and, in the present invention, the edge position detector 102 may be other detectors, as long as multiple pieces of first rotational distance information from the workpiece 10 can be acquired as in the case of using the edge position detector 102.

Although this example shows a case in which the edge position detector 102 forms part of the workpiece processing apparatus 1, the edge position detector 102 may be, for example, an apparatus separated from the workpiece processing apparatus 1.

Next, an example of the workpiece transfer system in this example will be described with reference to FIG. 4.

The workpiece transfer system 1000 includes the workpiece processing apparatus 1 and the workpiece transfer apparatus 2. A transfer path 1001 of the workpiece transfer system 1000 is covered by, for example, an unshown cover or the like.

The workpiece transfer apparatus 2 is an apparatus for transferring the workpiece 10. For example, the workpiece transfer apparatus 2 includes an arm that can horizontally and vertically move, and transfers the workpiece 10 by moving the arm in the state where the workpiece 10 is placed thereon. It is also possible that the workpiece transfer apparatus 2 itself can horizontally and vertically move. There is no limitation on the structure or the like of the workpiece transfer apparatus 2.

The workpiece transfer apparatus 2 receives and delivers the workpiece 10 from and to the workpiece processing apparatus 1. The receiving and delivering the workpiece 10 from and to the workpiece processing apparatus 1 are, for example, during transfer of the workpiece 10, transferring the workpiece 10 to the workpiece processing apparatus 1 and delivering the workpiece to the workpiece processing apparatus 1, and then receiving the workpiece 10 from the workpiece processing apparatus 1 and transferring it to another location.

For example, the workpiece transfer apparatus 2 is an apparatus for performing transfer from a first location to the workpiece processing apparatus 1 and transfer from the workpiece processing apparatus 1 to a second location. The first location is a location at which the workpiece 10 that is to be transferred is disposed. The second location is a location that is a transfer destination of the workpiece 10 that is to be transferred. The workpiece transfer apparatus 2 may further perform transfer from the workpiece processing apparatus 1 to a third location at which the workpiece 10 that is to be collected is placed. For example, the workpiece transfer apparatus 2 may transfer the workpiece 10 to either the second location or the third location, for example, according to an instruction or the like input from the outside.

Hereinafter, a case will be described, as an example, in which the workpiece transfer apparatus 2 transfers the workpiece 10 contained in a container 4, which is the first location, onto the turntable 52 of the workpiece processing apparatus 1, and transfers the workpiece 10 placed on the turntable 52 of the workpiece processing apparatus 1 to a placement table 6 of an apparatus (not shown) for performing predesignated processing, which is the second location, or to a collecting container 5, which is the third location. In this case, for example, the workpiece transfer apparatus 2 can receive abnormality output by the output unit 104 of the workpiece processing apparatus 1, via an unshown receiving unit or the like. If abnormality output is received, the workpiece transfer apparatus 2 transfers the workpiece 10 placed on the turntable 52 of the workpiece processing apparatus 1 to the collecting container 5, which is the third location, so that the workpiece 10 is collected, and, if not, the workpiece transfer apparatus 2 transfers the workpiece 10 placed on the turntable 52 of the workpiece processing apparatus 1 to the placement table 6 of the apparatus (not shown) for performing predesignated processing, which is the second location.

The workpiece transfer apparatus 2 may include a part that receives information for positioning the workpiece 10, such as the adjustment information output by the output unit 104 of the workpiece processing apparatus 1, and adjusts the position of the workpiece. Furthermore, the workpiece transfer apparatus 2 may include a part that receives information for specifying the orientation of the workpiece 10, such as the information indicating the cut-out portion output by the output unit 104 of the workpiece processing apparatus 1, and adjusts the orientation of the workpiece.

Furthermore, the workpiece transfer apparatus 2 may include, for example, a part that receives abnormality output by the output unit 104 of the workpiece processing apparatus 1, and stops the transfer of the workpiece 10 according to the received abnormality output.

The configuration of the workpiece transfer apparatus 2 is a known art, and, thus, a detailed description thereof has been omitted.

The placement table 6 is a table on which the workpiece 10 can be placed that is to be processed by the apparatus (not shown) for performing predesignated processing on the workpiece 10. The placement table 6 corresponds to the above-described second location. The apparatus for performing predesignated processing may be any apparatus such as a CVD apparatus or a surface polishing apparatus. For example, the predesignated processing is performed on the workpiece 10 placed on the placement table 6.

The container 4 is a container that is to be transferred in a state where one or at least two workpieces 10 are contained therein. The container 4 corresponds to the above-described first location. In the container 4, the workpiece 10 that is to be processed by the above-described unshown apparatus can be contained. In the container 4, the workpiece 10 that is to be transferred by the workpiece transfer apparatus 2 and be placed on the placement table 6 can be contained. The container 4 is, for example, a cassette that is to be transferred in a state where one or at least two workpieces 10 are contained therein. The container 4 is, for example, a so-called front open unified pod (FOUP). The container 4 can be attached to and detached from the unshown cover of the transfer path 1001. The cover of the transfer path 1001 is provided, for example, with a door (not shown) or the like to which the container 4 is to be attached.

The container 5 is a container that is to be transferred in a state where one or at least two workpieces 10 are contained therein. The container 5 corresponds to the above-described third location. The container 5 is a container in which the workpiece 10 that has been collected in response to abnormality output by the output unit 104 can be contained. In the container 5, the workpiece 10 that has been transferred by the workpiece transfer apparatus 2 in response to the abnormality output can be contained. The other portions of the configuration and the like of the container 5 are similar to those of the container 4.

Although this example shows a case in which the first location is the container 4, the second location is the placement table 6, and the third location is the container 5, but these locations may be any locations. For example, the first location may be a placement table or the like of an apparatus for performing given processing on the workpiece. Furthermore, the second location may be a container similar to the container 4. Furthermore, the third location may be a placement table or the like of an apparatus (not shown) for inspecting the workpiece.

Next, an exemplary operation of the workpiece processing apparatus 1 will be described with reference to the flowchart in FIG. 6. Note that the processing in which the edge position detector 102 acquires the first rotational distance information is a known art, and, thus, a description thereof has been omitted. Furthermore, the processing in which the edge position detector 102 accumulates the multiple pieces of first rotational distance information acquired from the workpiece 10, in the first rotational distance information storage unit 101 will not be described either. In this example, a case will be particularly described, as an example, in which the setting unit 106 acquires a threshold value for the size of the defective portion, without using machine learning.

(Step S100) The workpiece processing apparatus 1 judges whether or not it is time to output the adjustment information, the information indicating the cut-out portion, and the information regarding the defective portion. For example, the workpiece processing apparatus 1 judges whether or not multiple pieces of first rotational distance information acquired from one workpiece 10, corresponding to one circumference of the workpiece 10, are stored in the first rotational distance information storage unit 101, and, if the pieces of information are stored, judges that it is time to output the above-described information, and, if not, judges that it is not time to output. Alternatively, it is also possible to judge that it is time to output, if the processing in which the edge position detector 102 acquires multiple pieces of first rotational distance information from one workpiece 10 ends. If the information is to be output, the procedure advances to step S101, and, if not, the procedure advances to step S120.

(Step S101) The compositing part 1031 composites four pieces of first distance information associated with rotational angles that are different from each other by 90 degrees, among the multiple pieces of first distance information contained in the multiple pieces of first rotational distance information corresponding to one workpiece 10, thereby acquiring multiple pieces of composite distance information. For example, the compositing part 1031 divides the multiple pieces of first rotational distance information corresponding to rotational angles whose values are successive, into multiple groups each corresponding to rotational angles in a range of 90 degrees, and composites pieces of first distance information contained in the first rotational distance information at the same arrangement orders in the divided groups. The compositing is, for example, calculating an average value. The compositing part 1031 accumulates the acquired composite distance information and four rotational angles respectively associated with the four pieces of first distance information subjected to the compositing in association with each other in an unshown storage unit.

(Step S102) The compositing processing part 1032 substitutes 1 for a counter p.

(Step S103) The compositing processing part 1032 detects composite distance information with a p-th smallest value, from among the pieces of composite distance information obtained by the compositing in step S102. For example, the compositing processing part 1032 provides the already detected composite distance information with information of a flag indicating that it has been already deleted, a flag indicating that it is to be deleted, or the like. Instead of detecting the p-th piece of composite distance information, it is also possible to detect and delete composite distance information with a smallest value. In the case of deleting, composite distance information with a smallest value is next detected and deleted from among the remaining pieces of composite distance information that have not been detected yet.

(Step S104) The compositing processing part 1032 increments the counter p by 1.

(Step S105) The compositing processing part 1032 judges whether or not the value of the counter p is at least a predetermined number designated in advance. If the value is at least the predetermined number, the procedure advances to step S106, and, if not, the procedure returns to step S103.

(Step S106) The compositing processing part 1032 substitutes 1 for a counter q.

(Step S107) The compositing processing part 1032 detects composite distance information with a q-th largest value, from among the pieces of composite distance information obtained by the compositing in step S102. For example, the compositing processing part 1032 provides the already detected composite distance information with information of a flag indicating that it has been already deleted, a flag indicating that it is to be deleted, or the like. Instead of detecting the q-th piece of composite distance information, it is also possible to detect and delete composite distance information with a largest value. In the case of deleting, composite distance information with a largest value is next detected and deleted from among the remaining pieces of composite distance information that have not been detected yet.

(Step S108) The compositing processing part 1032 increments the counter q by 1.

(Step S109) The compositing processing part 1032 judges whether or not the value of the counter q is at least a predetermined number. If the value is at least the predetermined number, the procedure advances to step S110, and, if not, the procedure returns to step S107.

(Step S110) The compositing processing part 1032 detects pieces of composite distance information that are not detected (or deleted) in steps S103 and S107 and that are successive at least a predesignated number.

(Step S111) The compositing processing part 1032 detects one piece of composite distance information (e.g., the composite distance information arranged in the middle) from among the successive pieces of composite distance information detected in step S110, and acquires four pieces of first distance information from which the detected composite distance information are composited, and a rotational angle associated with one of the pieces of first distance information. For example, the smallest rotational angle among the rotational angles associated with the four pieces of first distance information is acquired as one rotational angle.

(Step S112) The adjustment information acquiring part 1033 acquires adjustment information for moving the rotation center of the workpiece 10 to the center of the workpiece 10, using the four pieces of first distance information and the one rotational angle acquired in step S111. For example, adjustment information is acquired using Equations (1) and (2) above. The acquired adjustment information is temporarily stored in an unshown storage unit.

(Step S113) The second distance information acquiring part 1034 acquires a relational equation expressing a relationship between a rotational angle and second distance information corresponding to the rotational angle, in the case where the workpiece 10 has a circular shape with no recess or projection at the edge 11, using the adjustment information acquired in step S112. For example, an ideal curve equation is acquired by substituting the adjustment information for the coefficient of Equation (3) above.

(Step S114) The second distance information acquiring part 1034 substitutes each of multiple rotational angles corresponding to the multiple pieces of first rotational distance information corresponding to the one workpiece 10, for the relational equation acquired in step S113, thereby acquiring second distance information for each rotational angle. Then, the multiple pieces of second rotational distance information having the rotational angles and the second distance information are accumulated in an unshown storage unit.

(Step S115) The calculating part 1035 acquires multiple pieces of distance difference information indicating a difference between the first distance information and the second distance information associated with the same rotational angle.

(Step S116) The cut-out detecting part 1036 acquires information indicating the cut-out portion, using the multiple pieces of distance difference information and the first threshold value.

(Step S117) The defect detecting part 1037 acquires information regarding the defective portion, using the multiple pieces of distance difference information and the second threshold value.

(Step S118) The output unit 104 performs abnormality output in response to the information regarding the defective portion. Note that the performing abnormality output in response to the information regarding the defective portion is a concept that encompasses not performing abnormality output depending on the information regarding the defective portion, and not performing abnormality output if the information regarding the defective portion is not acquired.

(Step S119) The output unit 104 outputs the adjustment information, the information indicating the cut-out portion, and the information regarding the defective portion. The procedure returns to step S100. If abnormality output is performed in step S118, the output unit 104 may not output the adjustment information and the information indicating the cut-out portion. Furthermore, if the defect detecting part 1037 does not acquire information regarding the defective portion, the output unit 104 may not output the information regarding the defective portion.

(Step S120) The evaluation-related information accepting unit 105 judges whether or not the evaluation-related information has been accepted. If accepted, the procedure advances to step S121, and, if not, the procedure advances to step S122.

(Step S121) The evaluation-related information accepting unit 105 accumulates the evaluation-related information accepted in step S120 in an unshown storage unit. The procedure returns to step S100.

(Step S122) The setting unit 106 judges whether or not it is time to set one or more threshold values for the size of the defective portion. For example, if an instruction to set a threshold value is accepted from the user via an unshown accepting unit or the like, the setting unit 106 judges that it is time to set, and, if not, the setting unit 106 judges that it is not time to set. Alternatively, it is also possible to judge that it is time to set, if the evaluation-related information has been accepted in step S120, or if a predesignated number of pieces of evaluation-related information are accepted in step S121. If it is time to set, the procedure advances to step S123, and, if not, the procedure returns to step S100.

(Step S123) The setting unit 106 acquires one or more threshold values for the size of the defective portion, using the evaluation-related information accumulated in step S121.

(Step S124) The setting unit 106 sets a threshold value used by the acquiring unit 103 for performing defect detection, to the threshold values acquired in step S123. For example, the threshold value is accumulated in an unshown storage unit. Note that, if a threshold value corresponding to the threshold value acquired in step S123 (e.g., the threshold value used for the same processing) is already set, for example, if a default threshold value is set, the setting unit 106 updates this threshold value. The updating may be considered as setting. The procedure returns to step S100.

Figure 6:
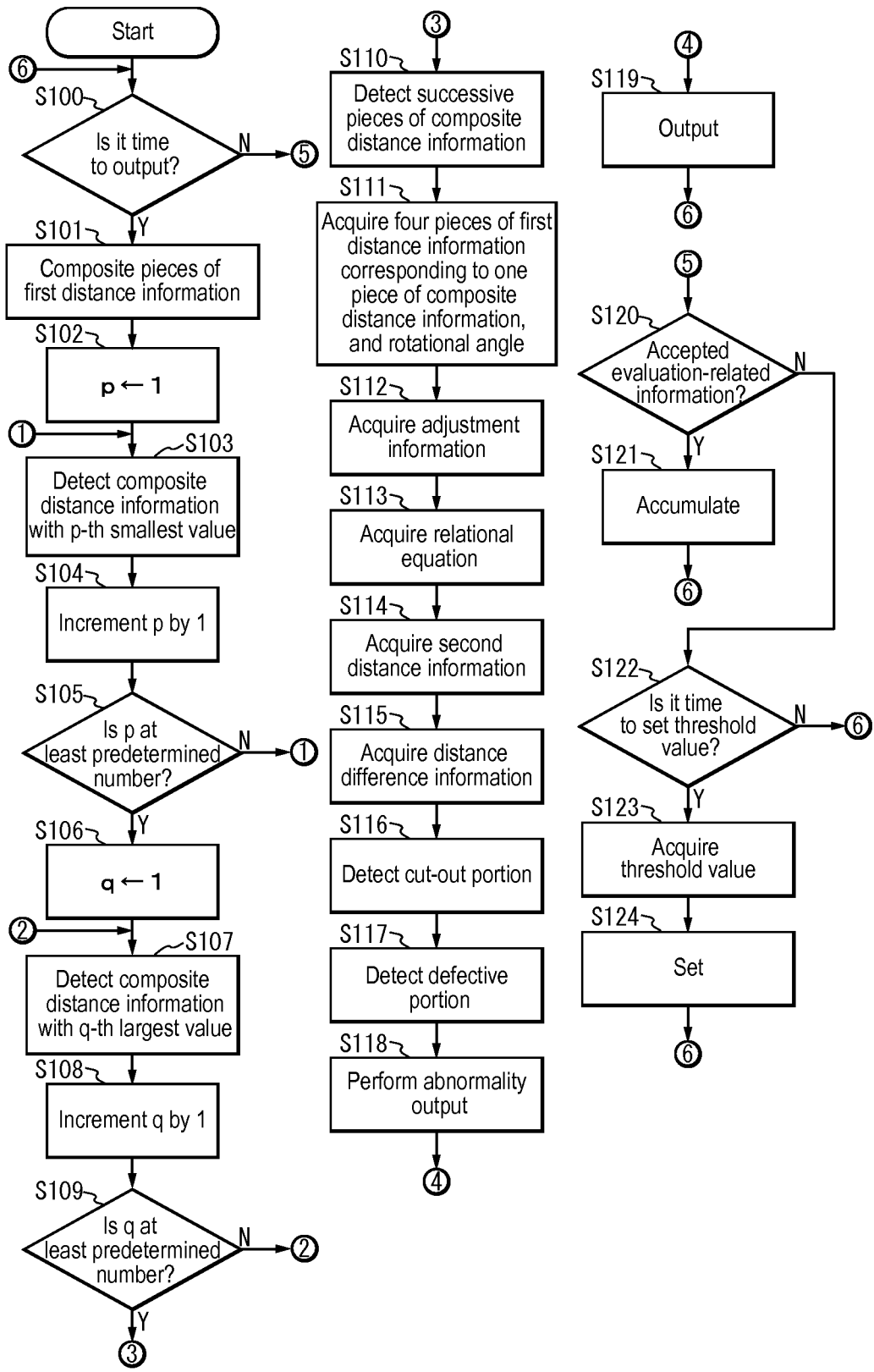
FIG. 6 is a flowchart illustrating an operation of the workpiece processing apparatus.

In FIG. 6, the case was described in which a threshold value is acquired by the setting unit 106 without using machine learning, but, if the setting unit 106 acquires a threshold value using machine learning, for example, the setting unit 106 may perform learning using the evaluation-related information accumulated in step S121, and accept, before acquiring a threshold value in step S123, pairs of one or more of the information regarding processing in the subsequent steps of the workpiece processing apparatus 1, the information regarding the workpiece 10, the information regarding the defective portion, and the like, and each of multiple threshold values prepared in advance for one or more threshold values for the size of the defective portion (e.g., a threshold value for the distance from the edge, or a threshold value for width), which are similar to the learned evaluation-related information, via the evaluation-related information accepting unit 105 or the like. Then, the setting unit 106 may acquire a threshold value in step S123 from the accepted information and the learning result. The multiple threshold values prepared in advance may be stored in advance by default in an unshown storage unit or the like.

Note that the process is terminated by powering off or an interruption at completion of the process in the flowchart in FIG. 6.

Figure 7:
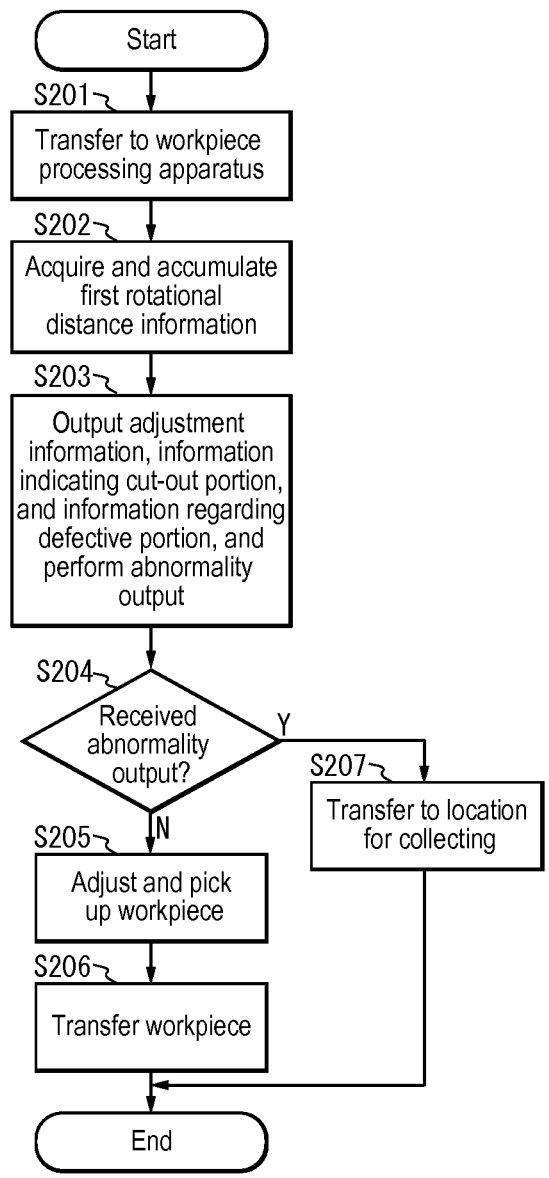
FIG. 7 is a flowchart illustrating an operation of the workpiece transfer system including the workpiece processing apparatus.

Next, an exemplary operation of the workpiece transfer system 1000 will be described with reference to the flow-chart in FIG. 7. Hereinafter, a case will be described, as an example, in which the workpiece 10 is placed on the turntable 52 of the edge position detector 102 of the workpiece processing apparatus 1, and the edge position detector 102 acquires multiple pieces of first rotational distance information from the workpiece 10, and accumulates the acquired rotational distance information in the first rotational distance information storage unit 101.

(Step S201) The workpiece transfer apparatus 2 takes out one workpiece 10 at the first location (e.g., the workpiece 10 contained in the container 4), and transfers it to the workpiece processing apparatus 1. Specifically, the workpiece 10 is placed on the turntable 52 of the edge position detector 102.

(Step S202) The edge position detector 102 acquires multiple pieces of first rotational distance information from the workpiece placed on the turntable 52, and accumulates the acquired first rotational distance information in the first rotational distance information storage unit 101.

(Step S203) The workpiece processing apparatus 1 acquires and outputs adjustment information, information indicating the cut-out portion, and information regarding the defective portion of the workpiece 10, and performs abnormality output. These processes correspond to those of the workpiece processing apparatus 1, for example, described in steps S100 to S119 in the flowchart in FIG. 6.

(Step S204) The workpiece transfer apparatus 2 judges whether or not abnormality output has been received from the output unit 104 of the workpiece processing apparatus 1. If abnormality output has been received, the procedure advances to step S207, and, if not, the procedure advances to step S205.

(Step S205) The workpiece transfer apparatus 2 adjusts the workpiece placed on the turntable 52 of the edge position detector 102, using the adjustment information and the information indicating the cut-out portion output by the output unit 104, such that the position and the direction are a desired position and direction, and picks up the workpiece. The adjusting may be realized by changing the position and the direction at which the workpiece transfer apparatus 2 supports the workpiece 10 when picking up the workpiece, or by changing the position and the direction of the turntable of the edge position detector 102.

(Step S206) The workpiece transfer apparatus 2 transfers the workpiece 10 to the second location (e.g., the placement table 6), and places the workpiece thereon. The transfer process is ended.

(Step S207) The workpiece transfer apparatus 2 picks up the workpiece 10 from the turntable of the edge position detector 102, transfers the workpiece to a third location for collecting (i.e., the collecting container 5), and accommodates the workpiece in the container 5. The transfer process is ended.

Hereinafter, a specific exemplary operation of the workpiece transfer system 1000 in this example will be described. Below, the case will be described in which the edge position detector 102 includes a part or the like for changing the position and the direction of the turntable 52 according to the adjustment information and the information indicating the cut-out portion output by the output unit 104. In the description below, it is assumed that the workpiece 10 is a wafer 10.

The workpiece transfer apparatus 2 takes out one wafer 10 stored in the container 4, transfers it to the workpiece processing apparatus 1, and places it on the turntable 52 of the edge position detector 102 as shown in FIG. 3.

After the wafer 10 is placed on the turntable 52, the edge position detector 102 acquires rotational angles and first distance information while rotating the wafer 10, and the accumulating unit 57 accumulates the multiple pieces of first rotational distance information having pairs of the rotational angles and the first distance information in the first rotational distance information storage unit 101.

FIG. 8 is a first rotational distance information management table for managing the first rotational distance information, stored in the first rotational distance information storage unit 101. The first rotational distance information is acquired, as described above, using the edge position detector 102 as shown in FIG. 3. In this example, for the sake of convenience of this description, a case will be described, as an example, in which pieces of first rotational distance information sequentially acquired every 0.036 degrees while rotating the wafer 10 one revolution are stored. That is to say, 10000 records of first rotational distance information are stored for one wafer.

The first rotational distance information management table has attributes "wafer ID", "rotational angle", and "first distance information". In the table, "wafer ID" shows information for identifying a wafer, "rotational angle" shows a rotational angle of the wafer, and "first distance information" shows a distance from the rotation center of the wafer to the edge of the wafer. Note that $r_m$ (m is an integer of 1 to 10000) of "first distance information" is first distance information associated with a rotational angle of 0.036 ×m (degrees). The value of $r_m$ may be any value. In the first rotational distance information management table, each row (record) indicates a piece of first rotational distance information.

Figure 9:
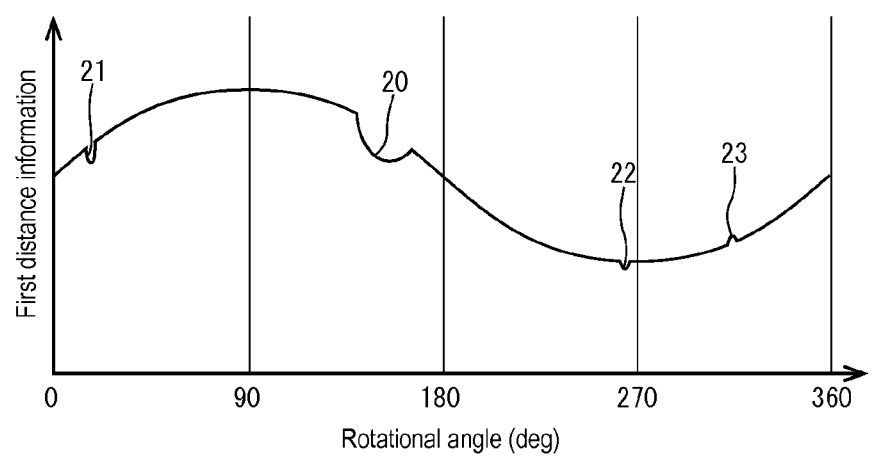
FIG. 9 is a graph illustrating the first rotational distance information of the workpiece processing apparatus.

FIG. 9 is a graph illustrating a relationship between the rotational angle and the first distance information of the first rotational distance information. This graph is a graph showing a relationship between the rotational angle and the first distance information of the first rotational distance information from a wafer with "wafer ID" being "W001" (hereinafter, referred to as a wafer W001). If a rotation center of the wafer is off the center of the wafer, the entire graph has, for example, a curved waveform taking 360 degrees as one cycle as shown in FIG. 9. In the graph, a recess 20 is a portion corresponding to an orientation flat portion of the wafer 10. Furthermore, recesses 21 and 22 are portions corresponding to chipping of the wafer 10. Furthermore, a projection 23 is a portion corresponding to burrs of the wafer 10.

It is assumed that the user or the like first performs an operation that, for example, designates the wafer W001 as a target from which adjustment information and the like are to be acquired.

Figure 10A:
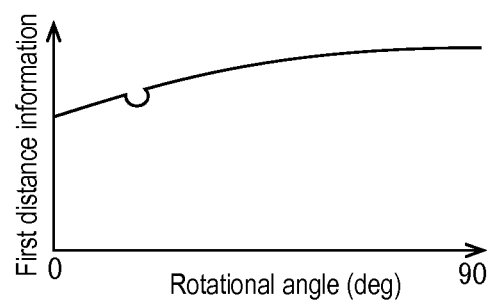
FIG. 10A is a graph of the first rotational distance information of the workpiece processing apparatus, with the rotational angle being 0 degrees or more and less than 90 degrees.
Figure 10B:
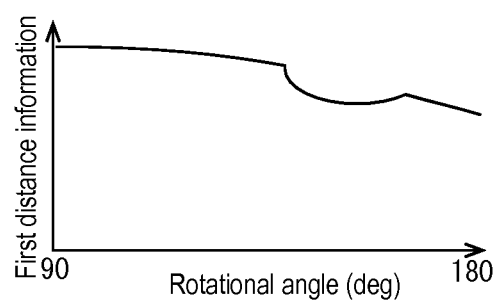
FIG. 10B is a graph of the first rotational distance information of the workpiece processing apparatus, with the rotational angle being 90 degrees or more and less than 180 degrees.
Figure 10C:
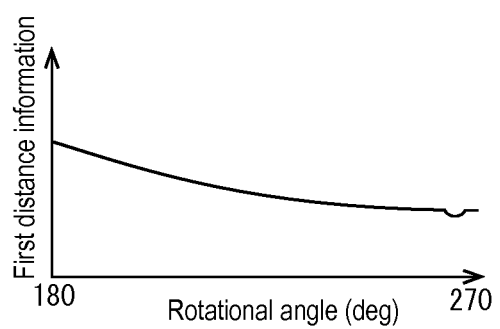
FIG. 10C is a graph of the first rotational distance information of the workpiece processing apparatus, with the rotational angle being 180 degrees or more and less than 270 degrees.
Figure 10D:
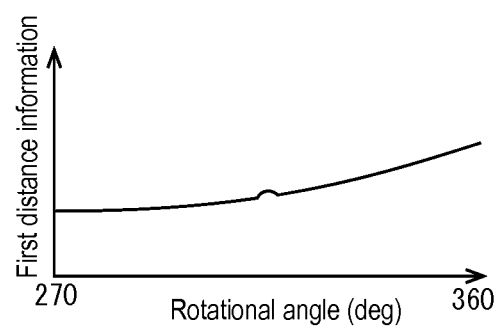
FIG. 10D is a graph of the first rotational distance information of the workpiece processing apparatus, with the rotational angle being 270 degrees or more and less than 360 degrees.
Figure 10E:
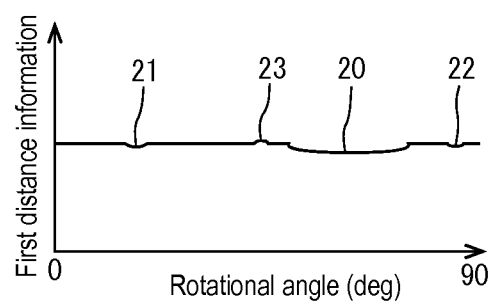
FIG. 10E is a graph obtained by compositing the pieces of first rotational distance information of the workpiece processing apparatus.

FIG. 10 shows graphs of a relationship between the rotational angle and the first distance information of the first rotational distance information, illustrating processing performed by the compositing part 1031 on the first rotational distance information, where FIG. 10A is a graph with the rotational angles being in a range of 0 degrees or more and less than 90 degrees, FIG. 10B is a graph with the rotational angles being in a range of 90 degrees or more and less than 180 degrees, FIG. 10C is a graph with the rotational angles being in a range of 180 degrees or more and less than 270 degrees, FIG. 1 OD is a graph with the rotational angles being in a range of 270 degrees or more and less than 360 degrees, and FIG. 10E is a graph obtained by compositing the graphs in FIGS. 10A to 10D according to the arrangement order of the rotational angles. FIG. 10F is a graph showing a state in which portions with a large change in the values have been deleted from the graph in FIG. 10E.

The compositing part 1031 acquires records with "wafer ID" being "W001" from the first rotational distance information management table shown in FIG. 8, and divides the acquired records into four groups each corresponding to "rotational angle" in a range of 90 degrees. Specifically, the records are divided into a group of records with "rotational angle" being 0 degrees or more and less than 90 degrees, a group of records with "rotational angle" being 90 degrees or more and less than 180 degrees, a group of records with "rotational angle" being 180 degrees or more and less than 270 degrees, and a group of records with "rotational angle" being 270 degrees or more and less than 360 degrees. The records in each group are shown in graphs as in FIGS. 10A to 10D.

The compositing part 1031 composites pieces of first distance information contained in the first rotational distance information at the same arrangement orders in the divided groups. The compositing is calculating an average value. For example, the compositing part 1031 acquires, as composite distance information at the first order, an average value $R_1$ of the values "$r_1$", "$r_{2501}$", "$r_{5001}$", and "$r_{7501}$" of "first distance information" of records at the first order in the case where the records in each group are arranged in ascending order of the value of the rotational angle (i.e., the records with "rotational angle" being "0", "90", "180", and "270"), and accumulates this value in association with the rotational angles in an unshown storage unit. Note that $R_1 = (r_1 + r_{2501} + r_{5001} + r_{7501})/4$.

In a similar manner, an average value $R_2$ of the values "$r_2$", "$r_{2502}$", "$r_{5002}$", and "$r_{7502}$" of "first distance information" of records at the second order in the respective groups (i.e., the records with "rotational angle" being "0.036", "90.036", "180.036", and "270.036") is acquired as composite distance information at the second order and is accumulated in association with the rotational angles in the unshown storage unit. A similar processing is performed also on the records at the third and subsequent orders.

FIG. 11 is a composite distance information management table for managing the composite distance information acquired by the compositing part 1031. The composite distance information management table has attributes "rotational angle" and "composite distance". In the table, "rotational angle" shows rotational angles respectively associated with the four pieces of first distance information subjected to the compositing, and "composite distance" shows composite distance information. Note that $R_m = (r_m + r_{m+2500} + r_{m+5000} + r_{m+7500})/4$.

FIG. 10E is a graph showing the composite distance information acquired by the compositing part 1031. In the graph, the horizontal axis indicates the smallest angles in "rotational angle". As shown in FIG. 10E, if pieces of first distance information associated with rotational angles that are different from each other by 90 degrees are composited, a waveform occurring due to the rotation center being off the center of the wafer as shown in FIG. 9 is cancelled and the entire graph has a straight line-like shape. Note that the recesses 20, 21, and 22 and the projection 23 corresponding to defective portions such as chipping or burrs and cut-out portions such as an orientation flat portion, which appear in successively arranged multiple pieces of first distance information before the compositing, change in the values due to the compositing, but remain without being cancelled.

Next, the compositing processing part 1032 repeats processing for detecting and deleting composite distance information with a smallest value from among the multiple pieces of composite distance information composited by the compositing part 1031 shown in FIG. 11, until a predesignated number of times is reached. The deleting may be providing the composite distance information with information of a flag indicating that it has been already deleted. Accordingly, for example, in FIG. 10E, the multiple pieces of composite distance information at the recess 20 corresponding to an orientation flat portion in which a change in the sizes of the values is larger than the other portions are sequentially deleted, and, then, the pieces of composite distance information at the recesses 21 and 22 corresponding to chipping in which a change in the sizes of the values is larger than the other portions excluding the orientation flat portion are sequentially deleted.

Next, the compositing processing part 1032 repeats processing for detecting and deleting composite distance information with a largest value from among the multiple pieces of composite distance information remaining after deleting the smallest value the predesignated number of times, until a predesignated number of times is reached, as described above. Accordingly, for example, in FIG. 10E, the pieces of composite distance information at the projection 23 corresponding to burrs in which a change in the sizes of the values is larger than the other portion are sequentially deleted. Note that the numbers of times of the above-described deleting processes are preferably determined by repeating an experiment or the like. For example, the number of times of the detecting and deleting process on the side where a cut-out portion such as an orientation flat portion is present (the number of times of detecting and deleting the smallest value, in this example) is preferably larger than the number of times of the detecting and deleting process on the side where no cut-out portion such as an orientation flat portion is present (the number of times of detecting and deleting the largest value, in this example).

Accordingly, portions in which a change in the sizes of the values is large can be detected and deleted from among the pieces of composite distance information shown in FIG. 11, and, thus, the remaining pieces of composite distance information that have not been detected yet, that is, the remaining pieces of composite distance information that have not been deleted yet are as shown in FIG. 1 OF. The pieces of composite distance information that are successive two or more, among the remaining pieces of composite distance information that have not been detected yet, are multiple pieces of composite distance information in which a change is small.

Figure 10F:
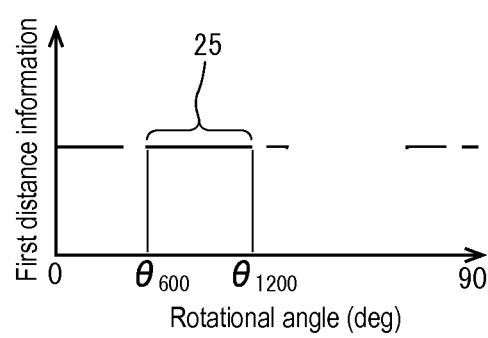
FIG. 10F is a graph of the first rotational distance information of the workpiece processing apparatus, at a portion thereof in which a change is small.

Next, the compositing processing part 1032 detects one piece of composite distance information from among the remaining successive pieces of composite distance information that have not been detected (that have not been deleted, in this example). In this example, the number of successive pieces of composite distance information is detected for each of the multiple sets of successive pieces of composite distance information, and one piece of composite distance information arranged in the middle in the portion where the largest number of pieces of information are successive is detected. For example, assuming that the pieces of composite distance information with the rotational angle θ being in a range of $\theta_{600}$ to $\theta_{1200}$, specifically, the pieces of composite distance information in an area 25 in FIG. 10F are successive, and the number of pieces of information that are successive is larger than the other portions in which the pieces of information are successive, the compositing processing part 1032 detects the composite distance information positioned in the middle of this range, specifically, the composite distance information associated with a rotational angle of $\theta_{900}$. Note that $\theta_m$ (m is an integer of 1 to 10000) is, for example, a rotational angle obtained by rotationally moving the wafer W001 by 0.036 degrees 600 times, that is, a rotational angle of 0.036 ×m (degrees). Furthermore, $\theta_{600}$ is, for example, a rotational angle obtained by rotating the wafer W001 by 0.036 ×600 (degrees).

Moreover, the compositing processing part 1032 acquires four rotational angles associated with the four pieces of first distance information before the compositing, of the detected composite distance information, from the composite distance information management table shown in FIG. 11. For example, in the composite distance information management table shown in FIG. 11, records including a rotational angle θ corresponding to the detected composite distance information are detected as the values of "rotational angle", and all values of "rotational angle" contained in the records are acquired. Alternatively, 90 degrees, 180 degrees, and 270 degrees are sequentially added to the rotational angle $\theta_{900}$, so that four rotational angles before the compositing are acquired. In this example, it is assumed that $\theta_{900}$, $\theta_{900}+90$ degrees, $\theta_{900}+180$ degrees, and $\theta_{900}+270$ degrees are acquired as the rotational angles. The compositing processing part 1032 acquires four pieces of first distance information $r_{900}$, $r_{3400}$, $r_{5900}$, and $r_{8400}$ respectively associated with the acquired four rotational angles, from the first rotational distance information management table shown in FIG. 8.

The thus acquired four pieces of first distance information are first distance information acquired at the edge where no cut-out portion, burrs, chipping, or the like is present in the wafer, and, thus, these pieces of information correspond to the distance from the rotation center to the edge where the influence of the cut-out portion or the defective portion is small in the wafer.

It is assumed that the adjustment information acquiring part 1033 reads Equations (1) and (2) above, for example, from an unshown storage unit or the like, substitutes the four pieces of first distance information and one of the rotational angles associated with the pieces of first distance information (i.e., the smallest rotational angle $\theta_{900}$ of the acquired rotational angles) acquired by the compositing processing part 1032, for Equations (1) and (2), thereby calculating adjustment information for moving the rotation center of the wafer W001 to the center of the wafer W001, that is, an angle that is information indicating the movement direction and a length that is a movement amount. In this example, it is assumed that an angle $\alpha_1$ and a length $h_1$ are acquired as the adjustment information. The acquired adjustment information is temporarily stored by the adjustment information acquiring part 1033, for example, in an unshown storage unit or the like.

The second distance information acquiring part 1034 that has received the adjustment information reads Equation (3) above from an unshown storage unit, and substitutes the angle $\alpha_1$ and the length $h_1$, which are the adjustment information, for Equation (3), thereby acquiring an ideal curve equation.

The second distance information acquiring part 1034 sequentially substitutes the multiple rotational angles corresponding to multiple pieces of first rotational distance information for the acquired ideal curve equation, thereby sequentially acquiring pieces of second distance information. Specifically, rotational angles respectively obtained by sequentially increasing the value from 0 degrees by 0.036 degrees to an angle immediately before 360 degrees are substituted for an ideal curve equation, so that pieces of second distance information are sequentially calculated. Then, second rotational distance information having the substituted rotational angles and the acquired pieces of second distance information is accumulated in an unshown storage unit.

FIG. 12 is a second rotational distance information management table for managing the second rotational distance information acquired and accumulated by the second distance information acquiring part 1034. The second rotational distance information management table has attributes "rotational angle" and "second distance information". In the table, "second distance information" shows second distance information, for example, the distance from the rotation center to the edge of the wafer W001 according to the rotational angle in the case where the wafer W001 is a wafer in the shape of an ideal circle with no recess or projection at the edge. Note that $r_{im}$ (m is an integer of 1 to 10000) of "second distance information" is second distance information associated with a rotational angle of 0.036 ×m (degrees).

Figure 13:
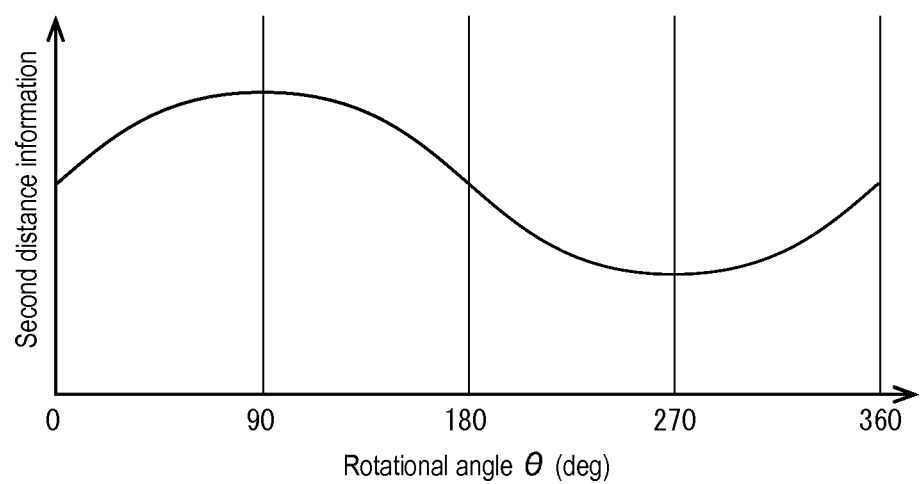
FIG. 13 is a graph showing multiple pieces of second rotational distance information of the workpiece processing apparatus.

FIG. 13 is a graph showing a relationship between the rotational angle and the second distance information of the multiple pieces of second rotational distance information acquired by the second distance information acquiring part 1034. In the graph, the horizontal axis indicates the rotational angle θ, and the vertical axis indicates the second distance information $r_i$.

The calculating part 1035 sequentially acquires differences between the first distance information and the second distance information associated with the same rotational angle from the multiple pieces of first distance information stored in the first rotational distance information and the multiple pieces of second distance information acquired by the second distance information acquiring part 1034. In this example, the calculating part 1035 acquires a value obtained by subtracting the first distance information from the second distance information. For example, the first distance information "$r_1$" associated with the rotational angle "0" is subtracted from the second distance information "$r_{i1}$" associated with the rotational angle "0 degrees", so that distance difference information "$r_{i1}-r_1$" corresponding to the rotational angle "0 degrees" is acquired. For example, the first distance information "$r_2$" associated with the rotational angle "0.036" is subtracted from the second distance information "$r_{i2}$" associated with the rotational angle "0.036 degrees", so that distance difference information "$r_{i2}-r_2$" corresponding to the rotational angle "0.036 degrees" is acquired. A similar processing is performed also on other rotational angles. The calculating part 1035 accumulates the acquired values, as the distance difference information, in association with the rotational angles in an unshown storage unit.

FIG. 14 is a distance difference information management table for managing the distance difference information acquired by the calculating part 1035. The distance difference information management table has attributes "rotational angle" and "distance difference". In the table, "distance difference" shows distance difference information.

Figure 15A:
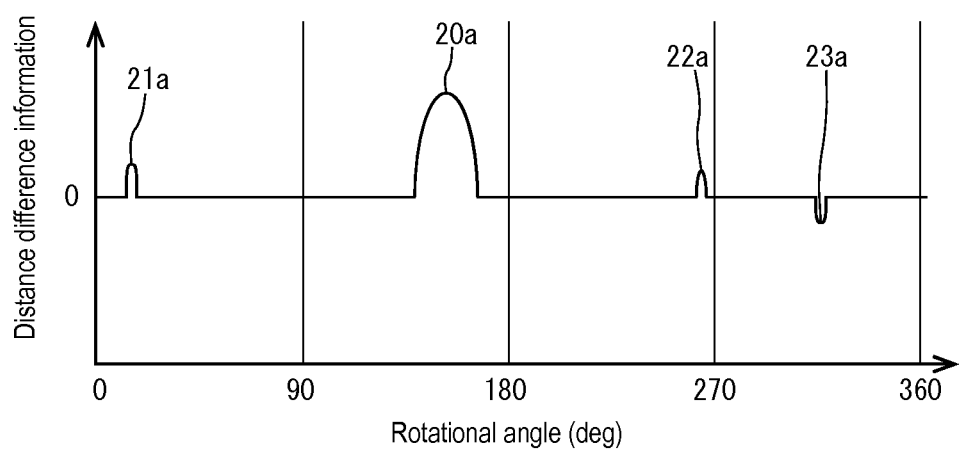
FIG. 15A is a graph showing a relationship between the distance difference information acquired by the workpiece processing apparatus and the rotational angle.
Figure 15B:
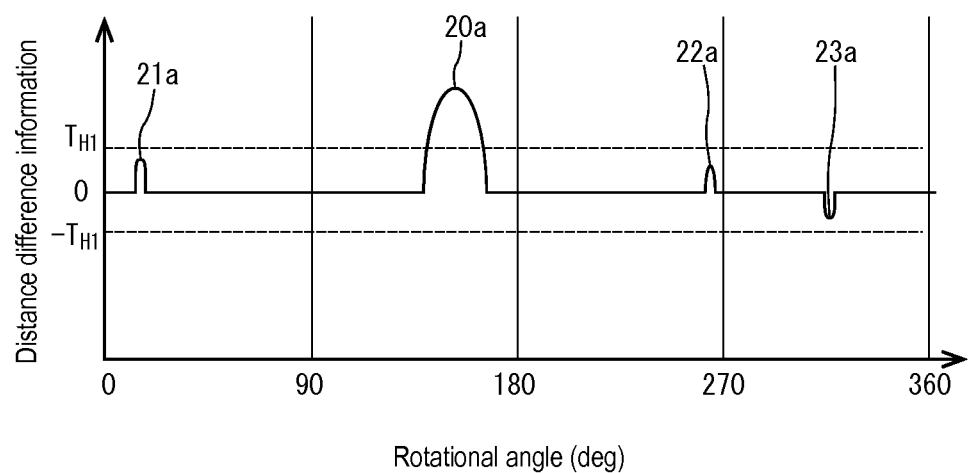
FIG. 15B is a graph illustrating processing performed by a cut-out detecting part of the workpiece processing apparatus.
Figure 15C:
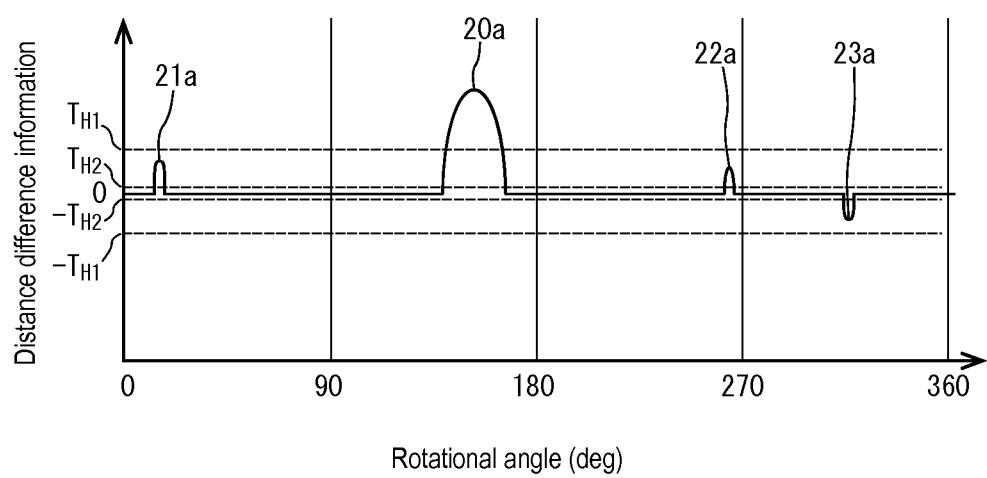
FIG. 15C is a graph illustrating processing performed by a defect detecting part of the workpiece processing apparatus.

FIGS. 15A to 15C are a graph showing a relationship between the distance difference information acquired by the calculating part 1035 and the rotational angle (FIG. 15A), a graph illustrating processing performed by the cut-out detecting part 1036 (FIG. 15B), and a graph illustrating processing performed by the defect detecting part 1037 (FIG. 15C). In the graphs, the horizontal axis indicates the rotational angle, and the vertical axis indicates the value of the distance difference information. Note that, for the sake of the description, for example, the scale of the vertical axis in the graph in FIGS. 15A to 15C is larger than that in FIGS. 9 and 13, for example.

The distance difference information acquired by the calculating part 1035 is shown in a graph as in FIG. 15A. This graph is a graph obtained by, for example, subtracting the values in the vertical axis direction of the graph of the first distance information corresponding to actually measured values or the like having an orientation flat portion, burrs, chipping, or the like as shown in FIG. 9, from the values in the vertical axis direction of the ideal graph in the case where the wafer with no recess or projection at the edge is rotated as shown in FIG. 13. Accordingly, values of the distance difference information acquired at a portion with no recess or projection at the edge of the wafer W001 become constant values approximately close to 0, and only recessed or projecting portions appear as positive or negative values having sizes different from those in the other portions in the graph. For example, in the graphs shown in FIGS. 15A to 15C, a projection 20a corresponding to an orientation flat portion, projections 21a and 22a corresponding to chipping, and a recess 23a corresponding to burrs appear as portions with a change in the sizes of the values, and the other portions have a shape close to a straight line substantially parallel to the x axis.

The cut-out detecting part 1036 detects distance difference information having the size larger than a predesignated first threshold value $T_{H1}$, from among the pieces of distance difference information acquired by the calculating part 1035. It is assumed that the first threshold value $T_{H1}$ is set in advance to a positive value indicating a length that is longer than the depth of typical chipping at the edge of the wafer, and that is sufficiently shorter than the depth of an orientation flat portion. The first threshold value $T_{H1}$ is, for example, a threshold value for the size. In this example, in order to detect positive or negative distance difference information having the size larger than the first threshold value $T_{H1}$, distance difference information having a value larger than $T_{H1}$ or distance difference information having a value smaller than $-T_{H1}$ is detected.

The first threshold value $T_{H1}$ is shown in a graph of a relationship between the distance difference information and the rotational angle, as in FIG. 15B.

In the case where it is known that the distance difference information is a value obtained by subtracting the first distance information from the second distance information, a value of the distance difference information corresponding to an orientation flat portion is a positive value, and, thus, the processing for detecting distance difference information having a value smaller than $-T_{H1}$ may be omitted.

The cut-out detecting part 1036 detects distance difference information having the size larger than the first threshold value $T_{H1}$, and acquires a rotational angle corresponding to the detected distance difference information. For example, the cut-out detecting part 1036 detects distance difference information having a value larger than $T_{H1}$, at the projection 20a corresponding to an orientation flat portion in FIG. 15B. Then, the cut-out detecting part 1036 acquires a smallest value and a largest value of the rotational angles corresponding to the detected distance difference information, as the information indicating the position of the orientation flat portion that is the cut-out portion of the wafer W001. For example, it is assumed that the cut-out detecting part 1036 acquires a smallest value of $\theta_{3800}$ and a largest value of $\theta_{4400}$. The cut-out detecting part 1036 accumulates the acquired smallest value $\theta_{3800}$ and largest value $\theta_{4400}$ in an unshown storage unit.

The defect detecting part 1037 detects distance difference information having the size larger than a predesignated second threshold value $T_{H2}$, from among the pieces of distance difference information acquired by the calculating part 1035. Note that distance difference information having the size larger than the above-described first threshold value $T_{H1}$ is not detected. The second threshold value $T_{H2}$ is set to a value that has the size smaller than the first threshold value $T_{H1}$ and that is larger than 0. Since the distance difference information may have a value other than 0 due to measurement errors or the like of the first distance information, the second threshold value $T_{H2}$ is set to a value in consideration of the measurement errors. The second threshold value $T_{H2}$ is, for example, a threshold value for the size for performing defect detection on the edge. In order to detect positive or negative distance difference information having the size larger than the second threshold value $T_{H2}$, distance difference information having a value larger than $T_{H2}$ or distance difference information having a value smaller than $-T_{H2}$ is detected.

The second threshold value $T_{H2}$ is shown in a graph of a relationship between the distance difference information and the rotational angle, as in FIG. 15C.

Furthermore, as described above, the processing for detecting distance difference information having a value smaller than $-T_{H2}$ may be omitted.

The defect detecting part 1037 detects distance difference information having the size larger than the second threshold value $T_{H2}$, and acquires a rotational angle corresponding to the detected distance difference information. For example, the defect detecting part 1037 detects portions having a value larger than $T_{H2}$, at the projections 21a and 22a corresponding to the defective portion, and a portion having a value smaller than $-T_{H2}$, at the recess 23a corresponding to the defective portion, in FIG. 15C. Then, the defect detecting part 1037 detects pieces of distance difference information that correspond to rotational angles that are successive, from among the detected pieces of distance difference information, and acquires a smallest value and a largest value of the rotational angles corresponding to the successive pieces of distance difference information, as the information indicating the position of the defective portion of the wafer W001. For example, it is assumed that a smallest value of $\theta_{550}$ and a largest value of $\theta_{558}$ of the rotational angles are acquired from the projection 21a. For example, it is assumed that a smallest value of $\theta_{7446}$ and a largest value of $\theta_{7450}$ of the rotational angles are acquired from the projection 22a. For example, it is assumed that a smallest value of $\theta_{8738}$ and a largest value of $\theta_{8743}$ of the rotational angles are acquired from the recess 23a.

Furthermore, for the smallest value and the largest value of the rotational angles corresponding to the distance difference information detected as portions larger than $T_{H2}$, that is, corresponding to the projections 21a and 22a, information indicating that they are portions with chipping is further acquired as the information indicating the type of defective portion. Furthermore, for the smallest value and the largest value of the rotational angles corresponding to the distance difference information detected as a portion smaller than $-T_{H2}$, that is, corresponding to the recess 23a, information indicating that it is a portion with burrs is further acquired as the information indicating the type of defective portion.

Furthermore, the defect detecting part 1037 acquires a largest absolute value of the pieces of distance difference information that correspond to rotational angles that are successive, as the information indicating the size of the defective portion (e.g., the height of burrs or the depth of chipping). For example, assuming that a largest absolute value of the distance difference information within a rotational angle range of $\theta_{8738}$ to $\theta_{8743}$ is $r_{i8741} - r_{8741}$, the defect detecting part 1037 acquires this largest value as the information indicating the size of the defective portion.

Then, the defect detecting part 1037 accumulates the acquired information regarding the defective portion, that is, the rotational angles indicating the range of the defective portion, the information indicating the type of defective portion, and the information indicating the size of the defective portion in an unshown storage unit.

The output unit 104 performs abnormality output in response to the information regarding the defective portion acquired by the defect detecting part 1037. Since the defect detecting part 1037 has detected one or more defective portions in this example, the output unit 104 performs abnormality output. The output unit 104 may perform abnormality output in the case where the defect detecting part 1037 outputs information regarding the defective portion indicating that the defective portion has been detected. Specifically, the output unit 104 transmits information indicating that an abnormality has been detected, as the abnormality output, to the workpiece transfer apparatus 2.

Furthermore, the output unit 104 outputs the information regarding the defective portion detected by the defect detecting part 1037. For example, the output unit 104 outputs information indicating the rotational angle range, among the pieces of information regarding the defective portion detected by the defect detecting part 1037, as the information indicating a portion with a defect. Furthermore, the output unit 104 outputs the information indicating the type of this defective portion, as the information indicating the type of defective portion. Furthermore, the output unit 104 outputs the information indicating the size of the defective portion. For example, information is output indicating that there are burrs with a height of $r_{i8741} - r_{8741}$ at the rotational angle in a range of $\theta_{8738}$ to $\theta_{8743}$. For example, the output unit 104 accumulates the information regarding the defective portion in association with an identifier of the wafer 10 in a predesignated storage unit or the like. The accumulated information regarding the defective portion may be, for example, log information indicating the processing by the workpiece processing apparatus 1.

Although not described, the graph of the first distance information and the rotational angle shown in FIG. 9 may be displayed on a monitor or the like, for example, such that the background color in the range corresponding to the rotational angle range indicated by the information regarding the defective portion is made different from that of the other portions. In this case, it is preferable that the background color used for chipping and burrs is also made different. Furthermore, a value or the like indicating the size of the defective portion may be displayed in each rotational angle range.

If the workpiece transfer apparatus 2 receives information indicating that an abnormality has occurred, from the output unit 104 of the workpiece processing apparatus 1, the workpiece transfer apparatus 2 picks up the wafer 10 placed on the turntable 52 of the edge position detector 102, moves the wafer 10 to the location of the collecting container 5, and accommodates it in the container 5. Accordingly, the wafer 10 that has been judged as having an abnormality can be collected in the container 5, without passing it to the following processing.

For example, it is assumed that the defect detecting part 1037 does not detect one or more defective portions and does not acquire information regarding the defective portion.

The output unit 104 judges that the defect detecting part 1037 has not detected one or more defective portions, and does not perform abnormality output.

The output unit 104 outputs the adjustment information acquired by the adjustment information acquiring part 1033 to the edge position detector 102.

Furthermore, the output unit 104 outputs the information indicating the cut-out portion detected by the cut-out detecting part 1036, to the edge position detector 102. For example, the output unit 104 outputs the rotational angle range $\theta_{3800}$ to $\theta_{4400}$ detected by the cut-out detecting part 1036, as the information indicating a location provided with the orientation flat portion.

If the edge position detector 102 accepts the adjustment information from the output unit 104, the edge position detector 102 horizontally moves the turntable 52 according to the adjustment information, thereby moving the wafer 10 such that the center of the wafer 10 is positioned at the rotation center of the turntable 52 before the moving (the wafer 10 before the moving).

Furthermore, if the edge position detector 102 accepts the information indicating the cut-out portion, the edge position detector 102 horizontally moves or rotationally moves the turntable 52 such that the cut-out portion is in the predesignated direction.

The wafer 10 whose position and orientation have been changed by moving the turntable 52 is picked up by the workpiece transfer apparatus 2 from the turntable 52, and is transferred to and placed on the placement table 6 on which the wafer 10 is to be placed next.

In this manner, the wafer 10 whose position and orientation have been adjusted according to the adjustment information and the information indicating the cut-out portion is received by the workpiece transfer apparatus 2, so that the workpiece transfer apparatus 2 can place the wafer 10 at an appropriate position and in an appropriate direction on the placement table 6, which is a next transfer destination. As a result, the wafer 10 with no defective portion can be positioned.

Although this example shows a case in which the edge position detector 102 changes the position and the orientation of the wafer 10, the output unit 104 may transmit the adjustment information and the information indicating the cut-out portion to the workpiece transfer apparatus 2, and the workpiece transfer apparatus 2 may change the position and the orientation of the wafer 10.

Furthermore, the output unit 104 may output the information indicating the cut-out portion and the information regarding the defective portion detected by the defect detecting part 1037 on an unshown monitor or the like.

Figure 16:
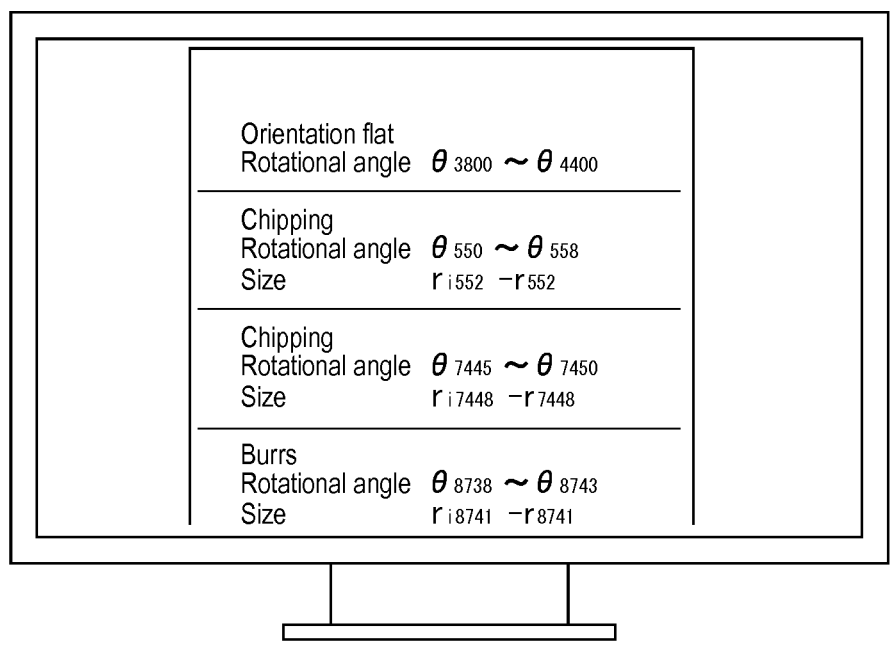
FIG. 16 is a view showing an output example of the workpiece processing apparatus.

FIG. 16 is a view showing an output example of the information indicating the cut-out portion and the information regarding the defective portion by the output unit 104.

With such output by the output unit 104, for example, the user can easily find the position of the orientation flat portion at the edge of the wafer W001, and the position and the type of defective portion. Furthermore, if such information indicating the position of the orientation flat portion and the position and the type of defective portion is output to another apparatus (not shown), this other apparatus can perform processing, for example, in consideration of the positions of the orientation flat portion and the defective portion.

For example, it is assumed that, as a result of the processing performed by the workpiece transfer system 1000 on one wafer 10 that has been transferred to the placement table 6, a crack resulting from chipping at the edge 11 of the wafer 10 occurs in the wafer 10. The reason for this seems to be that there is a defective portion that was not been detected in the defect detection process by the workpiece processing apparatus 1. Accordingly, for example, the user inputs evaluation-related information having information indicating that there is the defective portion that was not been detected by the current defect detection process, to the evaluation-related information accepting unit 105.

If the evaluation-related information accepting unit 105 accepts the evaluation-related information having information indicating that there is the defective portion that was not been detected, the setting unit 106 acquires a threshold value with which a smaller defective portion can be detected than with the threshold value used in the defect detection. Specifically, a threshold value obtained by changing the current value of the second threshold value $T_{H2}$ used in the defect detection to a value smaller by a predesignated value is acquired. For example, a value obtained by subtracting a predesignated value from the current value of the second threshold value $T_{H2}$ is acquired as a new second threshold value. The value that is subtracted is preferably a very small value. Furthermore, it is preferable that the size of the second threshold value after the subtraction is not 0 or less.

Then, the setting unit 106 updates the second threshold value used by the defect detecting part 1037, into the acquired new second threshold value.

Accordingly, feedback of the defect detection result can be performed, so that defect detection can be performed in more minute detail than using the threshold value before the update, and the situation in which defective portions are failed to be detected can be suppressed.

Modified Example

Hereinafter, an example of the case will be described in which, in the above-described specific example, the setting unit 106 acquires a threshold value for defect detection, using machine learning.

For example, it is assumed that the transfer destination of the workpiece transfer system 1000 is a CVD apparatus (not shown), and the placement table 6 is a placement table of this CVD apparatus.

The evaluation-related information accepting unit 105 receives multiple pieces of evaluation-related information in which the second threshold value used in the defect detection on the wafer 10, the processing temperature of the process performed by the CVD apparatus to which the wafer 10 is to be transferred, and the processing time are associated with correct/erroneous information indicating whether or not a result of the defect detection by the workpiece processing apparatus 1 was correct, and accumulates the information in an unshown storage unit.

The setting unit 106 sequentially learns the second threshold value, the processing temperature, the processing time, the correct/erroneous information contained in the received multiple pieces of evaluation-related information, as supervised data.

In the case of performing processing using the same CVD apparatus on one wafer 10 in one processing condition, in order to acquire a threshold value enabling it to detect the defective portion from which a problem such as a crack will occur during the processing, the user inputs each of multiple combinations of the processing temperature and the processing time of the one processing condition and multiple values that are candidates for the second threshold value in association with each other, to the learning result, and acquires a judgment result indicating whether or not a detection result in the case where the defect detection is performed in the second threshold value contained in each combination is correct. Accordingly, it is possible to judge whether or not defect detection can be properly performed using the second threshold value, for the combination of the input processing temperature, processing time, and second threshold value. The multiple values that are candidates for the second threshold value are, for example, multiple values at intervals of a predesignated value. The multiple values that are candidates for the second threshold value are, for example, multiple values around the second threshold value or the like used by default.

One (e.g., the largest second threshold value) of the second threshold values corresponding to a judgment result indicating that the result is correct is acquired. This second threshold value is set as a second threshold value used for defect detection by the defect detecting part 1037.

Accordingly, it is possible to acquire a second threshold value with which the wafer 10 having a defective portion that will be problematic in the following CVD process can be detected as appropriate and the wafer 10 having a recessed or projecting edge that will not be problematic in the following processes is not detected. As a result, for example, the wafer 10 can be precisely selected.

As described above, according to this example, in transfer of the workpiece, defect detection can be performed on the edge of the workpiece when adjusting the position and the orientation of the workpiece, and defect detection can be performed on the workpiece as appropriate.

Furthermore, according to this example, successively arranged multiple pieces of composite distance information in which a change is small are detected from among the pieces of composite distance information obtained by compositing multiple pieces of first distance information associated with rotational angles that are different from each other by 90 degrees, and adjustment information for moving the rotation center of the workpiece to the center of the workpiece is acquired using the multiple pieces of first distance information used for the compositing corresponding to one piece of composite distance information among the detected multiple pieces of composite distance information, so that precise adjustment information can be acquired as appropriate using the first distance information acquired from a substantially non-recessed or non-projecting portion at the edge of the workpiece.

Furthermore, according to this example, a relational equation expressing a relationship between the rotational angle and the distance to the edge in the case where the workpiece has a circular shape with no recess or projection is acquired using the adjustment information, and information indicating the cut-out portion of the workpiece and information regarding the defective portion of the workpiece are acquired using a difference between the second distance information and the first distance information obtained from the acquired relational equation, so that a recess and a projection at the edge of the workpiece can be indicated as appropriate. For example, the position of the cut-out portion of the workpiece can be indicated as appropriate. Furthermore, the position and the type of defective portion at the edge of the workpiece can be indicated as appropriate.

Figure 25:
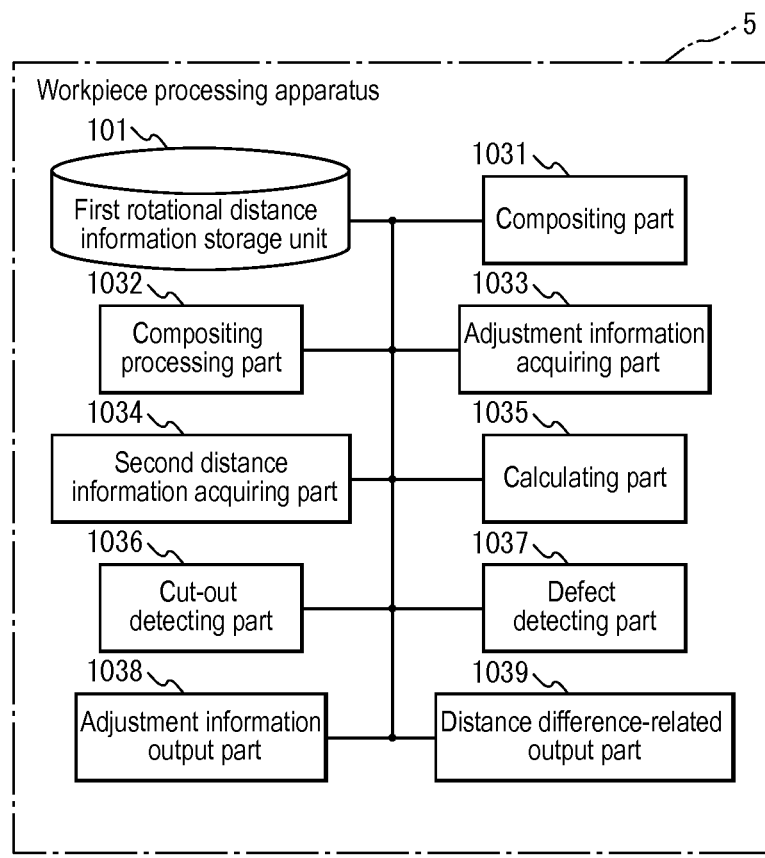
FIG. 25 is a block diagram showing another example of the workpiece processing apparatus in the Example.

In this application, as in a workpiece processing apparatus 5 shown in FIG. 25, the workpiece processing apparatus described in the foregoing example may be configured such that the constituent elements other than the first rotational distance information storage unit 101, the compositing part 1031, the compositing processing part 1032, the adjustment information acquiring part 1033, the second distance information acquiring part 1034, the calculating part 1035, the cut-out detecting part 1036, and the defect detecting part 1037 are omitted as appropriate, the workpiece processing apparatus further includes an adjustment information output part 1038 that outputs the adjustment information acquired by the adjustment information acquiring part 1033, and a distance difference-related output part 1039 that outputs the information regarding a difference between the first distance information and the second distance information acquired by the calculating part 1035 and the information regarding the defective portion detected by the defect detecting part 1037, and the second distance information acquiring part 1034 acquires second distance information using the adjustment information output by the adjustment information output part 1038.

The adjustment information output part 1038 outputs the adjustment information acquired by the adjustment information acquiring part 1033. The output is a concept that encompasses, for example, transmission to an external apparatus such as a workpiece aligner (not shown), delivery to an internal processing part or the like, accumulation in a storage medium, display on a monitor (not shown), and delivery of a processing result or the like to another processing apparatus or another program.

For example, the adjustment information output part 1038 is an interface that outputs the adjustment information acquired by the adjustment information acquiring part 1033 to the second distance information acquiring part 1034, or a part that causes the adjustment information to be temporarily stored in a storage medium such as a memory (not shown) that can be accessed by the second distance information acquiring part 1034. For example, the second distance information acquiring part 1034 accepts the adjustment information output by the adjustment information output part 1038, and acquires second distance information using the accepted adjustment information. Furthermore, for example, the second distance information acquiring part 1034 reads the adjustment information stored by the second distance information acquiring part 1034 in a storage medium, and acquires second distance information using the read adjustment information.

The distance difference-related output part 1039 outputs information regarding the distance difference information corresponding to the same rotational angle calculated by the calculating part 1035. The information regarding the difference may be, for example, information having the distance difference information itself, may be rotational angles associated with one or at least two pieces of distance difference information, or may be a combination of distance difference information and a rotational angle. For example, the output unit 104 may accumulate information having, in association with each other, the distance difference information and the rotational angle, in an unshown storage unit, or may output (e.g., display) a graph showing a relationship between the distance difference information and the rotational angle.

The information regarding the distance difference information is a concept that encompasses information acquired using the distance difference information. For example, the distance difference-related output part 1039 may output information indicating the cut-out portion of the workpiece 10 acquired by the cut-out detecting part 1036 using the distance difference information, as the information regarding the difference calculated by the calculating part 1035. If the information indicating the cut-out portion is output, the user, another apparatus, and the like can recognize the position of the cut-out portion present in the workpiece 10. The distance difference-related output part 1039 may output the information indicating the cut-out portion in the form of a graph showing a relationship between the distance difference information and the rotational angle, for example, such that the display mode of a portion corresponding to the rotational angle indicating the cut-out portion is made different from that of the other portions (e.g., the background color or pattern in the range corresponding to the rotational angle indicating the cut-out portion in the graph is made different from that of the other portions).

Furthermore, the distance difference-related output part 1039 may output the information regarding the defective portion acquired by the defect detecting part 1037 using the information regarding the distance difference information calculated by the calculating part 1035, as the information regarding the distance difference information calculated by the calculating part 1035. Since the information indicating the defective portion is information having the position (e.g., the rotational angle) of the defective portion and distance difference information at that position, the user, another apparatus, and the like can recognize the position and the size of the defective portion in the workpiece 10. If the information indicating the defective portion further has information indicating whether or not the defective portion projects toward the outer side of the wafer 10, it is also possible to recognize whether the defective portion is a portion with burrs or with chipping. The distance difference-related output part 1039 may output the information indicating the defective portion in the form of a graph showing a relationship between the distance difference information and the rotational angle, for example, such that the display mode of a portion corresponding to the rotational angle indicating the defective portion is made different from that of the other portions, as in the case of the cut-out portion.

The workpiece processing apparatus 5 can acquire and output, for example, a difference between the distance from the rotation center to the edge in the case where the workpiece has an ideal edge and the actual distance to the edge, and can precisely indicate a recess or a projection at the edge of the workpiece (e.g., a wafer). Thus, for example, with the output of the distance difference-related output part 1039, the position of the cut-out portion of the workpiece can be indicated as appropriate. Furthermore, if the defect information is acquired and output, appropriate information regarding a defect portion at the edge of the workpiece can be indicated. For example, the position and the type of defective portion can be indicated as appropriate.

The above-described workpiece processing apparatus 5 is, for example, a workpiece processing apparatus as follows. That is to say, the workpiece processing apparatus 5 is a workpiece processing apparatus, including: a first rotational distance information storage unit in which multiple pieces of first rotational distance information are stored, each of which is information having, in association with each other, a rotational angle, and first distance information regarding a distance from a rotation center to an edge of a workpiece corresponding to the rotational angle, in a case where the workpiece is rotated; a compositing part that composites multiple pieces of first distance information associated with rotational angles that are different from each other by 90 degrees, among the first distance information contained in the multiple pieces of first rotational distance information; a compositing processing part that detects multiple pieces of composite distance information that correspond to rotational angles that are successive and in which a change in sizes of the values is small, from among multiple pieces of composite distance information, each of which is information acquired by the compositing part compositing the pieces of first distance information, and acquires multiple pieces of first distance information before the compositing corresponding to at least one of the detected multiple pieces of composite distance information, and a rotational angle associated with at least one piece of first distance information before the compositing; an adjustment information acquiring part that acquires adjustment information for adjusting the rotation center of the workpiece to a center of the workpiece, using the multiple pieces of first distance information and the rotational angle acquired by the compositing processing part; an adjustment information output part that outputs the adjustment information acquired by the adjustment information acquiring part; a second distance information acquiring part that acquires, using the adjustment information output by the adjustment information output part, a relational equation expressing a relationship between a rotational angle, and second distance information regarding the distance to the edge of the workpiece corresponding to the rotational angle, in a case where the workpiece has a circular shape with no recess or projection at the edge, and acquires second distance information by substituting each of the multiple rotational angles corresponding to the multiple pieces of first rotational distance information for the acquired relational equation; a calculating part that acquires a difference between the first distance information and the second distance information associated with the same rotational angle, using the multiple pieces of first rotational distance information and the multiple pieces of second distance information acquired by the second distance information acquiring part; and a distance difference-related output part that outputs the information regarding the difference calculated by the calculating part.

Furthermore, the workpiece processing apparatus is such that the defect detecting part performs defect detection on the edge of the workpiece, using the difference between the first distance information and the second distance information calculated by the calculating part and at least one threshold value for a size of a defective portion, and acquires information regarding the detected defective portion.

Moreover, the workpiece processing apparatus 5 may be such that the second distance information acquiring part 1034, the calculating part 1035, the cut-out detecting part 1036, the defect detecting part 1037, and the distance difference-related output part 1039 are further omitted. The thus-obtained workpiece processing apparatus is, for example, an apparatus for acquiring adjustment information and the like of the workpiece.

With this configuration, information regarding the distance to the edge at a portion thereof with no recess or projection can be acquired from information in which fluctuation in the information regarding the distance to the edge, which occurs due to the rotation center being off the center of the wafer, has been cancelled by compositing pieces of information regarding the distance to the edge associated with rotational angles that are different from each other by 90 degrees, and adjustment information for adjusting the rotation center of the workpiece to the center of the workpiece can be acquired. Thus, this configuration is effective in that precise adjustment information can be acquired.

Accordingly, for example, an apparatus (not shown) for positioning a workpiece using the adjustment information can adjust the position of the workpiece as appropriate such that the rotation center of the workpiece is at the center of the workpiece.

The above-described workpiece processing apparatus is, for example, a workpiece processing apparatus as follows. That is to say, the workpiece processing apparatus is a workpiece processing apparatus, including: a first rotational distance information storage unit in which multiple pieces of first rotational distance information are stored, each of which is information having, in association with each other, a rotational angle, and first distance information regarding a distance from a rotation center to an edge of a workpiece corresponding to the rotational angle, in a case where the workpiece is rotated; a compositing part that composites multiple pieces of first distance information associated with rotational angles that are different from each other by 90 degrees, among the first distance information contained in the multiple pieces of first rotational distance information; a compositing processing part that detects multiple pieces of composite distance information that correspond to rotational angles that are successive and in which a change in sizes of the values is small, from among multiple pieces of composite distance information, each of which is information acquired by the compositing part compositing the pieces of first distance information, and acquires multiple pieces of first distance information before the compositing corresponding to at least one of the detected multiple pieces of composite distance information, and a rotational angle associated with at least one piece of first distance information before the compositing; an adjustment information acquiring part that acquires adjustment information for adjusting the rotation center of the workpiece to a center of the workpiece, using the multiple pieces of first distance information and the rotational angle acquired by the compositing processing part; and an adjustment information output part that outputs the adjustment information acquired by the adjustment information acquiring part.

Another Example

Another Example of the present invention is different from the Example in that a captured image of the defective portion at the edge of the workpiece is output.

Figure 17:
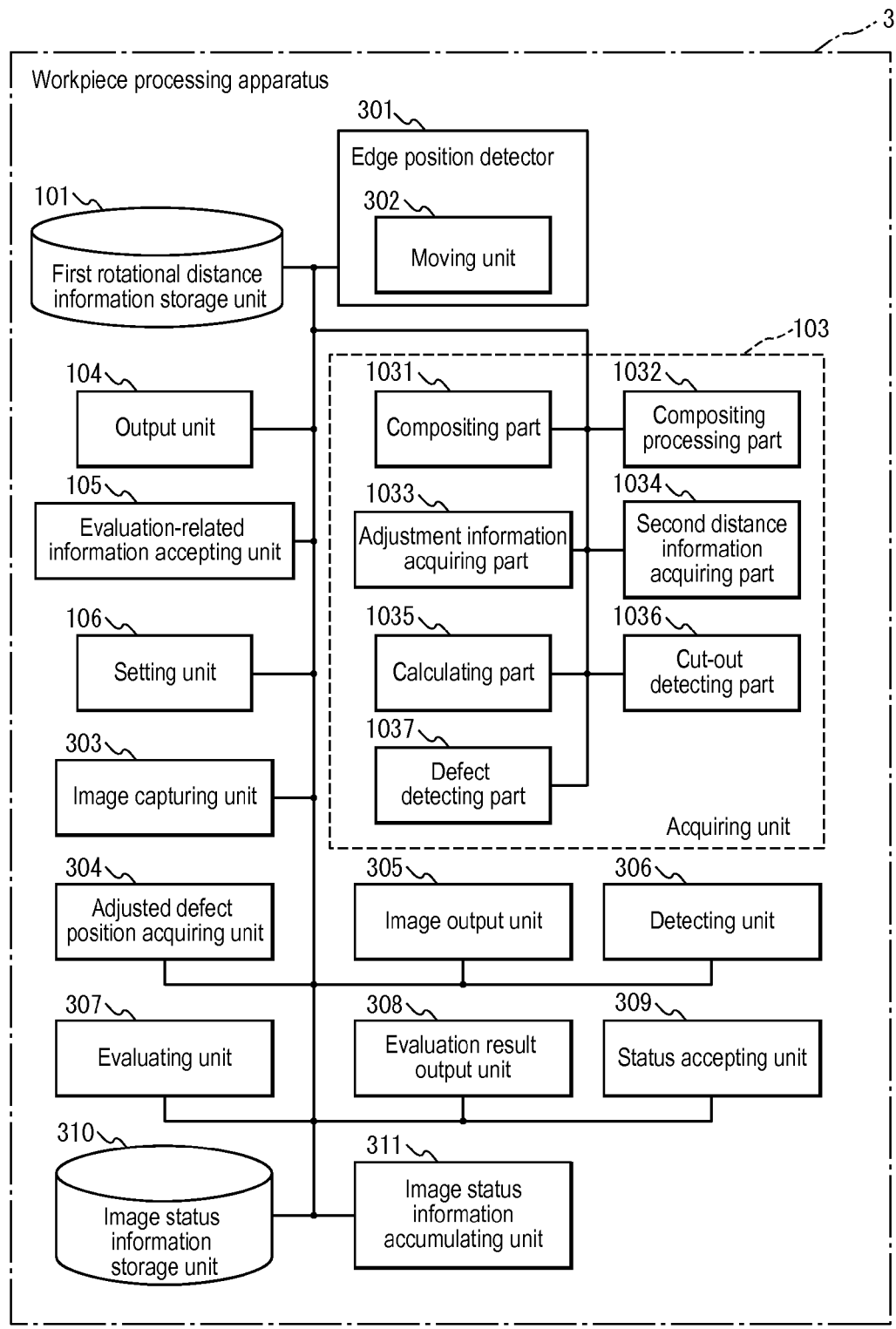
FIG. 17 is a block diagram of a workpiece processing apparatus in Another Example.

FIG. 17 is a block diagram of a workpiece processing apparatus 3 in this example.

The workpiece processing apparatus 3 includes the first rotational distance information storage unit 101, the acquiring unit 103, the output unit 104, the evaluation-related information accepting unit 105, the setting unit 106, the edge position detector 301, an image capturing unit 303, an adjusted defect position acquiring unit 304, an image output unit 305, a detecting unit 306, an evaluating unit 307, an evaluation result output unit 308, a status accepting unit 309, an image status information storage unit 310, and an image status information accumulating unit 311. The edge position detector 301 includes a moving unit 302.

For example, the acquiring unit 103 includes the compositing part 1031, the compositing processing part 1032, the adjustment information acquiring part 1033, the second distance information acquiring part 1034, the calculating part 1035, the cut-out detecting part 1036, and the defect detecting part 1037.

The configuration, the operation, and the like of the first rotational distance information storage unit 101, the acquiring unit 103, the output unit 104, the evaluation-related information accepting unit 105, the setting unit 106, and the compositing part 1031, the compositing processing part 1032, the adjustment information acquiring part 1033, the second distance information acquiring part 1034, the calculating part 1035, the cut-out detecting part 1036, and the defect detecting part 1037 forming the acquiring unit 103 are as in the Example, and, thus, a detailed description thereof has been omitted.

Figure 18A:
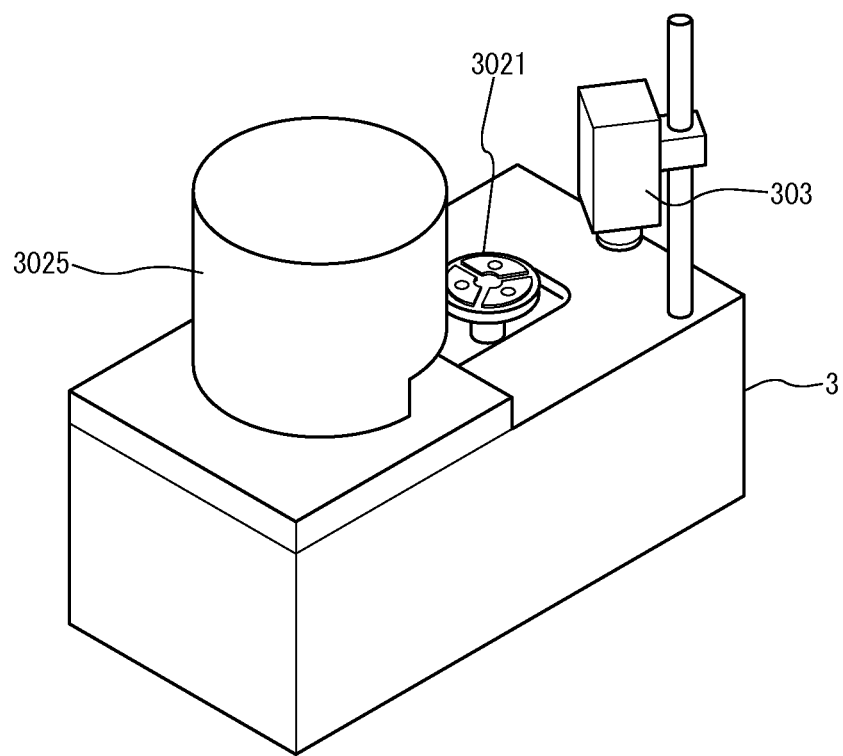
FIGS. 18A and 18B are a perspective view showing an example of the workpiece processing apparatus (FIG. 18A), and a schematic diagram showing an example of the edge position detector of the workpiece processing apparatus (FIG. 18B).
Figure 18B:
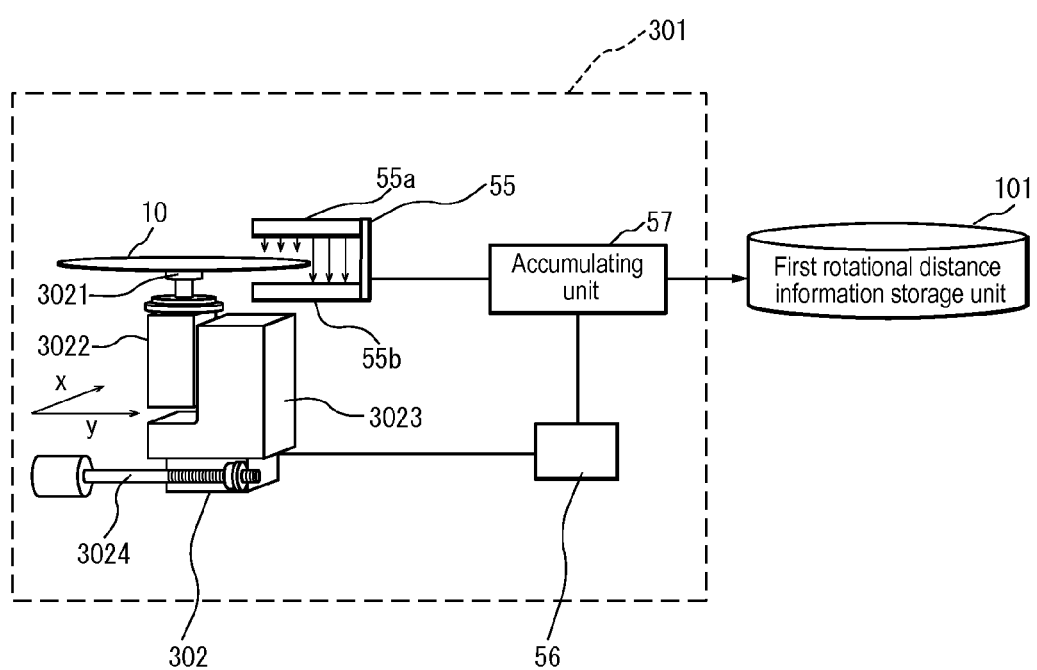

FIGS. 18A and 18B are a perspective view showing an example of the workpiece processing apparatus 3 in this example (FIG. 18A) and a schematic diagram showing an example of the edge position detector 301 in this example (FIG. 18B). The workpiece processing apparatus 3 includes a placement table 3021 on which the workpiece 10 is to be placed and the image capturing unit 303 for capturing an image of the defective portion at the edge of the workpiece 10 placed on the placement table 3021. The edge detecting unit 55 is provided under a cover 3025.

The edge position detector 301 acquires multiple pieces of first rotational distance information from the workpiece 10. Specifically, the edge position detector 301 acquires multiple pieces of first rotational distance information from the workpiece 10, by detecting the edge positions of the workpiece 10, and accumulates the acquired information in the first rotational distance information storage unit 101.

The edge position detector 301 includes, for example, the edge detecting unit 55 for detecting the edge position of the workpiece 10, the moving unit 302, the encoder 56, and the accumulating unit 57. The edge detecting unit 55 includes the projector 55a and the sensor 55b. The configuration, the processing, and the like of the edge detecting unit 55, the encoder 56, and the accumulating unit 57 are as in the edge position detector 102 shown in FIG. 3, and, thus, a description thereof has been omitted.

The moving unit 302 moves the workpiece 10. For example, the moving unit 302 moves the workpiece 10 placed on the placement table 3021. The moving the workpiece 10 by the moving unit 302 is, for example, causing movement that rotates the workpiece 10 or causing movement that moves the workpiece 10 in parallel. The moving the workpiece 10 in parallel is, for example, moving the workpiece 10 in a plane including the surface of the workpiece 10.

The moving unit 302 rotates the workpiece 10. For example, the moving unit 302 includes a rotation mechanism 3022 for causing rotation about the central shaft of the placement table 3021 as a rotational axis. For example, the rotation mechanism 3022 rotates the placement table 3021 such that its placement face is on the same plane, thereby rotating the workpiece 10 placed on the placement table 3021. The rotation mechanism 3022 has an electric motor (not shown) or the like for transmitting the rotation to the placement table 3021. The upper face of the placement table 3021 on which the workpiece 10 is to be placed is provided with, for example, a so-called suction base (not shown) or the like including a suction face for sucking the workpiece 10 placed thereon. For example, the encoder 56 detects the rotation amount of an electric motor (not shown) contained in the rotation mechanism 3022 corresponding to the rotational angle of the workpiece 10, and outputs a digital signal.

The edge position detector 301, for example, acquires a measured value indicating the position of the edge each time the moving unit 302 rotates the workpiece 10 by a predesignated rotational angle. Then, the rotational angle and the measured value are used to sequentially acquire pieces of first distance information and rotational angles. The measured value indicating the position of the edge is, for example, a measured value of the distance from the rotation center of the workpiece 10 to the edge, or the like. For example, if the first rotational distance information is acquired from multiple workpieces, the edge position detector 301 accumulates the multiple pieces of first rotational distance information acquired from each workpiece in association with a workpiece identifier of that workpiece in the first rotational distance information storage unit 101.

The moving unit 302 further has a structure for moving the workpiece 10 placed on the placement table 3021 in a direction parallel to the surface of the workpiece 10. The parallel direction is a concept that encompasses a substantially parallel direction. The direction parallel to the surface of the workpiece 10 may be considered as a direction parallel to the placement face of the placement table 3021 on which the workpiece 10 is to be placed. For example, the moving unit 302 horizontally moves the workpiece 10. For example, the moving unit 302 has a structure for moving the workpiece 10 in two orthogonal axial directions parallel to the surface of the workpiece 10. For example, the moving unit 302 moves the workpiece 10 in parallel by combining the movements in the two axial directions. In this example, the two axial directions are referred to as an x axis direction and a y axis direction for the sake of convenience. Specifically, the moving unit 302 includes an x-axis movement mechanism 3023 for moving the rotation mechanism 3022 in the x axis direction and a y-axis movement mechanism 3024 for moving the x-axis movement mechanism 3023 in the y axis direction. For example, each of the x-axis movement mechanism 3023 and the y-axis movement mechanism 3024 is configured by a combination or the like of a ball screw extendable in the x axis direction or the y axis direction and an electric motor. There is no limitation on the configuration and the like in which the moving unit 302 moves the workpiece 10 placed on the placement table 3021 in a direction parallel to the surface of the workpiece 10.

For example, the moving unit 302 moves the workpiece 10 such that the center of the workpiece 10 is positioned at the predesignated position, using information such as the adjustment information for positioning the workpiece 10 output by the output unit 104 described in the Example. For example, the moving unit 302 moves the workpiece 10 as described above by combining as appropriate movement that moves the placement table 3021 on which the workpiece 10 is placed in a direction parallel to the placement face of the placement table 3021 and movement that rotates the placement table 3021.

The moving unit 302 moves the workpiece 10, using the information regarding the defective portion at the edge of the workpiece 10 output by the output unit 104, such that the defective portion at the edge of the workpiece 10 is disposed within the image capture area. The image capture area is a predesignated area, specifically, an area from which an image can be captured by the image capturing unit 303. The image capture area may be considered as a range from which an image can be captured by the image capturing unit 303. The moving unit 302 preferably moves the workpiece 10 such that the defective portion at the edge of the workpiece 10 is positioned at a predesignated position (e.g., at the center) in the image capture area.

For example, the moving unit 302 moves the workpiece 10, using information indicating the position of the defective portion, which is information regarding the defective portion at the edge, for example, information indicating an angle of the defective portion with respect to the rotation center of the workpiece 10 or the like, such that the position of the defective portion is within the image capture area. The moving is a combination of at least one of the movement that rotates the workpiece 10 (hereinafter, referred to as rotational movement) and the movement that moves the workpiece 10 in parallel to the surface of the workpiece 10 (hereinafter, referred to as parallel movement).

Hereinafter, the processing in which the moving unit 302 moves the position of the defective portion into the image capture area will be described with reference to examples.
(1) The Case in which the Center of the Workpiece is Moved to a Predesignated Position For example, the moving unit 302 moves the workpiece 10 such that the center of the workpiece 10 is disposed at the predesignated position and such that the defective portion at the edge of the workpiece 10 is disposed within the image capture area. The predesignated position is, for example, the position at which the center of the workpiece 10 is to be disposed or the reference position for positioning the workpiece 10, and specific examples thereof include the position at which the center of the workpiece 10 is to be disposed when the workpiece 10 is passed to the workpiece transfer apparatus 2 or the like described in the Example. The workpiece 10 is, for example, placed on the placement table 3021 by the workpiece transfer apparatus 2 or the like in a state in which the rotation center of the placement table 3021 of the moving unit 302 is disposed at the predesignated position. For example, the moving unit 302 moves the workpiece 10 to the position as described above by combining as appropriate the rotational movement and the parallel movement.

For example, the moving unit 302 performs the above-described movement using the information for positioning the workpiece 10 and the information regarding the defective portion output by the output unit 104. For example, the moving unit 302 moves the workpiece 10 such that the center of the workpiece 10 is disposed at the predesignated position and such that the defective portion at the edge of the workpiece 10 is disposed within the image capture area, using the adjustment information for adjusting the rotation center of the workpiece 10 to the center of the workpiece 10 and the information of the rotational angle indicating the defective portion at the edge of the workpiece 10 (e.g., the information of the angle indicating the range of the defective portion) output by the output unit 104.

Figure 19A:
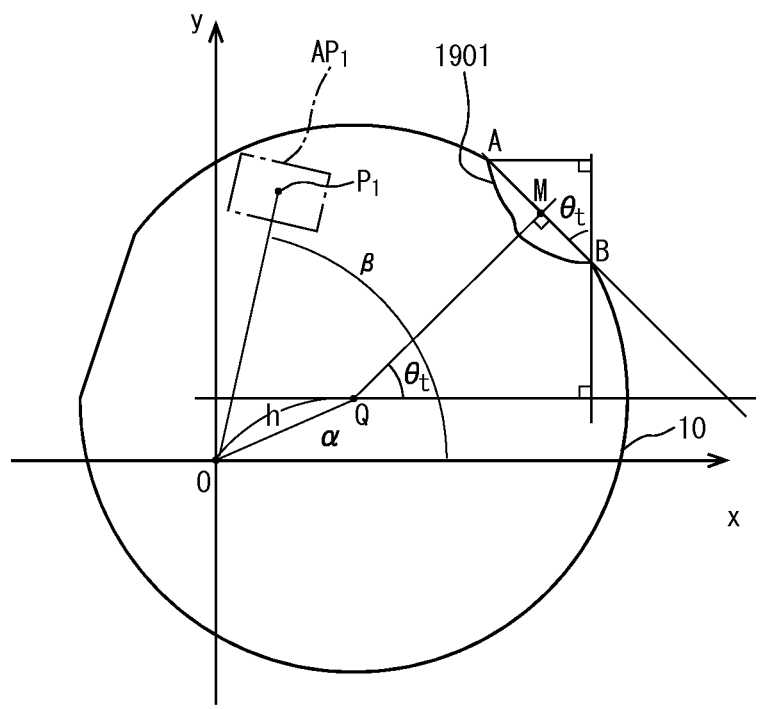
FIGS. 19A and 19B are a diagram before rotation (FIG. 19A) and a diagram after rotation (FIG. 19B), illustrating processing in which the workpiece processing apparatus moves a defective portion into an image capture area.
Figure 19B:
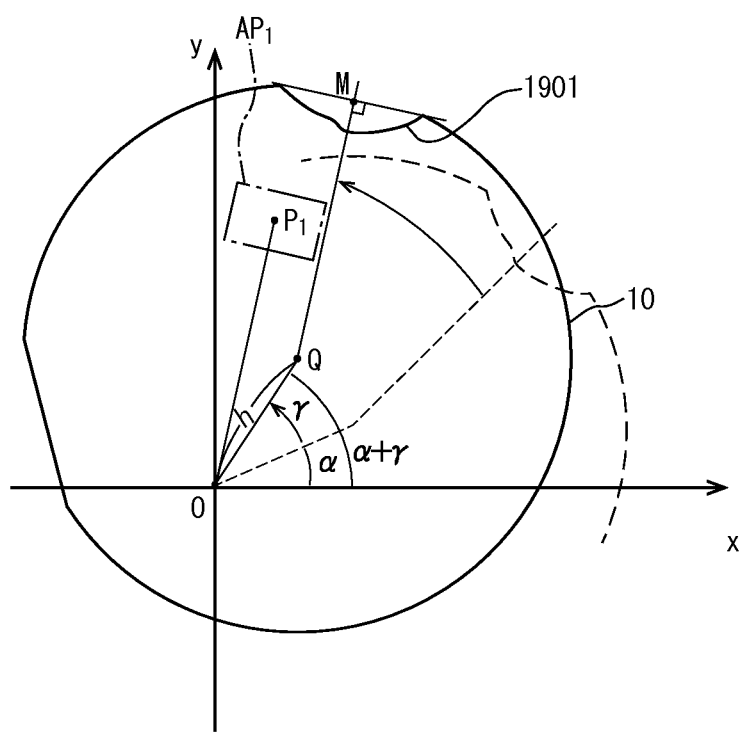

FIGS. 19A and 19B are a diagram showing the state before rotation of the workpiece 10 (FIG. 19A) and a diagram after the rotation (FIG. 19B), illustrating an example of processing for moving the defective portion of the workpiece 10 into the image capture area. In the diagrams, the same reference numerals as in FIGS. 2A and 2B denote the same or corresponding constituent elements.

In the diagrams, the xy coordinates represent a coordinate system set in advance with respect to the edge position detector 301 of the workpiece processing apparatus 3, where an origin O is the position at which the center of the workpiece 10 is to be disposed. It is assumed that the rotation center of the placement table 3021 on which the workpiece 10 is to be placed is, for example, the position that matches the origin O when the workpiece 10 is placed. When the workpiece 10 is placed, the center Q of the workpiece 10 is not positioned at the origin O, and the workpiece 10 rotates about the origin O as the rotation center. It is assumed that the center of the workpiece 10 is at the position off the origin in the direction of an angle α by a distance h.

A point $P_1$ is one point (e.g., the center point) within an image capture area $AP_1$, and is set to the position off the origin O in a predesignated rotational angle by the same distance as the radius of the workpiece 10. Accordingly, if the center of the workpiece 10 is placed on the origin O, the point $P_1$ is positioned at the edge of the workpiece 10.

In FIGS. 19A and 19B, it is assumed that the position of the line segment connecting an intersection of the edge of the workpiece 10 and the x axis in the positive range of the x axis, and the rotation center O of the workpiece 10 corresponding to the origin is the position with a rotational angle of 0°, and the rotational angle increases counterclockwise.

Hereinafter, a specific example will be described with reference to FIGS. 19A and 19B. In the state shown in FIG. 19A, the moving unit 302 acquires an angle $\theta_t$ formed by a line (the y axis, in this example) orthogonal to a reference line (the x axis, in this example) of the angle α for adjusting the rotation center of the workpiece 10 to the center of the workpiece 10, indicated by the adjustment information described in the Example, and a line connecting both ends of one defective portion 1901 that is to be moved into the image capture area. The angle $\theta_t$ may be considered as a displacement angle. For example, the coordinates and the like of both ends A and B of the defective portion 1901 can be calculated using the information indicating the radius of the workpiece 10 and the like stored in advance in an unshown storage unit or the like and the rotational angles of both ends A and B of the defective portion 1901, and, thus, the angle $\theta_t$ can be calculated using the coordinates and the like of both ends A and B. The angle $\theta_t$ corresponds to an angle formed by a line QM on which a midpoint M of the line segment connecting both ends A and B of the defective portion 1901 is connected to the center of the workpiece 10, and the above-indicated reference line (e.g., the x axis).

Next, if the line QM on which the midpoint M of the line segment connecting both ends of the defective portion 1901 is connected to the center of the workpiece 10 is parallel to a line segment $OP_1$, then, the line QM on which the midpoint M of the line segment connecting both ends of the defective portion 1901 is connected to the center of the workpiece 10 can be set on the line segment $OP_1$, by moving the workpiece 10 in the horizontal direction, for example, in the x axis direction and the y axis direction. Accordingly, a rotational angle γ for rotating the workpiece 10 about the origin O as the rotation center such that the line QM on which the midpoint M of the line segment connecting both ends of the defective portion 1901 is connected to the center of the workpiece 10 is parallel to the line segment $OP_1$ is calculated. The rotational angle γ is, for example, $\beta - \theta_t$, if an angle formed by the straight line $OP_1$ on which the center point $P_1$ of the image capture area is connected to the origin O, and the above-indicated reference line (e.g., the x axis) is taken as β.

If the workpiece 10 is rotated about the origin O by the rotational angle γ, the line QM on which the midpoint M of the line segment connecting both ends of the defective portion 1901 is connected to the center of the workpiece 10 is parallel to the line segment $OP_1$, as shown in FIG. 19B.

In this case, since the workpiece 10 has been rotated by γ, the center Q of the workpiece 10 is at the position off the origin O by the distance h in the direction of an angle α+γ. Accordingly, if the workpiece 10 is moved such that the center Q of the workpiece 10 is on the origin O (i.e., if the workpiece 10 is moved by the distance h in the direction opposite from that of the angle α+γ), the line segment QM moves in parallel such that the center Q is on the origin O, and is on the line segment $OP_1$, and the midpoint M of the defective portion 1901 is disposed within the image capture area $AP_1$. Moreover, in this example, the midpoint M of the defective portion 1901 is positioned on the straight line connecting the center point $P_1$ of the image capture area $AP_1$ and the origin O at which the center of the workpiece 10 is to be disposed.

Accordingly, as described above, for each defective portion whose image is to be captured, the angle $\theta_t$ formed by the midpoint of the line segment connecting both ends of the defective portion with respect to the line orthogonal to the angle reference line is calculated using the information indicating the defective portion and the information indicating the position of the image capture area $AP_1$ (e.g., the information indicating the center point $P_1$, etc.). The angle $\theta_t$ is used to calculate the rotational angle γ for causing rotation about the rotation center of the workpiece 10. Further, the angle α indicating the movement direction for causing movement about the rotation center of the workpiece 10 indicated by the adjustment information is used to calculate the angle α+γ indicating the movement direction for moving the center of the workpiece 10 that has been rotated by the angle γ, to the predesignated position. In the case of capturing an image of each defective portion, that defective portion in an initial state in which the workpiece 10 is placed on the placement table 3021 is rotated by the rotational angle γ, and is then horizontally moved by the movement amount h indicated by the adjustment information in the direction opposite from that of the angle α+γ.

Accordingly, the center of the workpiece 10 is disposed at the predesignated position, and the defective portion 1901 is disposed within the image capture area $AP_1$.

Furthermore, since an image of the defective portion can be captured in the state where the center of the workpiece 10 is positioned at the predesignated position, for example, in the case of circular workpieces 10, the edges of the workpieces 10 in the captured images can be arranged substantially at the same position, so that multiple images that can be easily seen in comparison or the like and are highly convenient can be provided.

There is no limitation on the order and the like of the above-described rotational movement and horizontal movement.

Furthermore, the calculating equations and the like used above are merely an example, and, in the present invention, other calculating equations and the like may be used, as long as substantially the same values can be obtained. Furthermore, the angles and the like used above may be changed as appropriate according to the settings and the like of the rotational direction of the workpiece 10, the position of 0°, or the reference line, as long as substantially the same values can be obtained.

Furthermore, the straight lines or the line segments such as the predesignated x axis do not necessarily have to be those used as a reference of the rotational angle α indicating the direction for moving the rotation center of the workpiece 10 to the center of the workpiece 10. In that case, for example, the movement direction, the movement distance, or the rotational angle acquired for moving the workpiece 10 may be adjusted as appropriate according to a difference such as an inclination angle between the reference straight line of the rotational angle α and the straight lines or the line segments such as the predesignated x axis. Furthermore, the predesignated position at which the center of the workpiece 10 is to be disposed does not have to be the position at which the rotation center of the workpiece 10 is positioned when the workpiece is placed on the moving unit 302. Also in that case, the movement direction, the movement distance, or the rotational angle acquired for moving the workpiece 10 may be adjusted as appropriate according to the positional relationship between the position at which the rotation center is positioned when the workpiece is placed and the predesignated position at which the workpiece 10 is to be placed.

Furthermore, in the above-described processing, the movement direction was indicated mainly based on an angle or the like, but the coordinates and the like acquired from an angle and a movement amount and the like may be used instead of the angle.

Furthermore, the above-described processing is merely an example, and, in the present invention, other methods may be used, as long as substantially the same rotational angle γ, movement direction of the rotation center, and the like can be obtained.

(2) The Case in which the Workpiece is not Horizontally Moved

For example, the moving unit 302 may move the defective portion into the image capture area, only by rotationally moving the workpiece 10 placed on the placement table 3021 for acquiring the first rotational distance information. Specifically, the moving unit 302 can arrange the defective portion as appropriate within the image capture area, by rotating the workpiece 10 according to the rotational angle indicating the position of the defective portion output by the output unit 104. For example, an average angle of the angles indicating the positions of both ends of the defective portion is calculated, and the workpiece 10 is rotated such that this angle matches the angle indicating the direction of the center point of the image capture area using, as a reference, the rotation center and the predesignated reference line, so that the workpiece 10 can be moved such that the center of the defective portion is positioned substantially at the center of the image capture area.

(3) The Case in which the Center of the Workpiece is Caused to Match the Rotational Axis of the Placement Table for Rotating the Workpiece For example, the moving unit 302 includes a lifting part (not shown) or the like for lifting the workpiece 10 from the placement table 3021, horizontally moving the workpiece 10, and again placing it on the placement table 3021, wherein the lifting part lifts the workpiece 10 from the placement table 3021 using the adjustment information output by the output unit 104, moves the workpiece 10 such that the center of the workpiece 10 is on the rotation center of the placement table 3021 for rotating the workpiece 10, using the adjustment information output by the output unit 104, and places the workpiece 10 on the placement table 3021. In this state, as described above, the angle $\theta_t$ indicating the position of the defective portion acquired from the defective portion may be used to rotate the defective portion by the rotational angle γ, thereby moving the defective portion into the image capture area.

Note that parts other than the above-described lifting part may be used, as long as the position of the workpiece 10 can be moved on the placement table 3021.

Hereinafter, a case will be described, as an example, in which the moving unit 302 moves the workpiece 10 using the processing (1) in this example.

If there are multiple defective portions at the edge of one workpiece 10, the moving unit 302 may sequentially move the defective portions into the image capture area. For example, each time an image of the defective portion that has been moved into the image capture area has been captured by the image capturing unit 303, the moving unit 302 moves a next defective portion into the image capture area.

Furthermore, the moving unit 302 may move multiple defective portions positioned close to each other, among the multiple defective portions present at the edge of one workpiece 10, collectively into the same image capture area. The defective portions positioned close to each other are, for example, defective portions positioned within a predesignated range, and specific examples include defective portions whose rotational angles indicating the positions of the defective portions are within a predesignated range. The predesignated range is, for example, a range that is not greater than the range that can be accommodated at a time in the image capture area at the edge of the workpiece 10. For example, the moving unit 302 may move the workpiece 10 such that the position at the midpoint between the positions of the defective portions at both ends, among the multiple defective portions positioned close to each other at the edge, is positioned at center in the image capture area. In this case, the multiple defective portions positioned close to each other may be considered as one defective portion, and rotational angles indicating the positions of both ends thereof and the like may be used to move the multiple defective portions positioned close to each other into the image capture area. This processing may be considered as processing in which defective portions positioned close to each other are grouped and moved.

The moving unit 302 may move only one or more defective portions detected by the detecting unit 306, among the defective portions at the edge of the workpiece 10, into the image capture area. The defective portions detected by the detecting unit 306 are one or more defective portions having the size larger than that of the other defective portions at the edge of the workpiece 10. The processing and the like of the detecting unit 306 will be described later.

If capturing of images of one or more defective portions of one workpiece 10 is ended, the moving unit 302 may move the workpiece 10 such that the center of the workpiece 10 is disposed at the predesignated position as described above and such that the orientation of the workpiece 10 is the predesignated orientation, for example, in order to deliver the workpiece 10 after the positioning to the workpiece transfer apparatus 2 or the like in the subsequent steps, using the information for positioning the workpiece 10, the information for specifying the orientation of the workpiece 10, and the like output by the output unit 104.

Furthermore, if there is no defective portion in one workpiece 10, the moving unit 302 may not perform the above-described process that moves the defective portion into the image capture area. For example, it is also possible not to perform the process that moves the defective portion into the image capture area, if the information regarding the defective portion output by the output unit 104 indicates that there is no defective portion in the workpiece 10.

Note that the moving unit 302 may perform as appropriate other operations and the like similar to those of the turntable 52, the turntable rotation mechanism 53, the electric motor 54, and the like described in the Example.

The moving unit 302 may have the configuration of an MPU, a memory, or the like for calculating the information such as the movement distance or the rotational angle. Typically, the processing procedure and the like for calculating the information such as the movement distance or the rotational angle is realized by software, and the software is stored in a storage medium such as a ROM. Note that the processing procedure may be realized also by hardware (a dedicated circuit).

Although this example shows a case in which the moving unit 302 forms part of the edge position detector 301, the moving unit 302 may be considered as not being part of the edge position detector 301.

The image capturing unit 303 captures an image of the defective portion at the edge of the workpiece disposed within the image capture area. The capturing an image of the defective portion is, for example, capturing an image within the image capture area in which the defective portion is disposed. The image capturing unit 303 is a camera including an image sensor such as a CCD or a CMOS. The image capturing unit 303 is disposed such that, for example, its image capture area includes part of the edge of the workpiece 10 and the vicinity thereof in a state where the center of the workpiece 10 is disposed at the predesignated position. The image capturing unit 303 is installed typically such that its optical axis is orthogonal to the surface of the workpiece 10. The position at which the image capturing unit 303 is installed is preferably movable in the horizontal direction such that the image capture area can be changed according to the size of the workpiece 10. The image capturing unit 303 is attached, for example, to the workpiece processing apparatus 3 using a jig or the like. In this case, the position of the image capturing unit 303 is prevented from moving even when the moving unit 302 moves the workpiece 10.

The image capturing unit 303 typically has an optical system for forming an image of light from a target object on a light-receiving face of the image sensor. Furthermore, the image capturing unit 303 may include an illumination device such as a ring illumination for illuminating the image capture area and the vicinity thereof. The image capturing unit 303 preferably can capture a high-resolution image of the defective portion. Examples of the image capturing unit 303 include a CCD camera having a field of view of 3 mm square and a number of pixels of 350000. Note that examples of the image capturing unit 303 may further include a digital camera for consumer product. The image captured by the image capturing unit 303 may be a color image or may be a grey scale image. There is no limitation on the color depth and the like of the image. The image captured by the image capturing unit 303 is typically a still image, but may be a moving image. The image capturing unit 303 may capture an image with fixed focus, or may capture an image with autofocus. There is no limitation on the data format or the like of the image acquired by the image capturing unit 303. The image capturing unit 303 may be a so-called scanner or the like for capturing an image by performing scan with a line sensor.

The image capturing unit 303 captures an image of the defective portion, for example, if the moving unit 302 has moved one defective portion, or one group of defective portions positioned close to each other, into the image capture area. The image capture may be performed according to an instruction from the user or the like accepted by an unshown accepting unit or the like.

The image capturing unit 303 may capture images of only the defective portions detected by the detecting unit 306 (described later), among the defective portions at the edge of the workpiece 10. Accordingly, only image of one or more defective portions having the size larger than that of the other defective portions can be selectively captured from among the multiple defective portions at the edge of the workpiece 10.

The workpiece processing apparatus 3 may include multiple image capturing units 303, for example, may include multiple image capturing units 303 having different image capture areas or having partially overlapping image capture areas. The multiple image capturing units 303 are, for example, multiple image capturing units arranged along the edge of the workpiece whose center is disposed at the predesignated position. For example, the multiple image capturing units 303 may simultaneously perform image capture and the like substantially as in the case of one image capturing unit. Accordingly, images of a group of multiple defective portions positioned in a wide range can be simultaneously captured, and the time required to capture images and to cause movement for image capture can be shortened.

The adjusted defect position acquiring unit 304 acquires adjusted defect position information, which is information indicating the position of the defective portion of the workpiece 10, using the center of the workpiece 10 and the orientation specified for the workpiece as a reference, using the information for positioning the workpiece 10, the information for specifying the orientation of the workpiece 10, and the information regarding the defective portion at the edge of the workpiece 10, which are output by the output unit 104. The information for specifying the orientation of the workpiece 10 is, for example, information indicating the position of a cut-out portion such as an orientation flat face of the workpiece 10. The information indicating the position of the cut-out portion is, for example, information indicating the position of the midpoint of the line segment connecting both ends of the cut-out portion. The information indicating the position of the cut-out portion may be a rotational angle corresponding to the line segment on which the midpoint of the line segment connecting both ends of the cut-out portion is connected to the center of the workpiece 10. The adjusted defect position information is, for example, information expressing the position of the defective portion at the edge of the workpiece 10 using, as a reference, the position specified by the center of the workpiece 10 and the position of the cut-out portion. Specifically, the adjusted defect position information is an angle formed by the line segment on which the point indicating the position of the cut-out portion is connected to the center of the workpiece 10, and the line on which the point indicating the defective portion at the edge of the workpiece 10 is connected to the center of the workpiece 10. The point indicating the position of the cut-out portion is, for example, the midpoint of the line segment connecting both ends of the cut-out portion. The point indicating the position of the defective portion is, for example, the midpoint of the line segment connecting both ends of the defective portion.

Using the center of the workpiece 10 and the orientation specified for the workpiece as a reference may be setting the specified orientation at the position corresponding to the reference of the rotational angle, for example, 0°, or at desired rotational angle other than 0°, or may be setting the orientation specified according to this orientation as a reference of the rotational angle or the like.

As described above with reference to FIGS. 19A and 19B, the angle formed by the line segment on which the midpoint between both ends of the defective portion is connected to the center of the workpiece 10, and the straight line (e.g., the y axis in FIGS. 19A and 19B, etc.) orthogonal to the predesignated straight line is the same as the angle formed by the straight line connecting both ends of the defective portion and the predesignated straight line (e.g., the x axis in FIGS. 19A and 19B), and this angle can be acquired from the information indicating the positions of both ends of the defective portion. Accordingly, if this angle is acquired for each defective portion, the rotational angle of the midpoint between both ends of the defective portion in the case where the center of the workpiece 10 is taken as the rotation center can be calculated. A similar rotational angle of the cut-out portion also can be calculated using the information of the positions of both ends of the cut-out portion output by the output unit 104 or the like. Then, adjusted defect position information, which is a rotational angle of each defective portion, using the line connecting the cut-out portion and the center of the workpiece 10 as a reference can be acquired by subtracting the rotational angle of the cut-out portion from the thus-calculated rotational angle of each defective portion.

The adjusted defect position acquiring unit 304 may use as appropriate, for example, the information of the rotational angle of the straight line connecting the midpoint of the defective portion and the center of the workpiece 10, calculated in the case where the moving unit 302 moves the workpiece 10, for acquiring the adjusted defect position information. The acquiring the adjusted defect position information directly using the information for positioning the workpiece 10, the information for specifying the orientation of the workpiece 10, and the information regarding the defective portion at the edge of the workpiece 10, which are output by the output unit 104, and the acquiring the adjusted defect position information using the information acquired by the moving unit 302 or the like using these pieces of information are in this example considered as the acquiring the adjusted defect position information using the information for positioning the workpiece 10, the information for specifying the orientation of the workpiece 10, and the information regarding the defective portion at the edge of the workpiece 10, which are output by the output unit 104.

The image output unit 305 outputs the image captured by the image capturing unit 303. The output is a concept that encompasses, for example, display on a monitor screen, projection using a projector, printing in a printer, transmission to an external apparatus, accumulation in a storage medium, and delivery of a processing result to another processing apparatus or another program.

For example, the image output unit 305 outputs the image captured by the image capturing unit 303 in association with at least one of the identifier of the workpiece 10 corresponding to the image and the identifier of the defective portion. The identifier of the workpiece 10 may be code or the like allocated to each workpiece 10, may be a combination of an identifier (e.g., code, etc.) indicating the lot of a workpiece group consisting of multiple workpieces including the workpiece targeted for the image capture, and information indicating the order (e.g., information indicating the arrangement order) of the workpiece targeted for the image capture within that lot. The identifier of the defective portion may be code such as the number allocated to the defective portion. The identifier of the workpiece 10 corresponding to the image is an identifier of the workpiece 10 targeted for the image capture. Furthermore, the identifier of the defective portion corresponding to the image is an identifier of at least one defective portion targeted for the image capture. The image output unit 305 may further output, in association with the image, the adjusted defect position information acquired by the adjusted defect position acquiring unit 304 for the defective portion targeted for the image capture.

In the case of displaying an image, the image output unit 305 preferably can enlarge and reduce an image displayed and move the display range, for example, according to an instruction from the user or the like accepted by an unshown accepting unit or the like. In the case where an image can be enlarged in this manner, if the image captured by the image capturing unit 303 has a high resolution, the defective portion at the edge can be enlarged in the display, and, for example, the shape of the defective portion at the edge, that is seldom visible to the naked eye, can be easily seen.

Furthermore, in the case of displaying an image, information indicating the scale size of the image (e.g., a scale, graduations, etc.) may be displayed so as to be superimposed on the image. Accordingly, the size of the defective portion can be easily seen. Furthermore, the position or the like at which the information indicating the scale size of the image is displayed may be changed according to an instruction from the user. The scale, the graduations, and the like may be calculated as appropriate according to the resolution of the image capturing unit 303, the distance from the image capturing unit 303 to the workpiece 10, and the like, or a predesignated scale, graduations and the like may be acquired from an unshown storage unit or the like according to the resolution or the distance. For example, the distance from the image capturing unit 303 to the workpiece 10 may be acquired using a ranging sensor (not shown).

The image output unit 305 may be considered to include or not to include an output device such as a display screen, a printer, a communication part, or an accumulating part, and the like. The image output unit 305 may be realized, for example, by driver software for an output device, a combination of driver software for an output device and the output device, or the like.

The detecting unit 306 detects one or more defective portions having a large size, from among the defective portions at the edge of the workpiece 10, using the information regarding the defective portions at the edge of the workpiece 10 output by the output unit 104. The one or more defective portions having a large size may be considered as defective portions having a large size large enough to satisfy a predesignated size condition.

For example, the detecting unit 306 detects one or more defective portions, using the information indicating the rotational angle range of the defective portions, which is information regarding the defective portions output by the output unit 104. For example, the detecting unit 306 detects a defective portion in which the rotational angle range is at least a predesignated threshold value for the rotational angle range, as the one or more defective portions having a large size. Furthermore, as the one or more defective portions having a large size, a predesignated number of defective portions may be detected in descending order of the rotational angle range, from among defective portions of one workpiece 10.

Furthermore, for example, the detecting unit 306 detects one or more defective portions, using the information regarding the distance difference information, which is information regarding the defective portion output by the output unit 104. For example, the detecting unit 306 detects a defective portion in which the largest value of the distance difference information associated in advance with the defective portion is at least a threshold value, as the one or more defective portions having a large size. Furthermore, as the one or more defective portions having a large size, a predesignated number of defective portions may be detected in descending order of the value of the associated distance difference information, from among defective portions of one workpiece 10. The distance difference information associated with the defective portion may be considered as the information indicating the depth or the height of the defective portion.

Furthermore, the detecting unit 306 may detect the one or more defective portions having a large size, according to a combination of the information indicating the rotational angle range and the information regarding the distance difference information. For example, a defective portion in which the rotational angle range is at least a threshold value and the value of the distance difference information is at least a threshold value may be detected. Furthermore, a defective portion in which both of the order in the size of the rotational angle range and the order in the size of the distance difference information are within a given order.

Note that the detecting unit 306 may detects a defective portion that satisfies a condition other than the above, as the one or more defective portions having a large size.

Using the image output by the image output unit 305, the evaluating unit 307 evaluates the defective portion shown in the image. The evaluating the defective portion is, for example, evaluating an influence of the defective portion exerted on the workpiece 10. For example, the evaluating the defective portion is evaluating, in the case where the workpiece 10 that has been detected to be defective is used in the subsequent steps, whether or not that defective portion has an influence on the workpiece 10, or what type of influence is exerted. For example, the evaluating the defective portion may be evaluating whether or not the defective portion is likely to cause damage such as a crack in the subsequent steps or the like in the workpiece 10 having that defective portion. The evaluating the defective portion may be evaluating whether or not the workpiece 10 has an abnormality.

For example, the evaluating unit 307 evaluates the defective portion shown in the image by pattern matching. For example, one or more pieces of evaluation pattern management information are stored in advance in an unshown storage unit or the like, each of which is information having, in association with each other, an image pattern and an evaluation result on the defective portion. It is judged whether or not the image output by the image output unit 305 matches the image pattern contained in each piece of evaluation pattern management information, and, if matches, the evaluation result associated with that image pattern is acquired. The image pattern is, for example, information on a feature of the image. The feature of the image is, for example, information indicating the number of corners of the defective portion, the positions of the corners, the width and the depth of the defective portion, or the like. The image having a feature judged as matching the feature shown in the image pattern is judged as an image matching the image pattern. The evaluating unit 307 may perform image processing such as binarization on the image output by the image output unit 305, before performing the pattern matching.

The processing of the pattern matching performed on the image is a known art, and, thus, a detailed description thereof has been omitted.

Furthermore, the evaluating unit 307 may evaluate the defective portion shown in the image, for example, by performing similar search on the images. For example, one or more pieces of evaluation image management information are stored in advance in an unshown storage unit or the like, each of which is information having, in association with each other, an image for evaluation and an evaluation result on the defective portion. The similarity between the image output by the image output unit 305 and each image for evaluation is acquired, and, if the similarity is at least a predesignated threshold value, the evaluating unit 307 acquires the evaluation result associated with that image for evaluation. The image for evaluation is, for example, one or more images captured by the image capturing unit 303. The image for evaluation may be a color image, may be a grey scale image, or may be a binarized image. The similarity between images may be, for example, comparison between averages of pixel values forming the images, may be comparison between histograms of the pixel values, or amplitudes at each frequency calculated from the images, or may be a ratio of pixels that match between the binarized images, or the like.

Furthermore, the evaluating unit 307 may use other known similar image search such as similar image search using mean square error, as the similar search on the images.

The similar search on the images, the processing for acquiring an similarity between images, and the like are known arts, and, thus, a detailed description thereof has been omitted.

The evaluation result may be any information, for example, as long as it is information indicating an evaluation result related to the defective portion, and examples thereof may include information indicating whether or not the defective portion is likely to cause damage in the workpiece 10, and information indicating the proportion range of damage that occurs (e.g., 50% or more, etc.). The examples may further include information indicating the type of abnormality that occurs, and information indicating that the workpiece 10 will be damaged. The examples may further include a combination of two or more of these pieces of information.

The evaluating unit 307 may evaluate the defective portion shown in the image output by the image output unit 305, using image status information stored in the image status information storage unit 310, which will be described later. For example, the defective portion may be evaluated using information regarding the image of the defective portion captured by the image capturing unit 303 contained in the image status information, and workpiece status information on the workpiece 10 shown in the image contained in the image status information. The workpiece status information will be described later. The information regarding the image of the defective portion contained in the image status information may be an image of the defective portion itself, or may be information on a feature acquired from the image of the defective portion.

For example, if the information regarding the image of the defective portion is an image of the defective portion, the evaluating unit 307 performs the above-described similar search on the image output by the image output unit 305, using the images contained in the image status information, and acquires, as the evaluation result, the workpiece status information associated with the image judged as being similar from the image status information. In this case, the image status information may be considered as the above-described evaluation image management information.

For example, if the information regarding the image of the defective portion is information on the feature of the image of the defective portion, the evaluating unit 307 performs the above-described pattern matching on the image output by the image output unit 305, using the information on the feature of the image contained in the image status information, and acquires, as the evaluation result, the workpiece status information associated with the information on the feature judged as being matching from the image status information. In this case, the image status may be considered as the above-described evaluation pattern management information.

Note that the evaluating unit 307 may perform machine learning using the image status information stored in the image status information storage unit 310 (described later), and evaluate the image output by the image output unit 305 using a result of the machine learning. For example, it is possible to learn one or at least two pairs of a feature of an image contained in the image status information and workpiece status information for the defective portion shown in the image, and, using the learning result, acquire the workpiece status information corresponding to the feature acquired from the image output by the image output unit 305, as the evaluation result. The configuration and the processing of the machine learning are as in the Example, and, thus, a detailed description thereof has been omitted.

The evaluation result output unit 308 outputs the evaluation result acquired by the evaluating unit 307. For example, the evaluation result output unit 308 may output the evaluation result in association with an identifier of the workpiece associated with the image from which the evaluation result was obtained, an identifier of the defective portion, or the adjusted defect position information.

The output is a concept that encompasses, for example, display on a monitor screen, projection using a projector, printing in a printer, transmission to an external apparatus, accumulation in a storage medium, and delivery of a processing result to another processing apparatus or another program.

The evaluation result output unit 308 may be considered to include or not to include an output device such as a display screen, a printer, a communication part, or an accumulating part, and the like. The image output unit 305 may be realized, for example, by driver software for an output device, a combination of driver software for an output device and the output device, or the like.

The status accepting unit 309 accepts workpiece status information on the workpiece 10 from which the image capturing unit 303 captured the image of the defective portion, which is information indicating a status after performing one or at least two sets of predesignated processing on the workpiece 10, the status being a status after capturing the image of the defective portion. For example, the status accepting unit 309 accepts the workpiece status information from the user or the like.

The predesignated processing is, for example, a process performed on the workpiece 10. The predesignated processing is, for example, one or more processes of the semiconductor manufacture process if the workpiece 10 is a semiconductor wafer.

The status of the workpiece 10 may be considered as a state of the workpiece 10, and examples thereof include whether or not an abnormality such as damage has occurred in the workpiece 10, and what type of abnormality has occurred. The type of abnormality is, for example, the type of damage such as a crack or a flaw if the abnormality is damage. The status of the workpiece 10 may be the status of the workpiece 10 resulting from one defective portion present in the workpiece 10. The status of the workpiece 10 resulting from one defective portion present in the workpiece 10 is, for example, that there is a flaw from one defective portion in the workpiece 10, at the position corresponding to that defective portion.

The workpiece status information is information indicating the status of the workpiece 10. The workpiece status information is, for example, information indicating whether or not the workpiece 10 was proper also in processing after the image capture. Alternatively, this information may be information indicating the type of abnormality that occurred in the workpiece 10 in processing after the image capture. Furthermore, the workpiece status information may be a value, an indicator, or the like for evaluating the workpiece 10 on which the processing after the image capture has ended.

For example, the status accepting unit 309 accepts the workpiece status information associated with the identifier of the workpiece 10 or the identifier of the defective portion.

For example, if an abnormality is detected in one workpiece 10 in the subsequent steps after the image capture, the workpiece status information is accepted together with the identifier of the workpiece 10.

The accepting is, for example, accepting from an input part, receiving an input signal transmitted from another device or the like, or reading information from a storage medium or the like. The workpiece status information may be accepted by any input part such as a numeric keypad, a keyboard, a mouse, a menu screen, or the like. The status accepting unit 309 may be realized by a device driver for an input part such as a numeric keypad or a keyboard, control software for a menu screen, or the like.

In the image status information storage unit 310, image status information is stored, which is information having information regarding the image of the defective portion output by the image output unit 305 and the workpiece status information. The information regarding the image of the defective portion is, for example, information acquired from an image used for the pattern matching or the similar search on images. The information regarding the image of the defective portion may be, for example, an image of the defective portion itself, may be an image obtained by performing image processing such as binarization on the image of the defective portion, may be information on a feature acquired from the image of the defective portion, or may be information obtained by performing predesignated processing such as filtering on the image of the defective portion. Furthermore, the information regarding the image of the defective portion may be information having two or more of these pieces of information. The workpiece status information stored in the image status information storage unit 310 is, for example, status information accepted by the status accepting unit 309.

The image status information accumulating unit 311 accumulates image status information, having the information regarding the image of the defective portion output by the image output unit 305 and the workpiece status information on the defective portion accepted by the status accepting unit 309, in the image status information storage unit 310. For example, the image status information accumulating unit 311 accumulates image status information having the image of the defective portion output by the image output unit 305 and the workpiece status information on the defective portion. For example, the image status information accumulating unit 311 may acquire the above-described information regarding the image from the image of the defective portion output by the image output unit 305, and accumulate image status information having the acquired information regarding the image and the workpiece status information on the defective portion.

The workpiece status information on the defective portion may be workpiece status information on one defective portion, or may be workpiece status information on a workpiece having one defective portion. For example, if information designating images of one or more defective portions and one piece of workpiece status information on the defective portions shown in the images are accepted, the image status information accumulating unit 311 accumulates the information regarding the images of the defective portions and the accepted workpiece status information in association with each other in the image status information storage unit 310.

For example, if the status accepting unit 309 accepts the workpiece status information associated with the identifier of the workpiece and the identifier of the defective portion of the workpiece, the image status information accumulating unit 311 may accumulate image status information having, in association with each other, images of one or more defective portions associated with the identifier of the workpiece matching the identifier of the workpiece, and associated with the identifier of the defective portion matching the identifier of the defective portion, among the images of the defective portions output by the image output unit 305, and the accepted workpiece status information, in the image status information storage unit 310.

For example, if the status accepting unit 309 accepts the workpiece status information associated with the identifier of the workpiece, the image status information accumulating unit 311 may accumulate image status information having, in association with each other, images of one or more defective portions associated with the identifier of the workpiece matching the identifier of the workpiece among the images of the defective portions output by the image output unit 305, and the accepted workpiece status information, in the image status information storage unit 310.

Note that a workpiece transfer system may be configured by the workpiece processing apparatus 3 in this example and the workpiece transfer apparatus 2 described in the Example. For example, this workpiece transfer system has a configuration in which, in the workpiece transfer system 1000 in the Example shown in FIG. 4, etc., the workpiece processing apparatus 3 is provided instead of the workpiece processing apparatus 1.

Figure 20:
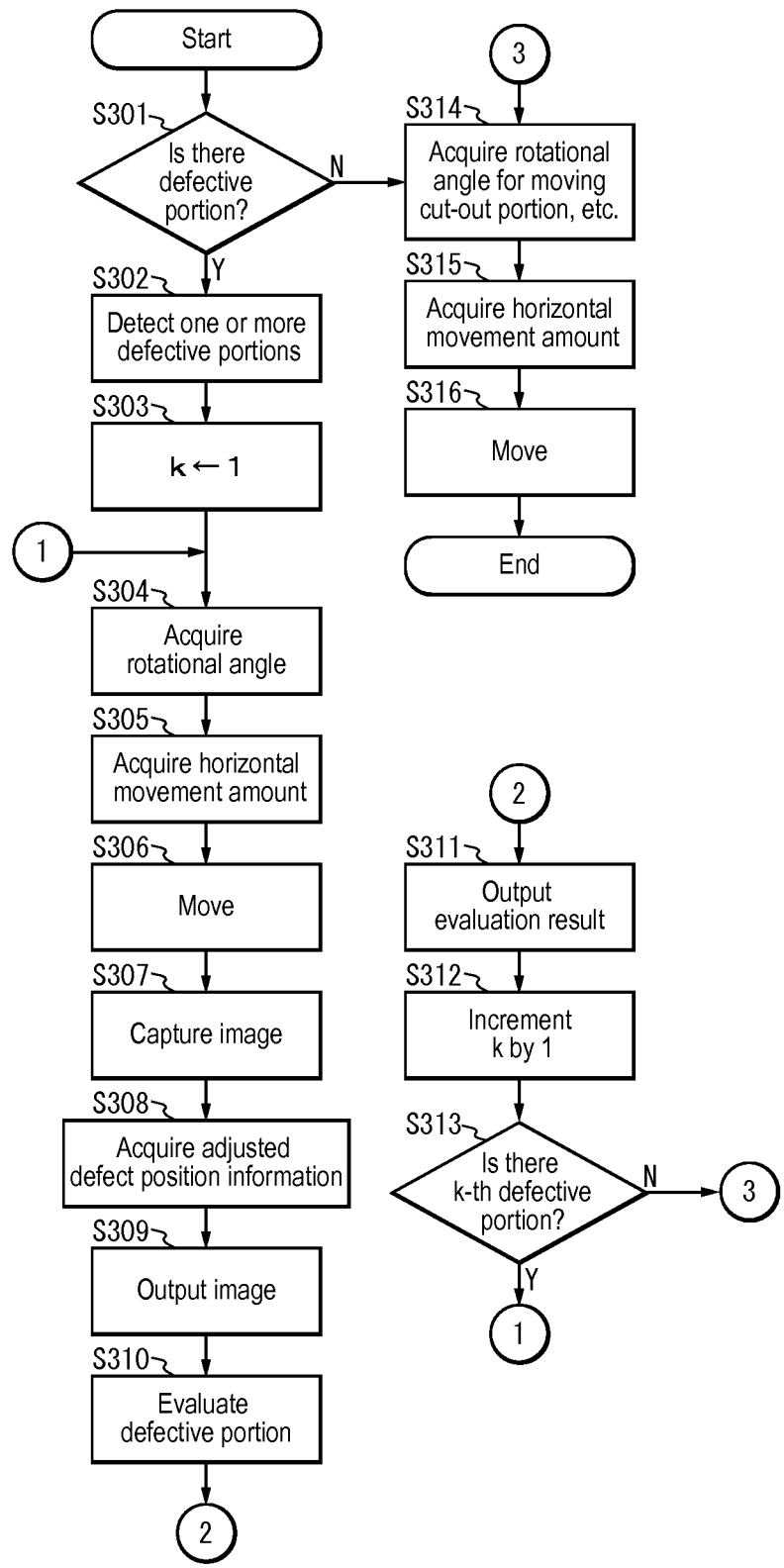
FIG. 20 is a flowchart illustrating an operation of the workpiece processing apparatus.

Next, an operation of the workpiece processing apparatus 3 in this example will be described with reference to the flowchart in FIG. 20. The workpiece processing apparatus 3 in this example performs processing similar to that of the workpiece processing apparatus 1 in the Example shown in FIG. 6, and performs processing shown in FIG. 20 below as the processing between steps S119 and S100 shown in FIG. 6. Specifically, after step S119 in FIG. 6, the processing in FIG. 20 is started, and, if the processing in FIG. 20 is ended, the procedure returns to step S100 in FIG. 6. In the description below, the processing shown in FIG. 6 will not be described.

(Step S301) The moving unit 302 judges whether or not there are one or more defective portions at the edge of the workpiece 10, from the information regarding the defective portion output by the output unit 104. If there are one or more defective portions, the procedure advances to step S302, and, if not, the procedure advances to step S314.

(Step S302) The detecting unit 306 detects one or more defective portions having a large size, from among the defective portions. If there is only one defective portion, this step may be omitted. Furthermore, if a defective portion having a large size is not detected, the procedure may advance to step S314.

(Step S303) The moving unit 302 substitutes 1 for a counter k.

(Step S304) The moving unit 302 acquires an angle by which the workpiece 10 has to be rotated for moving the center of the workpiece 10 to the predesignated position and moving a k-th defective portion into the image capture area, using the information indicating the position such as the rotational angle of the k-th defective portion.

(Step S305) The moving unit 302 acquires an amount by which the workpiece 10 has to be horizontally moved for moving the workpiece 10 and the k-th defective portion to the above-described positions. The horizontal movement amount is information of the distance, the angle, the movement direction, the movement distance in the x axis direction, the movement distance in the y axis direction, or the like, for horizontally moving the workpiece 10.

(Step S306) The moving unit 302 moves the workpiece 10 according to the information of the rotational angle and the horizontal movement amount acquired in steps S304 and S305, thereby moving the k-th defective portion into the image capture area.

(Step S307) The image capturing unit 303 captures an image of the k-th defective portion of the workpiece 10.

(Step S308) The adjusted defect position acquiring unit 304 acquires adjusted defect position information from the k-th defective portion. For example, rotational angles of the k-th defective portion and the cut-out portion in the case where the center of the workpiece 10 is taken as the rotation center are acquired, and a difference therebetween is acquired as the adjusted defect position information.

(Step S309) The image output unit 305 outputs the image captured by the image capturing unit 303. For example, the image output unit 305 outputs the image in association with the identifier of the workpiece 10, the identifier of the k-th defective portion, the adjusted defect position information on the k-th defective portion acquired in step 308, or the like. For example, the image output unit 305 accumulates the image in an unshown storage unit. Furthermore, the image output unit 305 may display the image on a monitor or the like.

(Step S310) Using the image accumulated in step S309, the evaluating unit 307 evaluates the k-th defective portion shown in that image. For example, an image pattern matching the image of the k-th defective portion is detected by pattern matching from among the image patterns contained in the image status information stored in the image status information storage unit 310, and the workpiece status information associated with the detected pattern is acquired as the evaluation result.

(Step S311) The evaluation result output unit 308 outputs an evaluation result. For example, the evaluation result is displayed on a monitor or the like.

(Step S312) The moving unit 302 increments the counter k by 1.

(Step S313) The moving unit 302 judges whether or not there is the k-th defective portion. If there is the k-th defective portion, the procedure returns to step S304, and, if not, the procedure advances to step S314.

(Step S314) The moving unit 302 acquires an angle by which the workpiece 10 has to be rotated for moving the cut-out portion in the predesignated direction and moving the center of the workpiece 10 to the predesignated position.

(Step S315) The moving unit 302 acquires an amount by which the workpiece 10 has to be horizontally moved for moving the cut-out portion in the predesignated direction and moving the center of the workpiece 10 to the predesignated position.

(Step S316) The moving unit 302 moves the workpiece 10 according to the rotational angle acquired in step S314 and the movement amount acquired in step S315. This movement is, for example, movement for positioning the workpiece 10 for the workpiece transfer apparatus 2 or the like for delivery. The processing is ended. If the processing is ended, the procedure returns to step S100 in FIG. 6.

According to the workpiece processing apparatus 3 in this example, after it is judged that it is not time to set a threshold value in step S122 in the flowchart shown in FIG. 6, a step of judging whether or not the status accepting unit 309 has accepted the workpiece status information may be further provided, wherein, if the workpiece status information has been accepted, image status information having the accepted workpiece status information and information regarding the image of the defective portion corresponding to the workpiece status information is accumulated by the image status information accumulating unit 311 in the image status information storage unit 310, and the procedure returns to step S100, and, if not, the procedure returns to step S100.

Furthermore, in the flowchart shown in FIG. 20, after the moving unit 302 moves the workpiece 10 in step S316, the workpiece 10 is transferred, for example, by the workpiece transfer apparatus 2 or the like from the workpiece processing apparatus 3 to another apparatus or the like. Although not described, if the workpiece transfer apparatus 2 places the workpiece on the placement table 3021 of the moving unit 302 or the like, for example, the workpiece processing apparatus 3 may acquire first rotational distance information from the workpiece 10 while rotating the workpiece 10 like a so-called ordinary aligner or the like, and accumulate the acquired information in the first rotational distance information storage unit 101.

Furthermore, in FIG. 20, the processing in steps S310, S311, and the like, and the processing of the image output unit 305 outputting (e.g., displaying) the image of the defective portion may be performed as appropriate according to an instruction from the user or the like.

Furthermore, in the flowchart shown in FIG. 20, the processing in steps S314 and S315 may be performed immediately before step S301, wherein, if it is judged that there is no defective portion in step S301, the procedure advances to step S316, and, if it is judged that there is no k-th defective portion in step S313, the procedure advances to step S316 where the workpiece 10 is moved using the information acquired in steps S314 and S315.

Next, a specific example of the workpiece processing apparatus 3 in this example will be described. In this example, a case will be described, as an example, in which a workpiece transfer system is configured by the workpiece processing apparatus 3 and the workpiece transfer apparatus 2. Furthermore, the workpiece processing apparatus 3 and the like can perform processing, for example, similar to that in the specific example described in the Example, and, thus, a detailed description of the processing and the like thereof has been omitted.

As in the specific example described in the Example, it is assumed that the workpiece processing apparatus 3 acquires, from one workpiece 10, adjustment information, which is information for positioning the workpiece, information regarding the defective portion, and information for specifying the orientation of the workpiece, and the output unit 104 outputs these pieces of information. It is assumed that the adjustment information output by the output unit 104 is a rotational angle $\alpha_1$, indicating the movement direction, and a movement length $h_1$. Furthermore, it is assumed that the information regarding the defective portion output by the output unit 104 is, for example, information, regarding multiple defective portions, having pairs of a rotational angle range indicating the range of the defective portion and a largest value of the size of the defective portion, lengths from the rotation center of the workpiece 10 to both ends of each defective portion, and the like as shown in FIG. 16. Furthermore, it is assumed that the information for specifying the orientation of the workpiece output by the output unit 104 is the rotational angle range indicating the range of the orientation flat as shown in FIG. 16.

If the moving unit 302 accepts this sort of information from the output unit 104, first, the moving unit 302 judges whether or not there is a defective portion in the workpiece 10. In this example, the information regarding the defective portion indicates that there is a defective portion, and, thus, it is judged that there is a defective portion.

Since the moving unit 302 judges that there is a defective portion in the workpiece 10, the detecting unit 306 detects a defect portion having a large size from among the detected defective portions. In this example, a defective portion in which the absolute value of the size of the defective portion is at least a threshold value is detected. For example, it is judged that all defective portions has a size that is at least a threshold value.

The moving unit 302 acquires, as follows, a combination of a rotational angle of the rotational movement and a movement amount of the horizontal movement for moving the workpiece 10 such that the midpoint of the line segment connecting both ends of a first defective portion of the defective portions detected by the detecting unit 306 is positioned within the image capture range of the image capturing unit 303 and such that the center of the workpiece 10 is at the predesignated position at which the center of the workpiece 10 is to be disposed when the workpiece 10 is passed to the workpiece transfer apparatus 2.

Specifically, the information indicating the rotational angle range indicating the range of the first defective portion, the length from the rotation center of the workpiece 10 to both ends of the defective portion, and the like are used to acquire the coordinates and the like of both ends of the defective portion, and an angle is acquired that is formed by the line segment that passes through both ends of the defective portion with respect to the line segment with a rotational angle of 90°. The line segment with a rotational angle of 90° is a line segment that forms an angle of 90 degrees with respect to the straight line indicating 0° when the rotational angle $\alpha_1$ is the acquired, and this angle corresponds to $\theta_r$ in FIGS. 19A and 19B.

Next, the moving unit 302 reads the rotational angle indicating the position of the center of the image capture area stored in advance in an unshown storage unit or the like, and subtracts, from that angle, the angle acquired above formed by the line segment that passes through both ends of the defective portion with respect to the line segment with a rotational angle of 90°. The thus obtained angle is a rotational angle used for rotating the workpiece 10, and corresponds to the angle $\gamma$ in FIGS. 19A and 19B.

Moreover, the moving unit 302 acquires, as the rotational angle for moving the workpiece 10, a value obtained by adding the angle acquired above formed by the line segment that passes through both ends of the defective portion with respect to the line segment with a rotational angle of 90°, to the rotational angle $\alpha_1$ contained in the adjustment information, and acquires the length $h_1$ contained in the adjustment information, as the movement distance of the workpiece 10. The acquired rotational angle is the angle indicating the movement direction for arranging the rotation center of the workpiece 10 on the center of the workpiece 10. Thus, when moving the workpiece 10, the workpiece 10 is moved in the direction opposite from that of the acquired rotational angle, that is, in the direction obtained by 180° rotation.

The moving unit 302 rotates the workpiece 10 about the rotation center of the workpiece 10 by an angle indicated by the thus acquired rotational angle, and moves the workpiece 10 by the length $h_1$ in the direction opposite from that indicated by the thus acquired rotational angle.

The image capturing unit 303 captures an image of the first defective portion of the workpiece 10 that has been positioned in the image capture area with the above-described movement.

Furthermore, the adjusted defect position acquiring unit 304 performs processing similar to that by the moving unit 302, thereby acquiring an angle that is formed by the straight line connecting both ends of the orientation flat with respect to the line segment with a rotational angle of 90°, using the rotational angles indicating the range of the orientation flat contained in the adjustment information output by the output unit 104 and the like. Further, the adjusted defect position acquiring unit 304 subtracts this angle from the angle acquired by the moving unit 302, formed by the line segment that passes through both ends of the first defective portion with respect to the line segment with a rotational angle of 90°, and acquires the value obtained by this subtraction as the adjusted defect position information regarding the first defective portion. This adjusted defect position information is a rotational angle of the first defective portion in the case where the center of the workpiece 10 is set as the rotation center and the rotational angle of the orientation flat is set as a reference (i.e., 0°).

The image output unit 305 accumulates the image of the first defective portion captured by the image capturing unit 303, in association with the identifier of the workpiece 10 (e.g., code allocated to the workpiece 10), the ID of the defective portion (e.g., number allocated to the defective portion, etc.), the adjusted defect position information, the time and date at which the image was captured, the depth (height) of the defective portion output by the output unit 104, and the width of the defective portion, which is a value obtained by converting the range of the defective portion output by the output unit 104 into the length, in an unshown storage unit, and displays the captured image in association with these pieces of information on an unshown monitor or the like.

FIG. 21 is an image management table for managing the images of the defective portions accumulated by the image output unit 305. The image management table has attributes "image", "workpiece ID", "defect ID", "adjusted defect position", "time and date", "height", and "width". In the table, "image" shows an image of a defective portion, which is, in this example, a file name of the image, "workpiece ID" shows an identifier of a workpiece, "defect ID" shows an identifier of the defective portion in the workpiece 10, which is, in this example, the number allocated in ascending order of the rotational angle to the defective portions detected by the detecting unit 306, "adjusted defect position" shows the adjusted defect position information acquired by the adjusted defect position acquiring unit 304, "time and date" shows the time and date at which the image was captured, acquired from an unshown clock or the like, "height" shows the height or the depth of the defective portion, and "width" shows the width of the defective portion.

Figure 22:
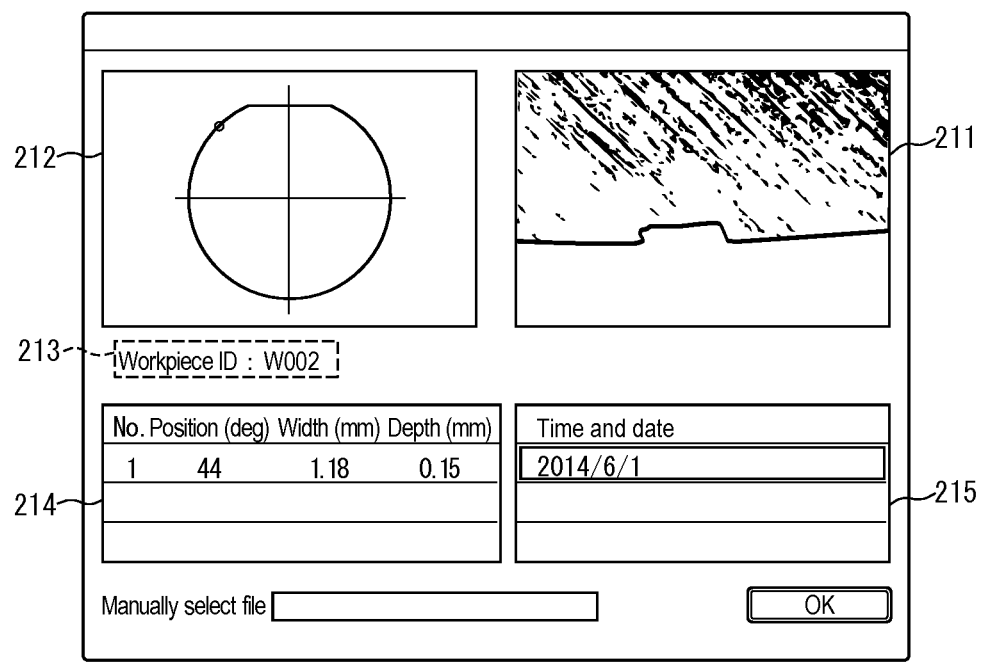
FIG. 22 is a view showing a display example of the workpiece processing apparatus.

FIG. 22 is a view showing a display example of the image of the defective portion output by the image output unit 305. In the view, the image of the defective portion is displayed in an area 211. The image output unit 305 displays, in an area 212, an image in which the image of a non-defective workpiece 10 prepared in advance is provided with a mark indicating that there is a defective portion at the position on the edge in the direction indicated by the rotational angle indicated by the adjusted defect position information. The identifier of the workpiece corresponding to the image of the defective portion is displayed in an area 213. The rotational angle indicated by the adjusted defect position information corresponding to the image of the defective portion, the width of the defective portion, and the depth are displayed in an area 214. The time and date at which the image was captured are displayed in an area 215. Note that, for example, the image displayed in the area 211 can be enlarged and reduced, and the display range thereof can be moved, according to an instruction from the user or the like.

FIG. 23 is an image status information management table for managing the image status information stored in the image status information storage unit 310. The image status information management table has attributes "pattern" and "status". In the table, "pattern" shows a pattern of a feature amount of a defective portion acquired from an image of the defective portion, and "status" shows workpiece status information regarding a workpiece having the defective portion corresponding to "pattern".

The evaluating unit 307 evaluates the image of the first defective portion output by the image output unit 305, using the image status information shown in FIG. 23. Specifically, the evaluating unit 307 sequentially acquires attribute values of "pattern" from each record (row) of the image status information management table in FIG. 23, and sequentially judges whether or not the image pattern indicated by the acquired attribute values matches the image of the first defective portion. If matches, the attribute value of "status" corresponding to the matching attribute value is acquired as the evaluation result. The processing may be ended when a pattern of one record matches, or the processing may be performed on all records. In this case, attribute values of "status" in multiple rows may be acquired as the evaluation result. Furthermore, if there is no matching pattern, the evaluating unit 307 acquires an evaluation result designated by default or the like (e.g., "no defect", etc.). For example, in this example, the captured image of the first defective portion matches "pattern 2" of "pattern", the evaluation result "large workpiece crack" is acquired.

Then, the evaluation result output unit 308 accumulates the evaluation result acquired by the evaluating unit 307 in association with the image, and displays the image on an unshown monitor or the like.

Figure 24:
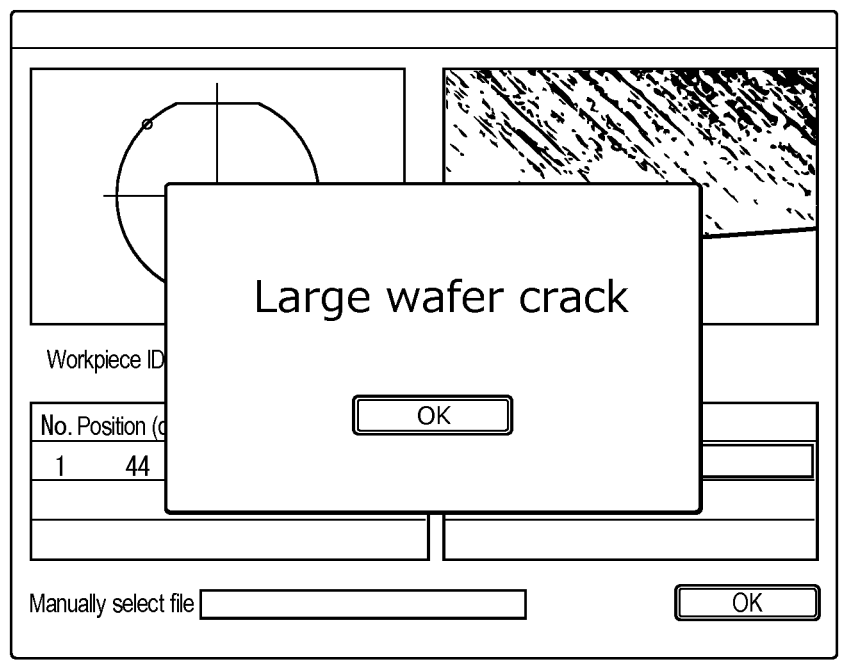
FIG. 24 is a view showing a display example of the workpiece processing apparatus.

FIG. 24 is a view showing an output example of the evaluation result by the evaluation result output unit 308.

With this output, the user can recognize that this defective portion is likely to cause a large workpiece crack in the subsequent steps.

Moreover, this sort of processing is repeated also on the other defective portions detected by the detecting unit 306.

If the processing ends on all defective portions detected by the detecting unit 306, as in the case of moving the defective portion into the image capture area, the moving unit 302 acquires a rotational angle of the workpiece 10 and a horizontal movement amount for arranging the orientation flat of the workpiece 10 in the predesignated direction and arranging the center of the workpiece 10 at the predesignated position, and moves the workpiece 10 using the thus acquired rotational angle and horizontal movement amount. Accordingly, the workpiece 10 can be arranged at a given position and in a given direction.

The workpiece transfer apparatus 2 picks up and transfers the workpiece 10 whose position and direction have been adjusted in this manner. The transfer and the like of the workpiece transfer apparatus 2 are as in the specific example described in the Example, and, thus, a description thereof has been omitted.

Note that, for example, if an instruction or the like to display an image of one defective portion is accepted from the user via an unshown accepting unit or the like, the image output unit 305 may display the image of the designated defective portion as shown in FIG. 21.

For example, it is assumed that the user detects that an abnormality such as a workpiece crack has occurred in one workpiece 10 with the identifier being "W001" in the subsequent steps. If the user inputs the identifier of the workpiece 10 in which the crack has occurred and the workpiece status information regarding the crack using an unshown input interface or the like, the status accepting unit 309 accepts these pieces of information. For example, it is assumed that the identifier "W001" of the workpiece 10 and the workpiece status information "workpiece crack" are accepted.

The image status information accumulating unit 311 reads all images associated with the accepted identifier "W001" of the workpiece 10 (specifically, "img1001" to "img1005") from the image management table shown in FIG. 21, acquires a feature from each image, and acquires information on the pattern of the feature of the defective portion for each image. Then, the information on each pattern and the workpiece status information accepted by the status accepting unit 309 are accumulated in association with each other in the image status information storage unit 310. Accordingly, five records (rows) are added to the image status information management table shown in FIG. 23. Accordingly, the information regarding the image of the defective portion, the influence of the defective portion exerted on the workpiece 10, and the like can be accumulated in association with each other, and the precision in evaluating the defective portion using the image of the defective portion can be improved.

If the defective portion that causes a workpiece crack is specified, the defective portion of the workpiece 10 may be designated, for example, by a combination of the identifier of the workpiece and the identifier of the defective portion, instead of designating the workpiece 10 in which the abnormality has occurred and inputting the workpiece status information. Alternatively, the designation of the defective portion may be accepted from the image shown in the area 212 on the display screen shown in FIG. 22.

Furthermore, the process in which an abnormality in the workpiece 10 in the subsequent steps is detected and the workpiece status information indicating the status of that abnormality is acquired may be automated using an unshown abnormality detecting apparatus or the like. In this case, this apparatus inputs the identifier of the workpiece 10 in which a crack has occurred and the workpiece status information, output by this apparatus, to the status accepting unit 309.

As described above, according to this example, a defective portion at the edge of the workpiece is moved into the image capture area, and an image of the defective portion is captured, so that the edge of the workpiece can be easily seen in the image.

Furthermore, if the defective portion at the edge is output in the captured image, the defective portion at the edge can be easily enlarged in the display, and, for example, the shape of the defective portion, that is seldom visible to the naked eye, can be easily seen.

Furthermore, according to the present invention, an image of the defective portion is captured after the moving unit 302 moves the workpiece 10 such that the center of the workpiece 10 is disposed at the predesignated position (e.g., the position at which the center of the workpiece 10 is to be disposed when the workpiece 10 is passed to the workpiece transfer apparatus 2) and such that the defective portion is within the image capture range of the image capturing unit 303, and, thus, between captured images of different defective portions in the workpieces 10 having the same size, the positions of the defective portions of the workpieces 10 and the positions of the edges other than the defective portions in the images can be kept at the same positions. Accordingly, the images can be easily compared, and the precision can be improved in acquiring a feature from the images and judging the similarity between the images.

In the foregoing examples, each process (each function) may be realized as an integrated process using a single apparatus (system), or may be realized as a distributed process using multiple apparatuses.

Furthermore, in the foregoing examples, each constituent element may be configured by dedicated hardware, or, alternatively, constituent elements that can be realized by software may be realized by executing a program. For example, each constituent element may be realized by a program execution unit such as a CPU reading and executing a software program stored in a storage medium such as a hard disk or a semiconductor memory. At the time of executing the program, the program execution unit may execute the program while accessing a storage unit (e.g., a storage medium such as a hard disk or a memory). Furthermore, the workpiece processing apparatus in the foregoing examples may be realized by software.

It will be appreciated that the present invention is not limited to the examples set forth herein, and various modifications are possible within the scope of the present invention.

As described above, the workpiece processing apparatus and the like according to the present invention are suitable as an apparatus for processing a workpiece and the like, and are particularly useful as an apparatus for positioning the workpiece and the like.

What is claimed is:

1. A workpiece processing apparatus, comprising:
 a first rotational distance information storage unit in which multiple pieces of first rotational distance information are stored, each of which is information having, in association with each other, a rotational angle, and first distance information regarding a distance from a rotation center to an edge of a circular workpiece corresponding to the rotational angle, in a case where the workpiece is rotated;
 an acquiring unit that acquires information for positioning the workpiece, information for specifying an orientation of the workpiece, and information regarding a defective portion at the edge of the workpiece, using the multiple pieces of first rotational distance information stored in the first rotational distance information storage unit; and
 an output unit that outputs the information for positioning the workpiece, the information for specifying the orientation of the workpiece, and the information regarding the defective portion, which are acquired by the acquiring unit,
 wherein the acquiring unit includes:
  a compositing part that composites multiple pieces of first distance information associated with rotational angles that are different from each other by 90 degrees, among the first distance information contained in the multiple pieces of first rotational distance information;
  a compositing processing part that detects multiple pieces of composite distance information that correspond to rotational angles that are successive and in which a change in sizes of the values is small, from among multiple pieces of composite distance information, each of which is information acquired by the compositing part compositing the pieces of first distance information, and acquires multiple pieces of first distance information before the compositing corresponding to at least one of the detected multiple pieces of composite distance information, and a rotational angle associated with at least one piece of first distance information before the compositing;
an adjustment information acquiring part that acquires adjustment information for adjusting the rotation center of the workpiece to a center of the workpiece, as the information for positioning the workpiece, using the multiple pieces of first distance information and the rotational angle acquired by the compositing processing part;
a second distance information acquiring part that acquires, using the adjustment information acquired by the adjustment information acquiring part, a relational equation expressing a relationship between a rotational angle, and second distance information regarding the distance to the edge of the workpiece corresponding to the rotational angle, in a case where the workpiece has a circular shape with no recess or projection at the edge, and acquires second distance information by substituting each of the multiple rotational angles corresponding to the multiple pieces of first rotational distance information for the acquired relational equation;
a calculating part that acquires a difference between the first distance information and the second distance information associated with the same rotational angle, using the multiple pieces of first rotational distance information and the multiple pieces of second distance information acquired by the second distance information acquiring part;
a cut-out detecting part that acquires information indicating a cut-out portion for specifying the orientation of the workpiece, as the information for specifying the orientation of the workpiece, using the difference between the first distance information and the second distance information calculated by the calculating part; and
a defect detecting part that acquires the information regarding the defective portion at the edge of the workpiece, using the difference between the first distance information and the second distance information calculated by the calculating part.

2. The workpiece processing apparatus according to claim 1, wherein the compositing processing part performs, at least once, at least one of a first process that detects at least one piece of composite distance information in descending order of the value and a second process that detects at least one piece of composite distance information in ascending order of the value, on the multiple pieces of composite distance information, and acquires a pair of multiple pieces of first distance information before the compositing, corresponding to at least one piece of composite distance information corresponding to rotational angles that are successive at least a predesignated number, from among remaining pieces of composite distance information that have not been detected in the first process and the second process, and a rotational angle associated with at least one piece of first distance information before the compositing.

3. The workpiece processing apparatus according to claim 1, wherein the cut-out detecting part performs cut-out detection on the edge of the workpiece, using the difference between the first distance information and the second distance information calculated by the calculating part, and at least one threshold value for a size of a cut-out portion, and acquires the information indicating the cut-out portion.

4. The workpiece processing apparatus according to claim 1, wherein the defect detecting part performs defect detection on the edge of the workpiece, using the difference between the first distance information and the second distance information calculated by the calculating part and at least one threshold value for a size of a defective portion, and acquires information regarding the detected defective portion.

5. The workpiece processing apparatus according to claim 1, wherein the compositing part composites four pieces of first distance information associated with rotational angles that are different from each other by 90 degrees, among the first distance information contained in the multiple pieces of first rotational distance information, thereby acquiring multiple pieces of composite distance information.

6. A workpiece transfer system, comprising:
a workpiece processing apparatus, including:
a first rotational distance information storage unit in which multiple pieces of first rotational distance information are stored, each of which is information having, in association with each other, a rotational angle, and first distance information regarding a distance from a rotation center to an edge of a circular workpiece corresponding to the rotational angle, in a case where the workpiece is rotated;
an acquiring unit that acquires information for positioning the workpiece, information for specifying an orientation of the workpiece, and information regarding a defective portion at the edge of the workpiece, using the multiple pieces of first rotational distance information stored in the first rotational distance information storage unit; and
an output unit that outputs the information for positioning the workpiece, the information for specifying the orientation of the workpiece, and the information regarding the defective portion, which are acquired by the acquiring unit; and
a workpiece transfer apparatus that receives and delivers the workpiece from and to the workpiece processing apparatus,
wherein the acquiring unit of the workpiece processing apparatus includes:
a compositing part that composites multiple pieces of first distance information associated with rotational angles that are different from each other by 90 degrees, among the first distance information contained in the multiple pieces of first rotational distance information;
a compositing processing part that detects multiple pieces of composite distance information that correspond to rotational angles that are successive and in which a change in sizes of the values is small, from among multiple pieces of composite distance information, each of which is information acquired by the compositing part compositing the pieces of first distance information, and acquires multiple pieces of first distance information before the compositing corresponding to at least one of the detected multiple pieces of composite distance information, and a rotational angle associated with at least one piece of first distance information before the compositing;
an adjustment information acquiring part that acquires adjustment information for adjusting the rotation center of the workpiece to a center of the workpiece, as the information for positioning the workpiece, using the multiple pieces of first distance information and the rotational angle acquired by the compositing processing part;

a second distance information acquiring part that acquires, using the adjustment information acquired by the adjustment information acquiring part, a relational equation expressing a relationship between a rotational angle, and second distance information regarding the distance to the edge of the workpiece corresponding to the rotational angle, in a case where the workpiece has a circular shape with no recess or projection at the edge, and acquires second distance information by substituting each of the multiple rotational angles corresponding to the multiple pieces of first rotational distance information for the acquired relational equation;

a calculating part that acquires a difference between the first distance information and the second distance information associated with the same rotational angle, using the multiple pieces of first rotational distance information and the multiple pieces of second distance information acquired by the second distance information acquiring part;

a cut-out detecting part that acquires information indicating a cut-out portion for specifying the orientation of the workpiece, as the information for specifying the orientation of the workpiece, using the difference between the first distance information and the second distance information calculated by the calculating part; and a defect detecting part that acquires the information regarding the defective portion at the edge of the workpiece, using the difference between the first distance information and the second distance information calculated by the calculating part.

* * * * *